(12) United States Patent
Nakamura et al.

(10) Patent No.: US 11,874,321 B2
(45) Date of Patent: Jan. 16, 2024

(54) MOBILE TERMINAL TESTING DEVICE AND MOBILE TERMINAL TESTING METHOD

(71) Applicant: ANRITSU CORPORATION, Kanagawa (JP)

(72) Inventors: Takumi Nakamura, Kanagawa (JP); Zhihui Wu, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 277 days.

(21) Appl. No.: 17/541,574

(22) Filed: Dec. 3, 2021

(65) Prior Publication Data

US 2022/0236316 A1    Jul. 28, 2022

(30) Foreign Application Priority Data

Jan. 22, 2021   (JP) .................................. 2021-008455

(51) Int. Cl.
*G01R 31/28* (2006.01)
*H04B 17/13* (2015.01)
*H04B 17/10* (2015.01)

(52) U.S. Cl.
CPC ..... *G01R 31/2822* (2013.01); *G01R 31/2868* (2013.01); *H04B 17/102* (2015.01); *H04B 17/13* (2015.01)

(58) Field of Classification Search
CPC ........ H04B 17/29; H04B 17/15; H04B 17/21; H04B 17/0085; H04B 17/309; H04B 17/00; H04B 17/12; H04B 17/19; H04B 17/252; H04B 17/103; H04B 17/101; H04B 17/17; H04B 17/102; H04B 17/13; G01R 29/10; G01R 29/105; G01R 29/0821;

(Continued)

(56) References Cited

U.S. PATENT DOCUMENTS 11,251,879 B1 *  2/2022  Wu .................... H04B 17/29
11,290,195 B2 *  3/2022  Wu .................... H04B 17/29

(Continued)

OTHER PUBLICATIONS

3GPP Technical Specifications Rel. 16, Chapter 38.521-2k.1.4/Chapter 38.521-2k.1.6/Chapter 38.521-2-7.3.2/Chapter 38.521-2 Annex M/Chapter 38.810, Sep. 2021.

*Primary Examiner* — Vinh P Nguyen
(74) *Attorney, Agent, or Firm* — Pearne & Gordon LLP

(57) ABSTRACT

In an integrated control device 10 of the measurement device 1, a reception sensitivity test control unit 18 repeatedly performs a reception sensitivity test of measuring a throughput of a signal under measurement transmitted from a DUT 100 which has received a test signal while changing an output level of the test signal non-linearly for each of a first orientation (PSa) regulated by a predetermined step interval of a spherical coordinate system and a second orientation (PSb) regulated by a step interval finer than the predetermined step interval, and a peak power measurement control unit 19 sets, as a peak power candidate, reception power within a range of a power width ($\Delta Pw$) from the maximum reception power of reception power measured for each first orientation, measures the reception power for each second orientation with respect to the peak power candidate, and determines the peak power based on a measurement result.

13 Claims, 38 Drawing Sheets

(58) Field of Classification Search
CPC ...... G01R 31/00; G01R 29/0878; G01R 1/04; G01R 31/2836; G01R 23/02; G01R 31/2822; G01R 31/2868; H04W 24/06; H04W 24/08; H04W 24/00; G01S 3/14; G01S 3/046; G01S 1/042; G06K 7/0095; G06K 7/00; H04M 1/24
See application file for complete search history.

(56) References Cited

U.S. PATENT DOCUMENTS

| | | | |
|---|---|---|---|
| 11,356,187 B2* | 6/2022 | Endo | H04B 17/0085 |
| 11,387,821 B2* | 7/2022 | Kumagai | H03K 5/04 |
| 11,489,600 B2* | 11/2022 | Wu | H04B 17/17 |

* cited by examiner

| EIS-CDF (Constant Step) | Search Method | |
|---|---|---|
| | Linear | NonLinear |
| Default Peak Search | over 3 days (Estimated Time) | 10h |
| Coarse & Fine Peak Search | over 1.5 days (Estimated Time) | 5h |

| EIS-CDF (Constant Density) | Search Method | |
|---|---|---|
| | Linear | NonLinear |
| Default Peak Search | over 2 days (Estimated Time) | 9h |
| Coarse & Fine Peak Search | over 1 days (Estimated Time) | 4h |

FIG. 20

| Number of measurements | OL(n) (dBm) | Throughput | SL(n)(dB) (OL(n) − OL(n−1)) | Process of next output level | Next output level |
|---|---|---|---|---|---|
| 1 | −60 | PASS | −20 (=SL0) | Level Down A | OL(2) = OL(1) − |SL(1)| |
| 2 | −80 | PASS | −20 | Level Down A | OL(3) = DT ( DT = −90 ) |
| 3 | −90 | FAIL | −10 | Level Up B | OL(4) = OL(3) + 1/2 · |SL(3)| |
| 4 | −85 | PASS | +5 | Level Down B | OL(5) = OL(4) − 1/2 · |SL(4)| |
| 5 | −87.5 | PASS | −2.5 | Level Down B | OL(6) = OL(5) − 1/2 · |SL(5)| |
| 6 | −88.7 | FAIL | −1.2 | Level Up B | OL(7) = OL(6) + 1/2 · |SL(6)| |
| 7 | −88.1 | FAIL | +0.6 | End measurement since SL(7) < EL(= 1.0) | |

FIG. 25

| Number of measurements | OL(n) (dBm) | Throughput | Determination result based on determination condition | SL(n)(dB) (OL(n) − OL(n−1)) | Process of next output level | Next output level |
|---|---|---|---|---|---|---|
| 1 | −75 | PASS | NO | −10 (=SL0) | Level down A | OL(2) = OL(1) − \|SL(1)\| |
| 2 | −85 | PASS | YES | −10 | Level down B | OL(3) = OL(2) − 2EL |
| 3 | −85.4 | FAIL | − | −0.4 | Level up A | OL(4) = OL(3) + EL |
| 4 | −85.2 | PASS | − | +0.2 | End measurement since SL(4) < EL(= 0.2) | |

FIG. 32

| Search step | Output level of nonlinear, dBm | Output level of improved nonlinear, dBm | Throughput, % | comment |
|---|---|---|---|---|
| 1 | -75 | -75 | 100 | |
| 2 | -85 | -85 | 95.69 | |
| 3 | -95 | -85.4 | 92.62 | |
| 4 | -90 | -85.2 | 95.05 | |
| 5 | -85 | | | |
| 6 | -87.5 | | | |
| 7 | -86.25 | | | |
| 8 | -85.625 | | | |
| 9 | -85.3125 | | | |
| Total of steps = | 9 | 4 | | Improved rate = 2.25 |

FIG. 33

MOBILE TERMINAL TESTING DEVICE AND MOBILE TERMINAL TESTING METHOD

TECHNICAL FIELD

The present invention relates to a mobile terminal testing device and a mobile terminal testing method for measuring reception power of a radio signal from a device under test for each of a plurality of orientations to search for the maximum reception power as peak power and for testing a mobile terminal which is the device under test based on the peak power.

BACKGROUND ART

For a wireless terminal that has been developed in recent years and transmits and receives a radio signal corresponding to IEEE802.11ad, 5G cellular, and the like, in which a signal in a wide band of a millimeter wave band is used, a performance test is performed of measuring an output level and reception sensitivity of a transmitted radio wave determined for each communication standard with respect to a wireless communication antenna included in the wireless terminal, and determining whether or not a predetermined reference is satisfied.

For example, in a performance test in which a wireless terminal for a 5G New Radio (NR) system (hereinafter, referred to as a 5G wireless terminal) is used as a Device Under Test (DUT), an OTA test is performed using a radio anechoic box (OTA chamber) called a Compact Antenna Test Range (CATR) which is not affected by a surrounding radio wave environment.

For various tests under OTA environment targeting the 5G wireless terminal, for example, it is obligated to perform a test in accordance with the standards described in specifications (Non-Patent Document 1) of 3rd Generation Partnership Project (3GPP).

For example, for Equivalent Isotropic Sensitivity (EIS) measurement for measuring EIS of DUT that is rotated so as to sequentially face all orientations of a spherical coordinate system under the OTA environment, chapter 38521-2K.1.4 of 3GPP describes a definition of "search for a beam peak direction of a received signal and spherical coverage in EIS". According to this, for the search for the beam peak direction of the received signal and the EIS spherical coverage (a surface area ratio of a part reaching a required radiated power), an averaged EIS of each measurement position (θ, φ) on a spherical surface, that is, a Cumulative Distribution Function of EIS (EIS-CDF) is necessary, as a result of the measurement.

Chapter 38521-2K. 1.6 of 3GPP describes EIS-CDF measurement. In order to obtain EIS-CDF, a reception sensitivity test of the DUT, which receives a signal under measurement transmitted by the DUT in response to reception of the test signal and measures a throughput indicating a data transfer rate while changing an output level of a test signal for each of θ polarization and φ polarization for each measurement position, is repeatedly performed until a predetermined end condition is satisfied. For the reception sensitivity test, 7.3.2 of Chapter 38.521-2 of 3GPP describes regulation such as a minimum allowable output level [dB] of the test signal.

Further, in the EIS-CDF measurement, the reception power of the radio signal from the DUT is measured for each of a plurality of orientations (measurement positions) in accordance with the above-described rule (refer to Chapter 38521-2K.1.4), and a beam peak search process of searching for an orientation having the maximum reception power in the plurality of orientations is executed together.

In addition, Chapter 38521-2 Annex M and Chapter 38810 of 3GPP describes Total Radiated Power (TRP), Equivalent Isotropic Radiated Power Cumulative Distribution Function (EIRP-CDF), and a definition of a grid type that regulates the measurement position of the EIS-CDF measurement. The grid type, which is defined here, includes a Constant Step type having a constant angle interval and a Constant Density type having a constant density.

RELATED ART DOCUMENT

Patent Document

[Non-Patent Document 1] 3GPP Technical Specifications Chapter 38521-2k.1.4/Chapter 38521-2k.1.6/Chapter 38521-2-7.3.2/Chapter 38521-2 Annex M/Chapter 38810

DISCLOSURE OF THE INVENTION

Problem that the Invention is to Solve

A case is considered in which, for example, a beam peak search is performed for searching for a peak of reception power from a DUT in accordance with millimeter wave band measurement of LTE/5G NR according to the standard defined in 3GPP. In this case, in a case where a Constant Step type (refer to FIGS. 12 and 13) is used as a grid type, measurement at least in 7.5° steps is required. Further, in a case where a Constant Density type (refer to FIGS. 17, 18, and 19) is used, measurement at least in 800 points is required.

Since the number of measurement positions is very large regardless of which grid type is used, a long time (for example, 2 to 3 days) is taken for measurement in such a type of mobile terminal testing device according to the related art (refer to FIGS. 16 and 20). Therefore, there is a case where the DUT is out of charge, so that, in such a case, it is difficult to perform accurate measurement.

In order to solve the problem, a method for shortening measurement time by thinning out the number of measurement positions (number of measurement points) has been known from the related art. As a specific example of a process of thinning out the number of measurement positions, Chapter 38521-2M.2.2 Coarse and fine measurement grids of 3GPP describes a definition of Coarse & fine grid measurement.

In the Coarse & fine grid measurement, for the above-described two types of grid types, two types of patterns, which have a predetermined interval between the measurement positions and an interval finer than the predetermined interval, are prepared, respectively, measurement (peak research) of the reception power of a radio signal from the DUT is performed while rotation of a positioner is performed along the grid type at the predetermined interval, and, thereafter, in a case where a plurality of peak power candidates exist, the peak research is continued while rotating the positioner along a finer grid type for peripheral areas of the peak power candidates.

A principle and a problem of the Coarse & fine grid measurement in the mobile terminal testing device according to the related art will be described with reference to FIGS. 38A to 38C. FIG. 38A shows an image of a beam of a DUT 150. FIG. 38B shows a disposition image of a beam peak search point (black circle) in a case where the beam peak search is performed while receiving a beam (radio signal) of the image from the DUT 150 with a test antenna 5 using the grid (coarse grid) having the predetermined step interval. FIG. 38C shows a result of the beam peak search using the coarse grid shown in FIG. 38B with a small black circle. A large black circle indicates the measurement position in the coarse grid, and a small black circle indicates a point actually measured in the coarse grid.

According to the beam peak search of a mode shown in FIGS. 38A to 38C, in a case where the search is performed with the coarse grid as shown in FIG. 38B, there is a possibility that an original peak is overlooked. In an example of FIG. 38B, a beam bm2 on the upper right is the original peak. However, since the measurement is performed in the coarse grid, a peak part of the beam bm2 is interposed between the measurement positions (indicated by the black circles), thereby being a state in which the original peak is not detected (overlooked).

In a case where the peak search is performed based on the result of the beam peak search using the coarse grid shown in FIG. 38B, a search result of a mode shown in FIG. 38C can be obtained. An example of FIG. 38C shows a mode in which, instead of the original peak beam bm2, the largest detection point of an upper left beam bm1 which is lower than the original peak beam bm2 is searched for as the peak.

In this case, the peak search is performed in a peripheral of the beam bm1 which is not the original peak, and the search is not performed in a peripheral of the beam bm2 which is the original peak. As a result, the beam bm2 which is the original peak cannot be searched for, so that beam peak measurement accuracy is lowered.

Further, for a reception sensitivity test performed for each measurement position in accordance with the EIS-CDF measurement, a mobile terminal testing device according to the related art generally adopts a method (refer to a characteristic C2 in FIG. 26) for performing gradual change (linear change) by a constant level as the number of measurements increases from an output level set in an initial reception sensitivity test in order to maintain the output level of the test signal as a value according to a standard described in Non-Patent Document 1. In a case where the method is adopted for the beam peak search, a long time is required for the reception sensitivity test itself due to a necessity for performing the reception sensitivity test for each of an extremely large number of measurement positions which are necessary for the beam peak search, thereby being a major factor that hinders to shorten EIS-CDF measurement time.

In this way, in the mobile terminal testing device according to the related art, the measurement time related to the beam peak search can be shortened to some extent by applying the Coarse & fine grid measurement, but a long time is required for the DUT reception sensitivity test performed in accordance with the beam peak search, so that there is a problem in that there is a limit to shortening entire measurement time including the reception sensitivity test.

Further, in the Coarse & fine grid measurement in the mobile terminal testing device according to the related art, in a case where the peak of the reception power is overlooked by the rotation using the coarse grid, the peak overlooked by the rotation using the finer grid cannot be accurately searched for and the peak of the reception power cannot be measured correctly, so that it is inevitable that detection accuracy of the beam peak search is lowered.

The present invention has been made to solve such a conventional problem, and an object of the present invention is to provide a mobile terminal testing device and a mobile terminal testing method, which are capable of shortening the measurement time including the reception sensitivity test while improving the measurement accuracy of the peak power in the EIS measurement.

Means for Solving the Problem

In order to solve the above problems, according to a first aspect of the present invention, there is provided a mobile terminal testing device (1) including a positioner (56) that is provided in an internal space (51) of a radio anechoic box (50); and measurement control means (10) for measuring reception power by receiving a radio signal from a mobile terminal (100), which is a device under test, using a test antenna (5) in the internal space, in which the measurement control means includes rotation control means (16) for executing, with respect to the positioner, first rotation control that causes the mobile terminal to sequentially face each of first orientations (PSa) regulated by a predetermined step interval of a spherical coordinate system, and second rotation control that causes the mobile terminal to sequentially face each of second orientations (PSb) regulated by a step interval finer than the predetermined step interval, reception sensitivity test execution means (18, 18-1, 18-2) for transmitting a test signal from the test antenna, repeatedly performing a reception sensitivity test of receiving a signal under measurement transmitted from the mobile terminal which has received the test signal using the test antenna and measuring a throughput based on the signal under measurement for each of the first orientation and the second orientation while changing an output level of the test signal non-linearly, and calculating reception sensitivity when the measured throughput satisfies a predetermined throughput measurement end condition, and peak power measurement means (19), reception power is measured for each of the first orientation and the second orientation by executing the reception sensitivity test for each of the first orientations and the second orientations, the peak power measurement means (19) measures maximum reception power as peak power based on the measured reception power, and the peak power measurement means includes candidate selection means (19*b*) for selecting, as peak power candidates, the first orientations having the reception power within a range of a predetermined power width ($\Delta Pw$) from the maximum reception powers among the reception power measured for each first orientation, and determination means (19*c*) for measuring the reception power for each second orientation by executing the second rotation control on a region within a predetermined range around the each of first orientations corresponding to each of the peak power candidates, and determining the peak power based on a measurement result.

With the configuration, in the mobile terminal testing device according to the first aspect of the present invention, based on coarse measurement for each predetermined step and a so-called Coarse & fine grid measurement for measuring a peak power value of the mobile terminal in two steps of fine measurement for each step finer than the predetermined step, after selecting the reception power within the range of the predetermined power width from the reception power obtained by the coarse measurement as the peak power candidate, the peak power is measured for each fine step while targeting the peak power candidate, so that the peak power missed in the coarse measurement can be reliably searched for in the fine measurement, and the measurement accuracy of the peak power can be improved. Further, in addition to an effect of shortening measurement time by the Coarse & fine grid measurement, an effect of shortening time for the reception sensitivity test performed while changing the output level of the test signal non-linearly can be expected, so that the measurement time can be shortened.

Further, the mobile terminal testing device according to a second aspect of the present invention may further include holding means (16*a*) for holding each data of a first grid pattern that regulates the first orientation and a second grid pattern that regulates the second orientation, in which the rotation control means executes the first rotation control and the second rotation control, respectively, based on the first grid pattern and the second grid pattern.

With the configuration, the mobile terminal testing device according to the second aspect of the present invention can easily execute the two-step measurement including the coarse step and the finer step, based on each data of the first grid pattern and the second grid pattern held by the holding means.

Further, in the mobile terminal testing device according to a third aspect of the present invention, the first grid pattern and the second grid pattern may be any of a constant angular distance type in which each of angular distances of the first orientation and the second orientation is constant, or a constant density type in which each of densities of the first orientation and the second orientation is constant.

With the configuration, the mobile terminal testing device according to the third aspect of the present invention can easily realize measurement in an operation mode desired by a user by selectively using the grid pattern of the Constant Step type or the Constant Density type.

Further, in the mobile terminal testing device according to a fourth aspect of the present invention, the throughput measurement end condition may be obtained by determining that the measured throughput falls below a predetermined threshold value for the first time while repeatedly executing a setting for sequentially reducing a step of the output level of the test signal, and the reception sensitivity test execution means may detect, as the reception sensitivity, an output level immediately before the output level in a case where the determination is obtained.

With the configuration, the mobile terminal testing device according to the fourth aspect of the present invention can correctly detect the output level immediately before the output level of the test signal which satisfies the throughput measurement end condition as the reception sensitivity.

Further, in the mobile terminal testing device according to a fifth aspect of the present invention, the reception sensitivity test execution means (18-1) may include output level setting means (18*d*1) for setting the output level of the test signal to be different from a previous output level according to a comparison result between a measurement result of the throughput and a predetermined threshold value, and measurement result output means (18*e*) for continuing transmission and reception of the test signal and the signal under measurement in a case where a variation width (EL) of the output level with respect to the previous output level exceeds a predetermined variation width set in advance, and outputting a test result assuming that the throughput measurement end condition is satisfied in a case where the variation width of the output level with respect to the previous output level is within a range of the predetermined variation width.

With the configuration, in the mobile terminal testing device according to the fifth aspect of the present invention, it is possible to significantly reduce the number of executions of the transmission and reception compared to a case where the output level of the test signal is linearly changed, and it is possible to set the output level of the test signal to a target level in a short time, and it is possible to efficiently execute a reception sensitivity test of the mobile terminal. As a result, the effect of shortening the measurement time including the reception sensitivity test and the peak power measurement is further enhanced.

Further, in the mobile terminal testing device according to a sixth aspect of the present invention, the reception sensitivity test execution means (18-2) may include drop determination means (18*c*) for determining whether or not the measured throughput is in a dropped state to a preset proportion in a steep drop area in which the throughput drops steeply, and output level setting means (18*d*2) for performing a setting process of setting the output level of the test signal to be different from a previous output level according to a comparison result indicating whether or not a measurement result of the throughput exceeds a predetermined threshold value and a determination result indicating whether or not the measured throughput is in the dropped state determined by the drop determination means, the setting process including a setting process of performing level down or level up on the output level of the test signal with respect to the previous output level in units of the variation width in a case where it is determined to be the dropped state, and transmission and reception of the test signal and the signal under measurement may be continued in a case where a variation width of the output level with respect to the previous output level exceeds a predetermined variation width, and a test result may be output assuming that the throughput measurement end condition is satisfied in a case where the variation of the output level width with respect to the previous output level is within a range of the predetermined variation width.

With the configuration, in the mobile terminal testing device according to the sixth aspect of the present invention, in a state in which the measured throughput drops to a proportion in the steep drop area, previous and current change widths are checked while performing level down or level up in units of the predetermined variation width (EL) of the output level of the test signal, so that the number of times of transmission and reception can be reduced and measurement time can be further shortened as compared with in a case of performing level down or level up on the output level in the step variation range derived from an initial step variation range throughout an entire period. As a result, the effect of shortening the measurement time including the reception sensitivity test and the peak power measurement is further enhanced.

Further, in order to solve the above problems, according to a seventh aspect of the present invention, there is provided a mobile terminal testing method for performing a test of a mobile terminal using a mobile terminal testing device including a positioner (56) that is provided in an internal space (51) of a radio anechoic box (50), rotation control means (16) for executing, with respect to the positioner, first rotation control that causes the mobile terminal (100), which is a device under test, to sequentially face each of first orientations (PSa) regulated by a predetermined step interval of a spherical coordinate system, and second rotation control that causes the mobile terminal to sequentially face each of second orientations (PSb) regulated by a step interval finer than the predetermined step interval, reception sensitivity test execution means (18, 18-1, 18-2) for transmitting a test signal from the test antenna, and repeatedly performing a reception sensitivity test of receiving a signal under measurement transmitted from the mobile terminal which has received the test signal using the test antenna and measuring a throughput based on the signal under measurement for each of the first orientations and the second orientations while changing an output level of the test signal non-linearly, and calculating reception sensitivity when the measured throughput satisfies a predetermined throughput measurement end condition, and measurement control means (10) for executing a processing step of measuring reception power by receiving a radio signal from the mobile terminal using the test antenna (5) in the internal space by executing the reception sensitivity test for each of the first orientations and the second orientations, and peak power measurement means (19) for executing a processing step of measuring maximum reception power as peak power based on the measured reception power, the mobile terminal testing method including, as the processing step of measuring the maximum reception power as the peak power, a candidate selection step (S4, S11, S12) of selecting, as a peak power candidates, the first orientation having reception power within a range of a predetermined power width ($\Delta Pw$) from the maximum reception powers among the reception power measured for each first orientation; and determination step (S6) of measuring the reception power for each second orientation by executing the second rotation control on a range within a predetermined range around the each of first orientations corresponding to each of the peak power candidates, and determining the peak power based on a measurement result.

With the configuration, in the mobile terminal testing method according to the seventh aspect of the present invention, based on coarse measurement for each predetermined step and a so-called Coarse & fine grid measurement for measuring a peak power value of the mobile terminal in two steps of fine measurement for each step finer than the predetermined step, after selecting the reception power within the range of the predetermined power width from the reception power obtained by the coarse measurement as the peak power candidate, the peak power is measured for each fine step while targeting the peak power candidate, so that the peak power missed in the coarse measurement can be reliably searched for in the fine measurement, and the measurement accuracy of the peak power can be improved. Further, in addition to an effect of shortening measurement time by the Coarse & fine grid measurement, an effect of shortening time for the reception sensitivity test performed while changing the output level of the test signal non-linearly can be expected, so that the measurement time can be shortened.

[Advantage of the Invention]

The present invention can provide a mobile terminal testing device and a mobile terminal testing method capable of shortening the measurement time including the reception sensitivity test while improving the measurement accuracy of the peak power in the EIS measurement.

BRIEF DESCRIPTION OF THE DRAWINGS

FIGS. 5A and 5B are diagrams showing total spherical scanning images of a DUT in the OTA chamber of the measurement device according to the first embodiment of the present invention, in which FIG. 5A shows a disposition mode of the DUT with respect to a center of a spherical coordinate system, and FIG. 5B shows a disposition mode of angular sample points PS corresponding to a Constant Step-type Coarse grid.

FIGS. 14A to 14C are diagrams showing operation images of a beam peak search in the measurement device according to the first embodiment of the present invention, in which FIG. 14A shows a beam peak search operation image of by a Coarse grid, FIG. 14B shows a beam peak search operation image by a Fine grid, and FIG. 14C shows a measurement position disposition image corresponding to the Fine grid around the measurement position corresponding to the Coarse grid.

FIG. 20 is a table for explaining an effect of shortening measurement time for EIS-CDF measurement by Coarse & fine beam peak search of the measurement device according to the second embodiment of the present invention.

FIG. 23A shows a level down process (A), and FIG. 23B shows a level down process (B).

FIG. 24A shows a level up process (A), and FIG. 24B shows a level up process (B).

FIG. 25 is a chart showing a data example of a parameter related to an output level of a variable test signal set according to the number of measurements by the variable setting control of the output level shown in FIG. 22.

FIGS. 31A and 31B are flowcharts showing details of a process in step S58 of FIG. 30, in which FIG. 31A shows a level down process (A) and FIG. 31B shows a level down process (B).

FIG. 32 is a table diagram showing a data configuration example showing a relationship of a parameter related to an output level of a test signal, which is set according to the number of measurements by the output level variable setting control shown in FIG. 30.

FIG. 33 is a table diagram showing a relationship between the number of measurements and a measurement value of each of the output level of the test signal and a throughput related to the reception sensitivity test of the DUT of the measurement device according to the fourth embodiment of the present invention.

FIG. 38A shows an image of a beam of a DUT, FIG. 38B shows an operation image of the beam peak search by a Coarse grid, and FIG. 38C shows an operation image in which a beam bm2 is overlooked in a case where a peak power candidate is selected based on a result of the beam peak search shown in FIG. 38B.

BEST MODE FOR CARRYING OUT THE INVENTION

Hereinafter, embodiments of a mobile terminal testing device according to the present invention and a mobile terminal testing method using the same will be described with reference to the accompanying drawings.

First Embodiment

Figure 1:
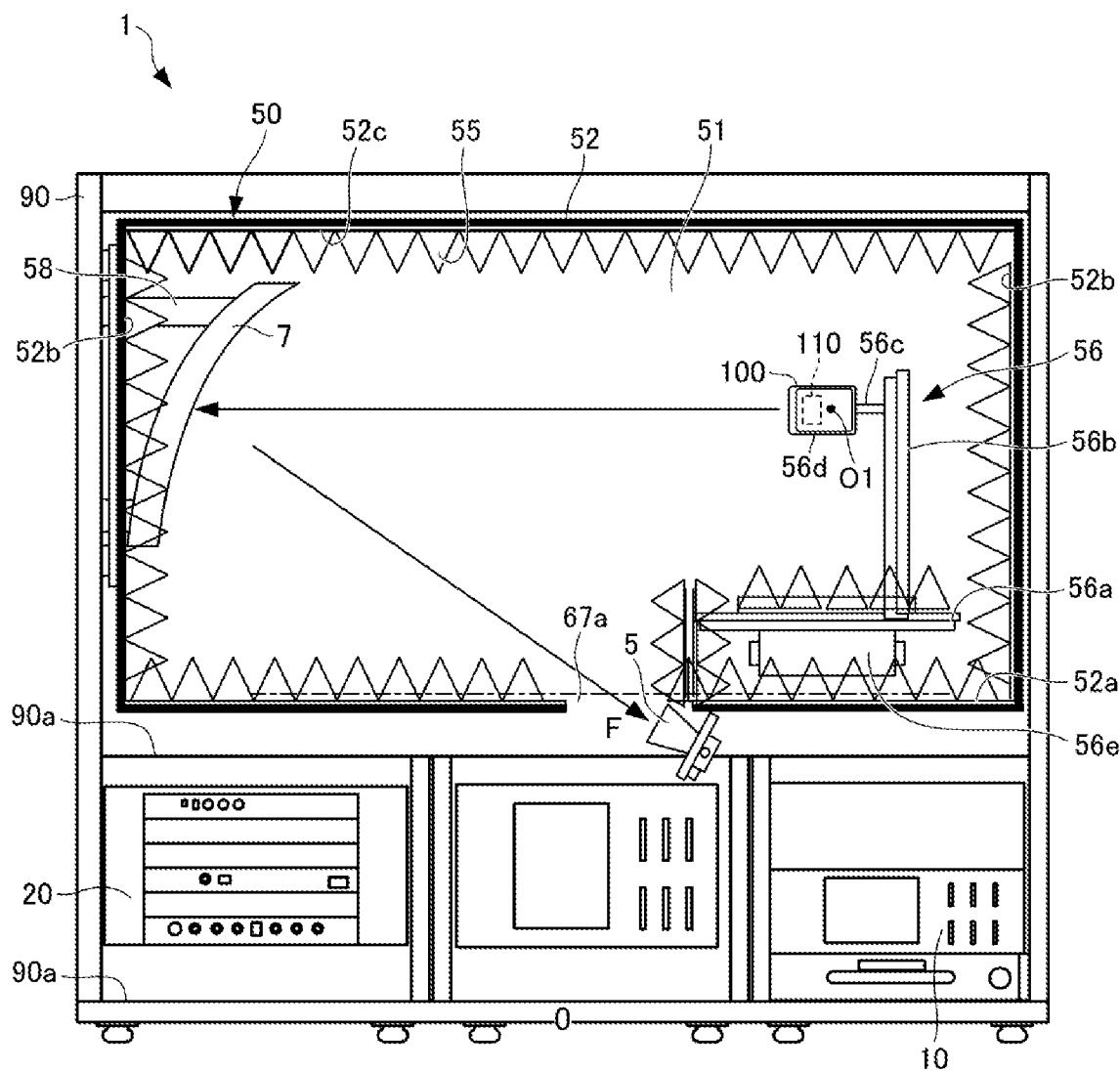
FIG. 1 is a diagram showing a schematic configuration of an entire measurement device according to a first embodiment of the present invention.
Figure 2:
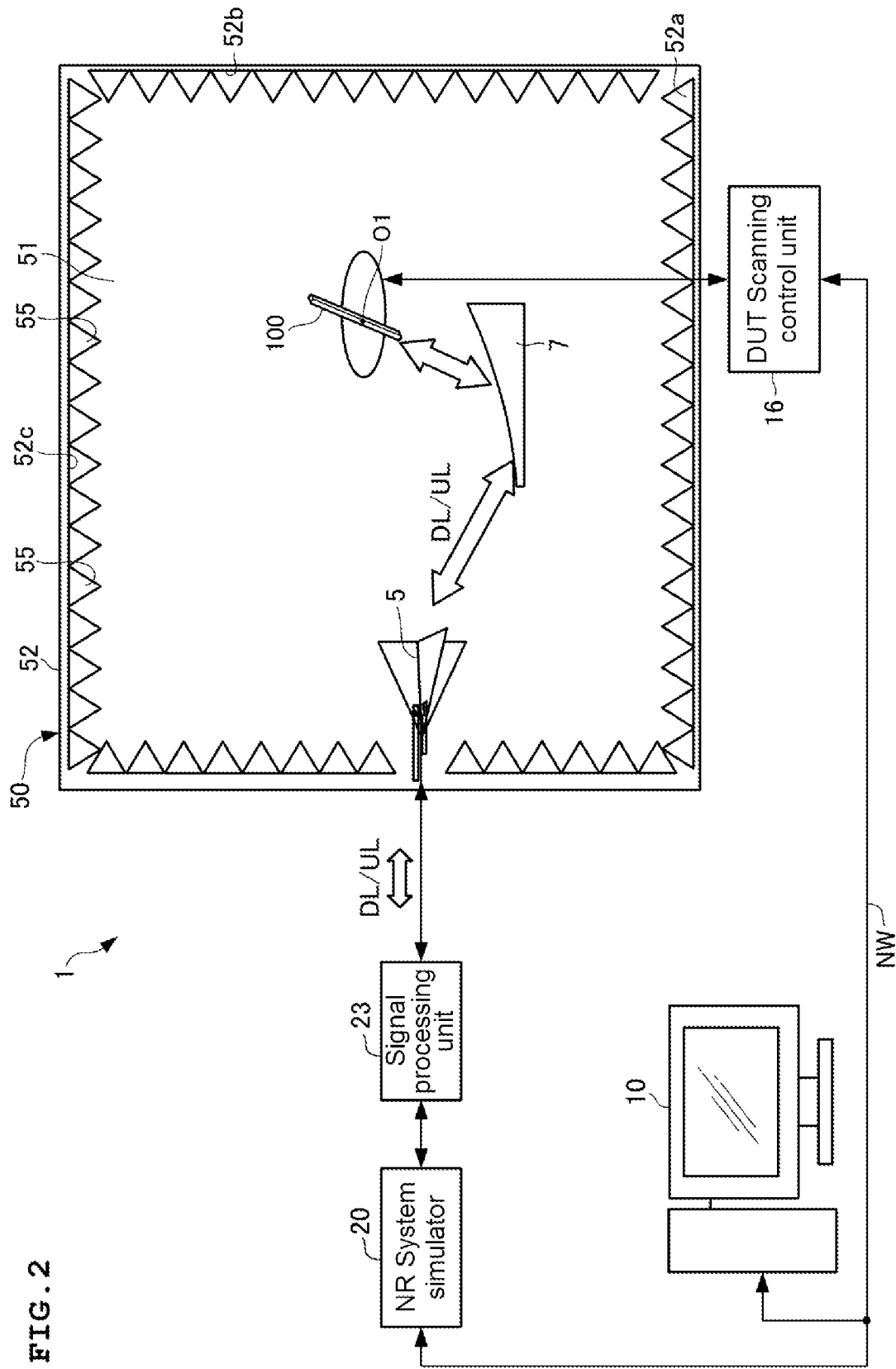
FIG. 2 is a block diagram showing a functional configuration of the measurement device according to the first embodiment of the present invention.

First, a configuration of a measurement device 1 according to a first embodiment of the present invention will be described with reference to FIGS. 1 to 4. The measurement device 1 constitutes the mobile terminal testing device of the present invention, together with measurement devices 1A, 1B, and 1C according to second to fourth embodiments, respectively, which will be described later. The measurement device 1 according to the present embodiment has an external structure as shown in FIG. 1 as a whole, and includes functional blocks as shown in FIG. 2. FIGS. 1 and 2 show a disposition mode of each component of an OTA chamber 50 in a state of being seen through from a side surface thereof.

The measurement device 1 is operated, for example, in a mode in which each of the above-described components is mounted on each rack 90a of a rack structure 90 having the structure shown in FIG. 1. FIG. 1 shows an example in which each of an integrated control device 10, an NR system simulator 20, and the OTA chamber 50 is mounted on each rack 90a of the rack structure 90.

As shown in FIG. 2, the measurement device 1 includes the integrated control device 10, the NR system simulator 20, a signal processing unit 23, and the OTA chamber 50.

A configuration of the OTA chamber 50 will be described first. As shown in FIGS. 1 and 2, the OTA chamber 50 includes, for example, a metal housing main body 52 having a rectangular internal space 51, and accommodates a DUT 100 having an antenna 110, a test antenna 5, a reflector 7, and a DUT scanning mechanism 56 in the internal space 51.

A radio wave absorber 55 is attached to a whole area of an inner surface of the OTA chamber 50, that is, a bottom surface 52a, a side surface 52b, and a top surface 52c of the housing main body 52. As a result, in the OTA chamber 50, each element (the DUT 100, the test antenna 5, the reflector 7, and the DUT scanning mechanism 56) disposed in the internal space 51 has an enhanced function of suppressing intrusion of radio waves from the outside and radiation of the radio waves to the outside. In this way, the OTA chamber 50 realizes a radio anechoic box having the internal space 51 that is not affected by a surrounding radio wave environment. The radio anechoic box used in the present embodiment is, for example, an Anechoic type.

Among those accommodated in the internal space 51 of the OTA chamber 50, the DUT 100 is, for example, a wireless terminal such as a smartphone. Communication standards for the DUT 100 include, for example, cellular (LTE, LTE-A, W-CDMA (registered trademark), GSM (registered trademark), CDMA 2000, 1×EV-DO, TD-SCDMA, or the like), wireless LAN (IEEE 802.11b/g/a/n/ac/ad, or the like), Bluetooth (registered trademark), GNSS (GPS, Galileo, GLONASS, BeiDou, or the like), FM, and digital broadcasting (DVB-H, ISDB-T, or the like). Further, the DUT 100 may be a wireless terminal that transmits and receives a radio signal in a millimeter wave band corresponding to IEEE 802.11ad, 5G cellular, or the like.

In the present embodiment, the antenna 110 of the DUT 100 corresponds to a radio signal in each regulated frequency band in conformity with, for example, LTE or 5G NR communication standard. The DUT 100 constitutes a device under test, that is, the mobile terminal in the present invention.

In the internal space 51 of the OTA chamber 50, the DUT 100 is held by a partial mechanism of the DUT scanning mechanism 56. The DUT scanning mechanism 56 is provided to extend in a vertical direction on the bottom surface 52a of the housing main body 52 in the internal space 51 of the OTA chamber 50. The DUT scanning mechanism 56 performs a total spherical scanning (refer to FIGS. 5A and 5B and FIG. 6), which will be described later, on the DUT 100 while holding the DUT 100 on which a performance test is performed.

As shown in FIG. 1, the DUT scanning mechanism 56 includes a turntable 56a, a support column member 56b, a DUT mounting portion 56c, and a drive unit 56e. The turntable 56a includes a plate member having a disk shape, and has a configuration (refer to FIG. 3 and FIG. 7) that rotates around an azimuth axis (a rotation axis in the vertical direction). The support column member 56b includes a columnar member disposed to extend in a direction perpendicular to a plate surface of the turntable 56a.

The DUT mounting portion 56c is disposed near an upper end of the support column member 56b to be in parallel with the turntable 56a, and has a mounting tray 56d on which the DUT 100 is mounted. The DUT mounting portion 56c has a configuration (refer to FIG. 3 and FIG. 7) capable of rotating around a roll axis (a rotation axis in a horizontal direction).

Figure 3:
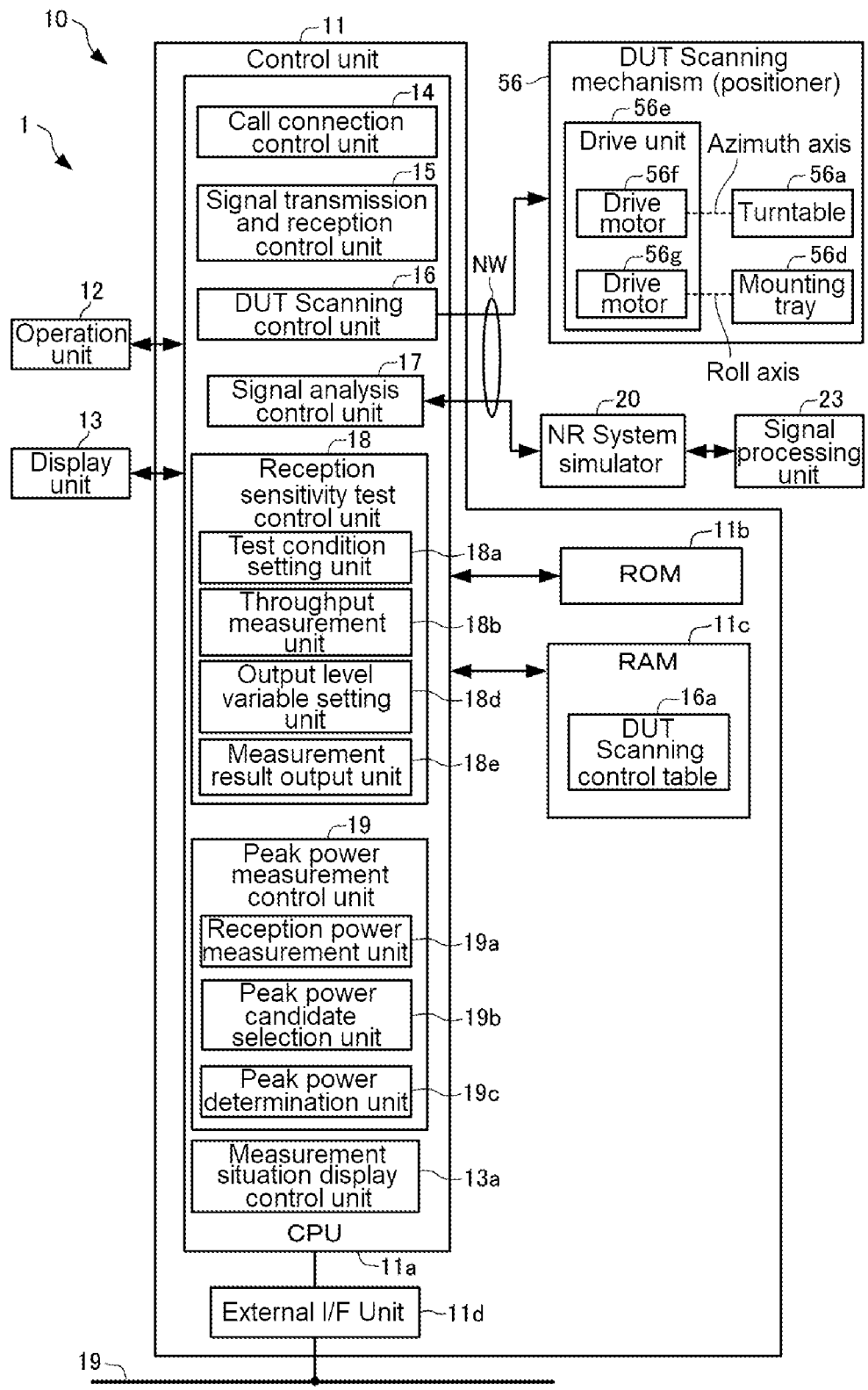
FIG. 3 is a block diagram showing functional configurations of an integrated control device and a controlled element thereof in the measurement device according to the first embodiment of the present invention.

As shown in FIG. 3, the drive unit 56e includes, for example, a drive motor 56f that rotationally drives the azimuth axis, and a drive motor 56g that rotationally drives the roll axis. The drive unit 56e includes a biaxial positioner provided with a mechanism for performing rotations around the azimuth axis and the roll axis, respectively, by the drive motor 56f and the drive motor 56g. In this way, the drive unit 56e can rotate the DUT 100 mounted on the mounting tray 56d in biaxial (the azimuth axis and the roll axis) directions for each mounting tray 56d. Hereinafter, there is a case where the whole DUT scanning mechanism 56 including the drive unit 56e is referred to as a positioner (refer to FIG. 3).

Figure 5A:
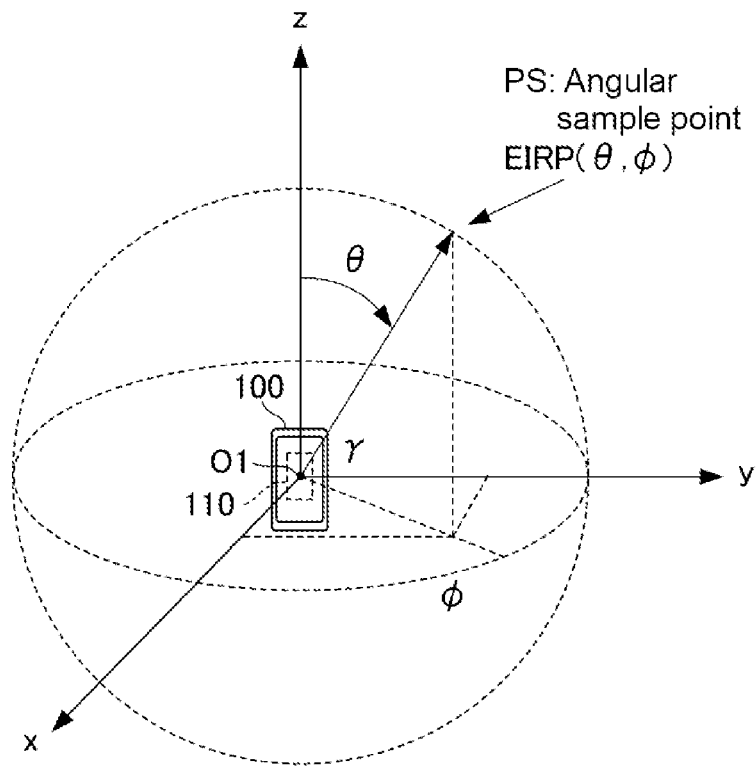
Figure 5B:
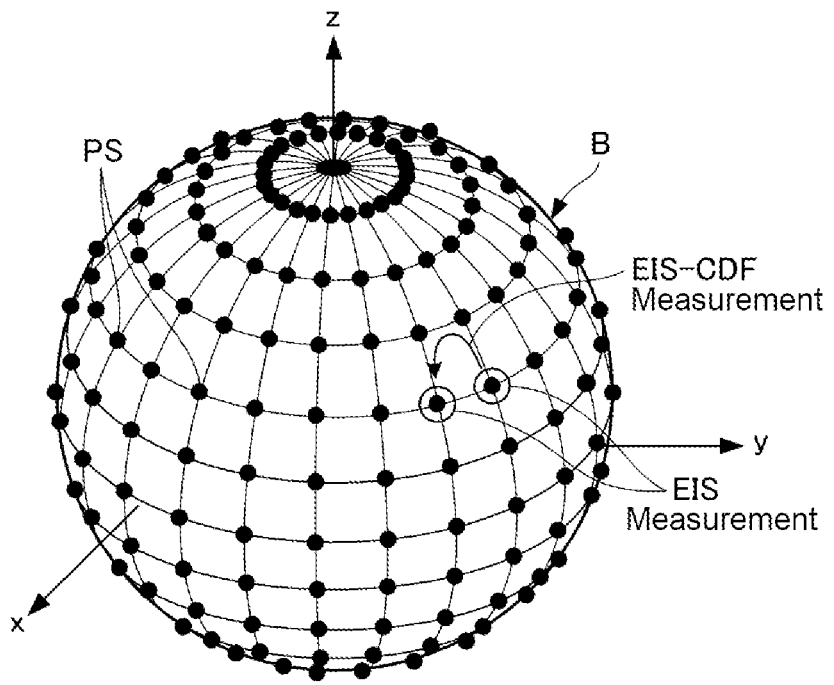

The DUT scanning mechanism 56 performs total spherical scanning which sequentially changes a posture of the DUT 100 to a state where the antenna 110 faces all orientations of a surface of the sphere while assuming that the DUT 100 mounted (held) on the mounting tray 56d is disposed, for example, at a center O1 of the sphere (refer to a sphere B in FIGS. 5A and 5B). Control of the DUT scanning in the DUT scanning mechanism 56 is performed by a DUT scanning control unit 16 which will be described later. The DUT scanning mechanism 56 constitutes the positioner in the present invention.

The test antenna 5 is attached to a required position on the bottom surface 52a of the housing main body 52 of the OTA chamber 50 by using an appropriate holder (not shown). The position to which the test antenna 5 is attached is a position at which visibility from the reflector 7 can be secured via an opening 67a provided on the bottom surface 52a. The test antenna 5 corresponds to a radio signal in the frequency band of the same regulation (NR standard) as the antenna 110 of the DUT 100.

In a case where measurement related to the NR of the DUT 100 is performed in the OTA chamber 50, the test antenna 5 transmits a test signal from the NR system simulator 20 to the DUT 100 and receives a signal under measurement transmitted from the DUT 100 that has received the test signal. The test antenna 5 is disposed so that a reflection surface thereof becomes a focal position F of the reflector 7. The reflector 7 is not always required in a case where the test antenna 5 can be disposed so that an orientation pattern thereof faces the DUT 100 and appropriate transmission and reception can be performed.

The reflector 7 is attached to a required position on the side surface 52b of the OTA chamber 50 by using a reflector holder 58. The reflector 7 realizes a radio wave path that returns the radio signal (the test signal and the signal under measurement) transmitted and received by the antenna 110 of the DUT 100 to the reflection surface of the test antenna 5.

Subsequently, configurations of the integrated control device 10 and the NR system simulator 20 will be described.

As shown in FIG. 2, the integrated control device 10 is communicably connected to the NR system simulator 20 via a network NW such as Ethernet (registered trademark). Further, the integrated control device 10 is also connected to a controlled system element in the OTA chamber 50, for example, the DUT scanning control unit 16 via the network NW.

The integrated control device 10 comprehensively controls the NR system simulator 20 and the DUT scanning control unit 16 via the network NW, and includes, for example, a Personal Computer (PC). The DUT scanning control unit 16 may be independently provided accompanying with the OTA chamber 50 (refer to FIG. 2), or may be provided in the integrated control device 10 as shown in FIG. 3. Hereinafter, description will be performed while assuming that the integrated control device 10 has the configuration shown in FIG. 3. The integrated control device 10 constitutes the measurement control means of the present invention together with the NR system simulator 20.

As shown in FIG. 3, the integrated control device 10 includes a control unit 11, an operation unit 12, and a display unit 13. The control unit 11 includes, for example, a computer device. The computer device includes a Central Processing Unit (CPU) 11a that performs predetermined information processing to realize the function of the measurement device 1, and performs comprehensive control on the NR system simulator 20, and the DUT scanning control unit 16 as targets, a Read Only Memory (ROM) 11b that stores an Operating System (OS) for starting up the CPU 11a, the other programs, and control parameters, and the like, a Random Access Memory (RAM) 11c that stores execution code, data, and the like of the OS or an application which is used for an operation by the CPU 11a, an external I/F unit 11d, an input and output port (not shown), and the like.

The external I/F unit 11d is communicably connected to each of the NR system simulator 20 and the drive unit 56e of the positioner (the DUT scanning mechanism 56) via the network NW. The operation unit 12 and the display unit 13 are connected to the input and output port. The operation unit 12 is a functional unit for inputting various information such as commands, and the display unit 13 is a functional unit for displaying various information such as an input screen and measurement results of the various information. In the present embodiment, the display unit 13 has a function of displaying a measurement progress display screen 130a (refer to FIG. 15) in EIS-CDF measurement.

The computer device described above functions as the control unit 11 in such a way that the CPU 11a executes a program stored in the ROM 11b while using the RAM 11c as a work area. As shown in FIG. 3, the control unit 11 includes a call connection control unit 14, a signal transmission and reception control unit 15, a DUT scanning control unit 16, a signal analysis control unit 17, a reception sensitivity test control unit 18, a peak power measurement control unit 19, and a measurement situation display control unit 13a. The call connection control unit 14, the signal transmission and reception control unit 15, the DUT scanning control unit 16, the signal analysis control unit 17, the reception sensitivity test control unit 18, the peak power measurement control unit 19, and the measurement situation display control unit 13a are also realized by executing a predetermined program stored in the ROM 11b in a work area of the RAM 11c by the CPU 11a.

The call connection control unit 14 drives the test antenna 5 via the NR system simulator 20 and the signal processing unit 23 to transmit and receive a control signal (radio signal) to and from the DUT 100, thereby performing control to establish a call (a state where the radio signal can be transmitted and received) between the NR system simulator 20 and the DUT 100.

The signal transmission and reception control unit 15 performs a control of monitoring a user operation in the operation unit 12, transmitting a signal transmission command to the NR system simulator 20 after the call is established through call connection control, by being triggered with a predetermined measurement start operation related to the measurement of transmission and reception characteristics of the DUT 100 by the user, and transmitting the test signal from the NR system simulator 20 via the test antenna 5, and a control of transmitting a signal reception command and receiving the signal under measurement via the test antenna 5.

The DUT scanning control unit 16 drives and controls the drive motors 56f and 56g of the DUT scanning mechanism 56 to perform total spherical scanning of the DUT 100 mounted on the mounting tray 56d of the DUT mounting portion 56c.

Here, the total spherical scanning of the DUT 100 will be described with reference to FIGS. 5A and 5B to FIG. 7. Generally, related to power measurement of a signal radiated by the DUT 100 (radiated power measurement), a method for measuring an Equivalent Isotropic Radiated Power (EIRP) and a method for measuring Total Radiated Power (TRP) are known. The EIRP is, for example, a power value measured at each measurement point ($\theta$, $\varphi$) in a spherical coordinate system (r, $\theta$, $\varphi$) shown in FIG. 5A. On the other hand, the TRP is obtained by measuring the EIRP in all orientations of the spherical coordinate system (r, $\theta$, $\varphi$), that is, at a plurality of angular sample points PS (refer to FIG. 5B), which are regulated in advance, on a spherical surface equidistant from a center O1 (hereinafter, a reference point) of the total spherical scanning of the DUT 100, and obtaining a total sum thereof.

The total spherical scanning of the DUT 100 means a control operation of sequentially changing the DUT 100 mounted on the mounting tray 56d in all orientations of a surface of a sphere B while using, for example, a center O1 of the sphere B (refer to FIGS. 5A and 5B) as a reference (center), that is, sequentially changing a posture of the DUT 100 in a state in which the antenna 110 faces the angular sample point (hereinafter, referred to as a measurement position) PS.

Figure 6:
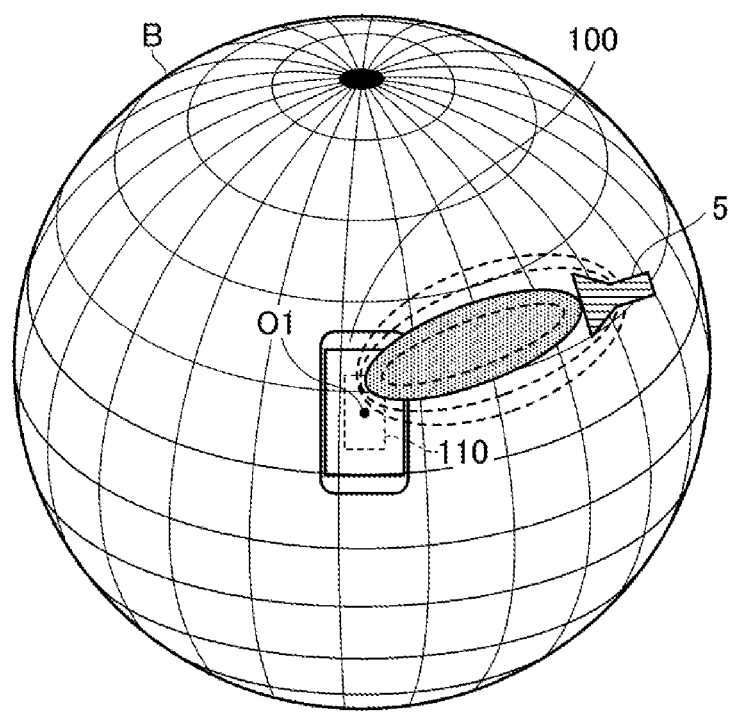
FIG. 6 is a diagram explaining a disposition mode of a test antenna 5 in the OTA chamber of the measurement device according to the first embodiment of the present invention using the spherical coordinate system (r, $\theta$, $\varphi$) shown in FIGS. 5A and 5B.

In order to measure the EIRP at each measurement position PS in accordance with the total spherical scanning of the DUT 100, as shown in FIG. 6, the test antenna 5 for receiving a signal radiated by the DUT 100 is disposed at a position of a specific measurement position PS (one point) in the spherical coordinate system (r, $\theta$, $\varphi$) as shown in FIG. 6.

In the total spherical scanning, the DUT 100 is driven (scanned) so that the antenna surface of the antenna 110 sequentially faces the light reception surface of the test antenna 5. As a result, the test antenna 5 can transmit and receive a signal for the TRP measurement to and from the antenna 110 of the DUT 100 on which the total spherical scanning is performed. Here, the transmitted and received signal is a test signal that is transmitted from the NR system simulator 20 via the test antenna 5, and a signal that is transmitted by the DUT 100, which has received the test signal, using the antenna 110, that is, a signal under measurement that is received via the test antenna 5.

Figure 7:
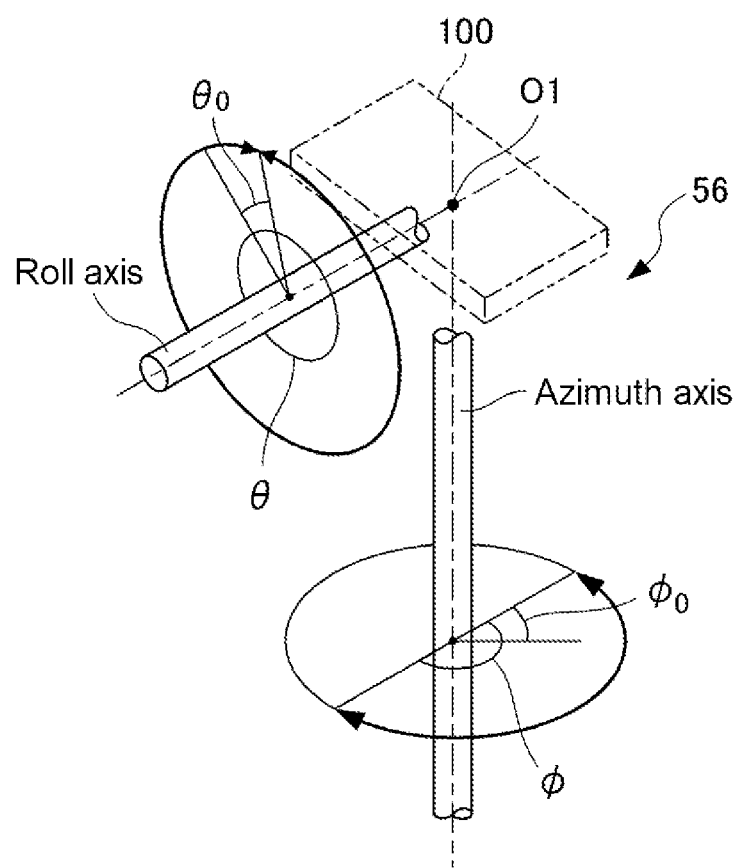
FIG. 7 is a diagram showing a rotation drive image around an azimuth axis and a roll axis of a positioner related to total spherical scanning of the DUT in the measurement device according to the first embodiment of the present invention.

The total spherical scanning of the DUT 100 is realized by rotationally driving the azimuth axis and the roll axis by the drive motors 56f and 56g which constitutes the DUT scanning mechanism 56. FIG. 7 shows a rotation drive image around the azimuth axis and the roll axis of the positioner (DUT scanning mechanism 56) related to the total spherical scanning of the DUT 100 in the measurement device 1. As shown in FIG. 7, the DUT scanning mechanism 56 of the measurement device 1 according to the present embodiment moves the DUT 100 in an angular direction of $\varphi$ around the azimuth axis, for example, within a range of 180 degrees and moves the DUT 100 in an angular direction of $\theta$ around the roll axis, for example, within a range of 360 degrees, so that it is possible to perform the total spherical scanning (refer to FIGS. 5A and 5B and 6) in which the DUT 100 is rotated in all orientations based on the center O1 thereof.

In FIG. 7, $\varphi_0$ indicates a unit movement angle in a total movement angle (180 degrees) in the rotation direction (angular direction of φ) of the azimuth axis, and θ₀ indicates the unit movement angle (hereinafter, step angle) in the total movement angle (360 degrees) in the rotation direction (angular direction of θ) of the roll axis. To and θ₀ are obtained by enabling, for example, the step angle having a desired value to be selectively set from a plurality of step angles having different values which are regulated in advance. The set φ₀ and θ₀ regulate the angle between the adjacent measurement positions PS shown in FIG. 5B, and as a result, regulate the number of measurement positions PS.

In order to realize control of the total spherical scanning of the DUT 100 by the DUT scanning control unit 16, for example, a DUT scanning control table 16a is prepared in the ROM 11b in advance. The DUT scanning control table 16a stores, for example, control data associated with coordinates of each measurement position PS (refer to FIG. 5B) in the spherical coordinate system (refer to FIG. 5A) related to the total spherical scanning of the DUT 100, drive data of the drive motors 56f and 56g associated with the coordinates of each measurement position PS, and stop time (measurement time) at each measurement position PS. In a case where the drive motors 56f and 56g are, for example, stepping motors, for example, the number of drive pulses is stored as the drive data.

The DUT scanning control unit 16 expands the DUT scanning control table 16a into the work area of the RAM 11c, and drives and controls the drive motors 56f and 56g of the DUT scanning mechanism 56 based on the control data stored in the DUT scanning control table 16a. As a result, the total spherical scanning of the DUT 100 mounted on the DUT mounting portion 56c is performed. In the total spherical scanning, the antenna surface of the antenna 110 of the DUT 100 is stopped for a regulated time (the stop time) toward the measurement position PS for each measurement position PS in the spherical coordinate system, and, thereafter, an operation of moving to a next measurement position PS (scanning of the DUT 100) is sequentially performed while targeting all the measurement positions PS.

In order to realize the Coarse & fine grid measurement related to a beam peak search (peak power search) according to the present embodiment, the DUT scanning control unit 16 has a configuration capable of selectively executing first rotation control that rotates the DUT 100 to sequentially face an orientation (first orientation), in which the DUT 100 is separated at a first step interval of the spherical coordinate system by rotating the positioner (DUT scanning mechanism 56) at the first step (predetermined step) interval, and second rotation control that rotates the DUT 100 to sequentially face an orientation (second orientation), in which the DUT 100 is separated at a second step interval of the spherical coordinate system by rotating the positioner at the second step interval which is finer than the first step interval. In the present embodiment, the first step and the second step correspond to an interval between measurement positions PSa (refer to FIG. 13) based on a Coarse grid and an interval between measurement positions PSb (refer to FIG. 13) based on a Fine grid, respectively. The DUT scanning control unit 16 constitutes rotation control means of the present invention.

In a case where the total spherical scanning of the DUT 100 is performed, the signal analysis control unit 17 captures the radio signal related to NR received by the test antenna 5 via the NR system simulator 20, and performs an analysis process (measurement process) on the radio signal as a signal related to the EIS CDF measurement.

In accordance with the total spherical scanning of the DUT 100 described above, the measurement device 1 can also perform Equivalent Isotropic Sensitivity (EIS) measurement at each measurement position PS in the spherical coordinate system (r, θ, φ). The EIS measurement is to evaluate the reception sensitivity of the DUT 100 by transmitting the test signal from the NR system simulator 20 via the test antenna 5, and receiving a signal (signal under measurement) transmitted by the DUT 100, which has received the test signal, using the antenna 110.

In the EIS measurement at each measurement position PS, a reception sensitivity test is performed a plurality of times in which an output level of the test signal is transmitted while changing the output level, a throughput of the signal (signal under measurement) transmitted by the DUT 100, which has received the test signal, is measured, and a Cumulative Distribution Function (CDF) of EIS is calculated according to a measurement result of the throughput. In FIG. 6, a plurality of elliptical shapes interposed between the test antenna 5 and the DUT 100 show an image for changing and setting the output level of the test signal in the reception sensitivity test related to the EIS measurement.

In a case where the EIS measurement is performed, the reception sensitivity test control unit 18 performs control related to the reception sensitivity test for causing the DUT 100 to receive the test signal transmitted from the signal generation unit 21a of the NR system simulator 20 and to transmit the signal under measurement in response, and inputting the signal under measurement to the signal measurement unit 21b of the NR system simulator 20. The reception sensitivity test control unit 18 constitutes reception sensitivity test execution means of the present invention.

The reception sensitivity test control unit 18 includes a test condition setting unit 18a, a throughput measurement unit 18b, an output level variable setting unit 18d, and a measurement result output unit 18e in order to realize the reception sensitivity test related to the EIS measurement.

The test condition setting unit 18a is a functional unit for setting a test condition (step angle or the like) of the reception sensitivity test. The throughput measurement unit 18b is a functional unit for measuring a throughput of the signal under measurement transmitted in response from the DUT 100 for each reception sensitivity test. The output level variable setting unit 18d is a functional unit for variably setting (for example, sequentially lowering the level) the output level of the test signal in a next reception sensitivity test according to a comparison result between the measurement result of the throughput by the throughput measurement unit 18b and a predetermined threshold value (throughput threshold value) which is set in advance. The output level variable setting unit 18d constitutes output level setting means of the present invention.

The measurement result output unit 18e is a functional unit for determining whether or not a test result (measurement result of the throughput) of a current reception sensitivity test using the test signal, which has an output level obtained after the variable setting, satisfies a throughput measurement end condition which is set in advance, and for outputting the test result in a case where it is determined that the throughput measurement end condition is satisfied. The measurement result output unit 18e may be realized by a functional configuration which repeatedly executes the output level variable setting that sequentially reduces a step of the output level of the test signal, for example, under the control of the output level variable setting unit 18d, holds a fact that the result of the throughput becomes negative determination for the first time (determination to be below the predetermined threshold value which is set in advance: negative determination) as the throughput measurement end condition, and outputs an output level immediately before the output level, which is determined to be the negative determination, as the reception sensitivity. The measurement result output unit 18e constitutes the measurement result output means of the present invention.

The peak power measurement control unit 19 is a functional unit for measuring the reception power of the radio signal from the DUT 100 for each of a plurality of orientations in accordance with the EIS-CDF measurement and searching for an orientation having the maximum reception power as a beam peak (peak power), and includes a reception power measurement unit 19a, a peak power candidate selection unit 19b, and a peak power determination unit 19c. The peak power measurement control unit 19 constitutes peak power measurement means of the present invention.

The reception power measurement unit 19a is a functional unit for measuring the reception power of the radio signal (signal under measurement transmitted by the DUT 100 in response to the reception of the test signal) received from the DUT 100 using the test antenna 5.

The peak power candidate selection unit 19b is a functional unit for selecting, as peak power candidates, the reception power and an orientation of the reception power which are included within a range of predetermined power width ΔPw from the maximum reception power among the reception power of the radio signal measured for each orientation regulated at the first step interval by the reception power measurement unit 19a. The power width ΔPw can be a predetermined value set to correspond to a range (Fine search range) at the step (second step) interval corresponding to the Fine grid. The peak power candidate selection unit 19b constitutes candidate selection means of the present invention.

The peak power determination unit 19c has a determination processing function of performing the second rotation control on a peripheral area of the orientation (first orientation) corresponding to each of the peak power candidates selected by the peak power candidate selection unit 19b to measure the reception power of the radio signal for each orientation (second orientation) regulated at the second step interval, and determining the maximum reception power of the measured reception power and the orientation of the reception power as the peak power. The peak power determination unit 19c constitutes determination means of the present invention.

The measurement situation display control unit 13a has a display control function of displaying the measurement progress display screen 130a (refer to FIG. 15), which shows a progress situation of the measurement in the reception sensitivity test related to the EIS measurement, on the display unit 13.

Figure 4:
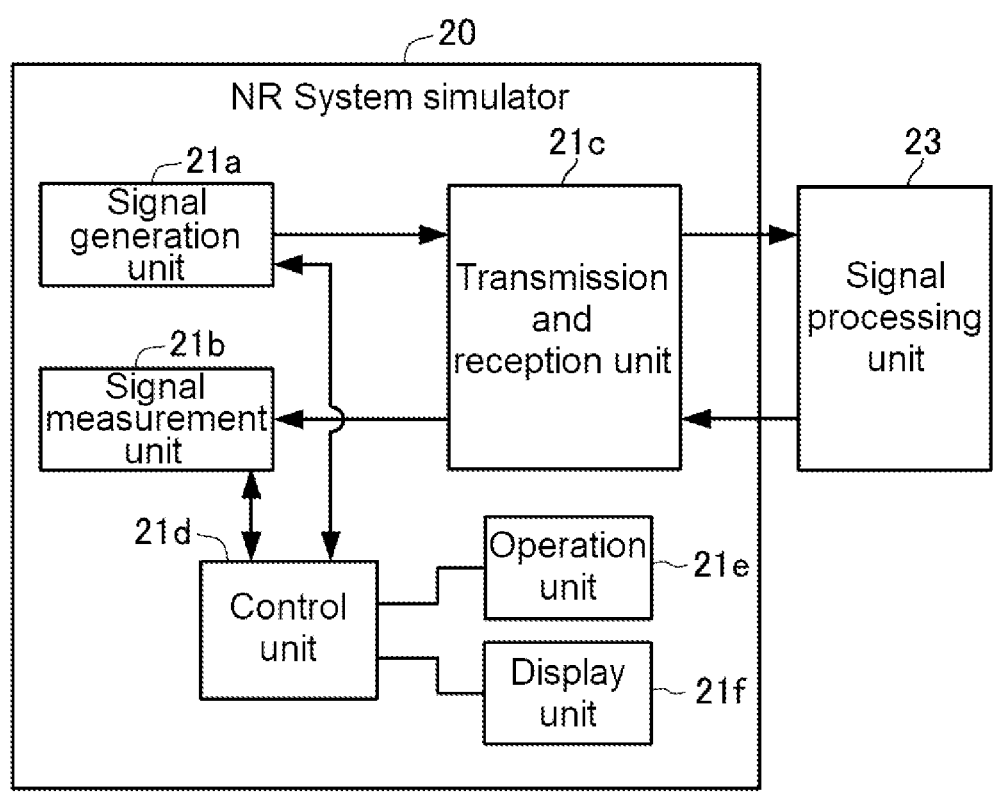
FIG. 4 is a block diagram showing a functional configuration of an NR system simulator in the measurement device according to the first embodiment of the present invention.

As shown in FIG. 4, the NR system simulator 20 includes a signal generation unit 21a, a signal measurement unit 21b, a transmission and reception unit 21c, a control unit 21d, an operation unit 21e, and a display unit 21f.

The signal generation unit 21a generates a signal (baseband signal) that becomes a source of the test signal. The transmission and reception unit 21c functions as an RF unit that generates the test signal corresponding to a frequency of each communication standard from the signal generated by the signal generation unit 21a and sends the generated test signal to the signal processing unit 23, and restores the baseband signal from the signal under measurement which is sent from the signal processing unit 23. The signal measurement unit 21b performs a measurement process of the signal under measurement based on the baseband signal restored by the transmission and reception unit 21c.

The control unit 21d comprehensively controls each of the functional units including the signal generation unit 21a, the signal measurement unit 21b, the transmission and reception unit 21c, the operation unit 21e, and the display unit 21f. The operation unit 21e is a functional unit for inputting various information such as commands, and the display unit 21f is a functional unit for displaying various information such as an input screen and measurement results of the various information.

In the measurement device 1 having the above-described configuration, the DUT 100 is mounted on the mounting tray 56d of the positioner (DUT scanning mechanism 56) in the internal space 51 of the OTA chamber 50. Therefore, it is possible to perform, in addition to EIRP measurement at each measurement position PS and TRP measurement over all the measurement positions PS, the EIS measurement at each measurement position PS, and the EIS-CDF measurement over all the measurement positions PS, while moving (rotating) the DUT 100 by a preset step angle in the biaxial (azimuth axis and roll axis) direction for each mounting tray 56d.

In the present embodiment, a Constant Step (constant angle interval) type, in which the angle interval between each of the measurement positions PS is constant, is adopted as the grid type that regulates the interval between the measurement positions PS in the EIS-CDF measurement. As a result, the DUT scanning control unit 16 rotationally drives the positioner so that the DUT 100 sequentially faces the measurement positions PS disposed at equal angle intervals on the spherical coordinate system, and the signal analysis control unit 17 and the reception power measurement unit 19a perform a process of measuring the reception power of the radio signal received at each measurement position PS.

Further, in the present embodiment, as the Constant Step type grid, two types of grids are prepared which include a grid in which the interval between the measurement positions PS is a predetermined interval (coarse grid: hereinafter, referred to as a Coarse grid) and a grid having an interval finer than the predetermined interval (finer grid, hereinafter, referred to as Fine grids). As a result, the peak power measurement control unit 19 performs measurement (peak research) of the reception power of the radio signal from the DUT 100 while rotating the positioner at predetermined intervals regulated by the Coarse grid, and, in a case where there are a plurality of peak power candidates, continues the peak research while rotating the positioner at an interval finer than the predetermined interval regulated by the Fine grid for peripheral areas of the peak power candidates, thereby realizing so-called Coarse & fine grid measurement control.

In the measurement device 1 according to the present embodiment, for a first grid pattern and a second grid pattern, a Constant Density type, in which the densities of the first orientation and the second orientation are constant, respectively, may be adopted (refer to second embodiment).

Figure 12:
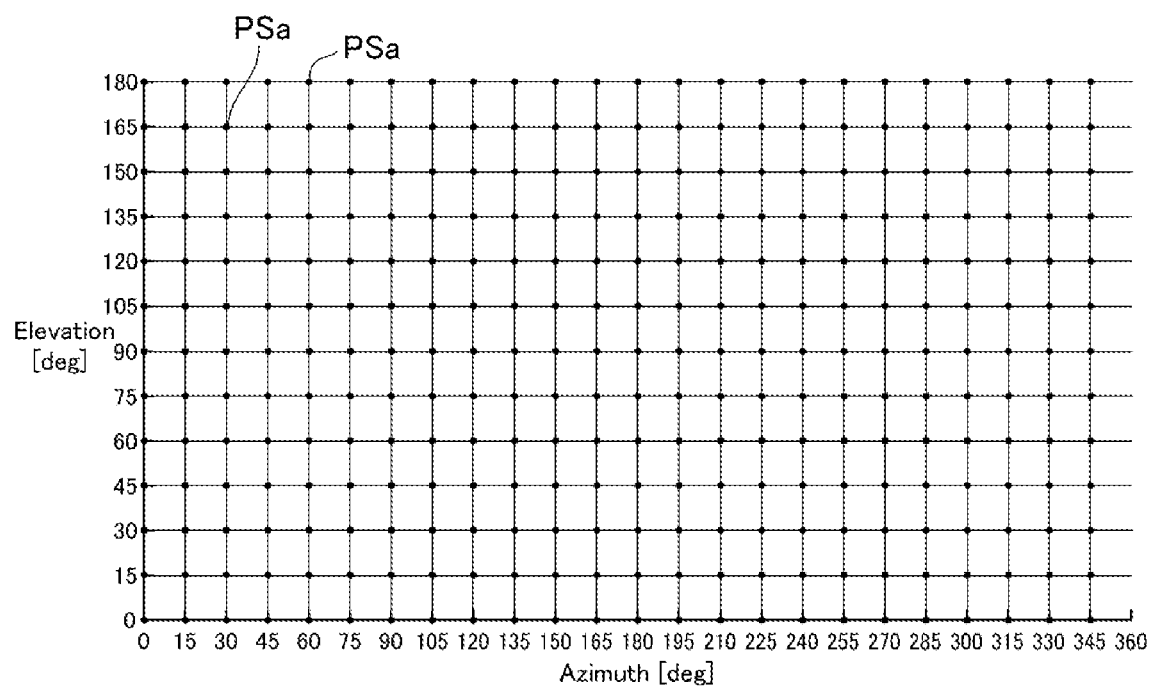
FIG. 12 is a graph showing a disposition mode of a measurement position PSa by a Constant Step-type Coarse grid used in a first EIS measurement process in step S3 of FIG. 8.

The Coarse grid regulates, for example, the disposition of the measurement positions PS at the step intervals shown in FIG. 5B. For example, as shown in graphs of FIG. 12 and FIG. 13, the DUT scanning control unit 16, using the Coarse grid, realizes the rotation control (first rotation control) to sequentially pass through the measurement positions (hereinafter, identified by attaching a reference numeral PSa) in a range of 180 degrees or 360 degrees at an interval of 15 degrees in a roll direction and an azimuth direction.

Figure 13:
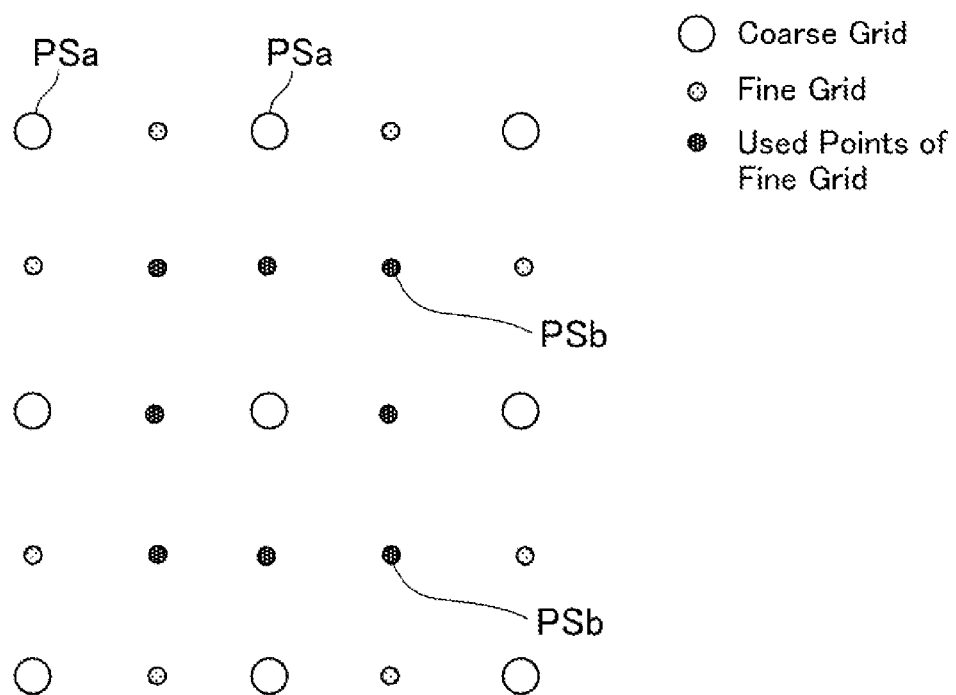
FIG. 13 is a diagram showing a disposition mode of a measurement position PSb by a Constant Step-type Fine grid used in a second EIS measurement process in step S5 of FIG. 8.

On the other hand, the Fine grid regulates, for example, the disposition of the measurement position PS at the step interval indicated by a small circle in FIG. 13. The DUT scanning control unit 16, using the Fine grid, can further realize the rotation control (second rotation control) to sequentially pass through the measurement positions (hereinafter, identified by attaching a reference numeral PSb) in a range of 180 degrees or 360 degrees at an interval of 7.5 (15/2=7.5) degrees in the roll direction and the azimuth direction.

The measurement device 1 according to the present embodiment may have a configuration in which, for example, the DUT scanning control table 16a holds data of the grid pattern (first grid pattern) of the Coarse grid that regulates the measurement position PSa (first orientation) and data of the grid pattern (second grid pattern) of the Fine grid that regulates the measurement position PSb (second orientation). As a result, the DUT scanning control unit 16 can perform the above-described first rotation control and second rotation control, respectively, based on the first grid pattern and the second grid pattern. In this way, the DUT scanning control table 16a constitutes holding means of the present invention.

(Overview of Beam Peak Search Control) The measurement device 1 according to the present embodiment is based on the beam peak search by the Coarse & fine grid measurement. In the beam peak search, first, the EIS measurement (first EIS measurement) in each orientation based on the Coarse grid is performed according to a flowchart shown in FIG. 8 (refer to step S3), thereafter, selection of the peak power candidates are performed (refer to step S4), and the EIS measurement (second EIS measurement) in each orientation within a specific range based on the Fine grid is performed (refer to step S5).

The first EIS measurement and the second EIS measurement are common in that angle intervals between the measurement positions PS (the former is the measurement position PSa and the latter is the measurement position PSb) are different from each other (the former corresponds to the Coarse grid and the latter corresponds to the Fine grid), and, in each case, for example, as shown in FIG. 5B, a process of performing the EIS measurement for each measurement position PS (a part surrounded by a circle), and obtaining a Cumulative Distribution Function (CDF) (an arrow between the measurement positions PS surrounded by circles) using a result of the ESI measurement at each measurement position PS.

In either the first EIS measurement or the second EIS measurement, the reception sensitivity test of the DUT 100 is performed in advance (refer to steps S3 and S5). Each EIS value is obtained based on a test result of the reception sensitivity test.

After the first EIS measurement is performed for each orientation (measurement position PSa) corresponding to the Coarse grid, some orientations, which become peak power candidates, are selected from the reception power of the radio signal, which is measured by the reception sensitivity test related to the first EIS measurement, from the DUT 100 (refer to step S4), and, from the peak power candidates, an orientation corresponding to the maximum of the reception power measured by the reception sensitivity test related to the second EIS measurement for each orientation (measurement position PSb) corresponding to the Fine grid is detected (measured) as the peak power (beam peak) (step S6).

Figure 8:
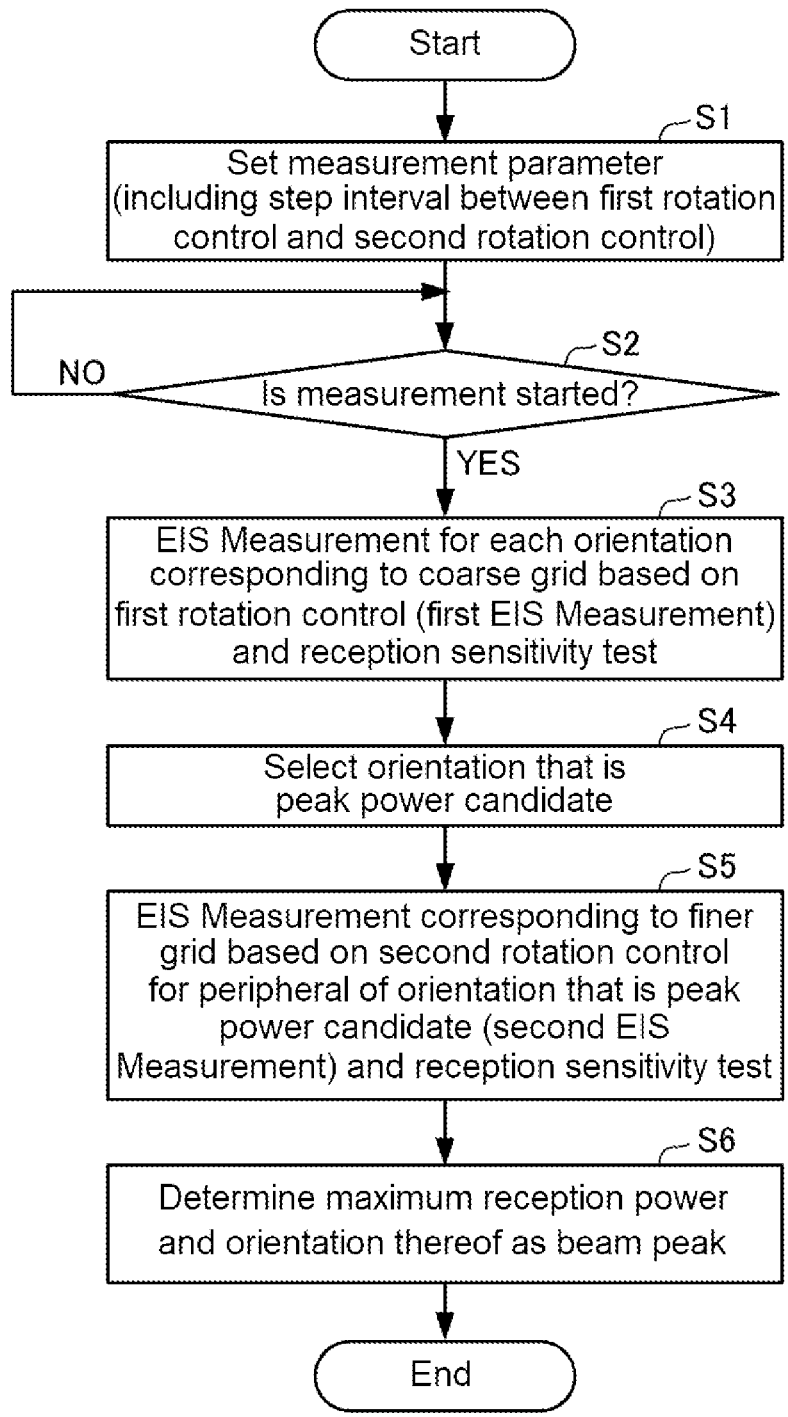
FIG. 8 is a flowchart showing a beam peak search control operation in the measurement device according to the first embodiment of the present invention.

Next, a beam peak search control operation of the measurement device 1 according to the present embodiment will be described with reference to the flowchart shown in FIG. 8. As shown in FIG. 8, the beam peak search control is performed by the integrated control device 10 in accordance with EIS-CDF measurement control.

In order to perform the EIS-CDF measurement in the measurement device 1, first, the DUT 100 to be tested is set in the DUT mounting portion 56c of the positioner (DUT scanning mechanism 56) of the OTA chamber 50, and then a measurement parameter is set by the operation unit 12 (step S1). Here, the test condition setting unit 18a in the control unit 11 of the integrated control device 10 receives an operation input in the operation unit 12, sets the measurement item as the EIS-CDF measurement, and, further, sets the step angle between the measurement positions PS. For the step angle, it is necessary to set an angle interval corresponding to the first step corresponding to the Coarse grid and a step interval corresponding to the second step corresponding to the Fine grid.

After setting of the measurement parameter is completed, the integrated control device 10 monitors whether or not the measurement start operation is performed in the operation unit 12 (step S2). In a case where the measurement start operation is performed here (YES in step S2), the control unit 11 executes the first rotation control, and controls the DUT scanning control unit 16, the positioner, and the NR system simulator 20 so that the first EIS measurement is performed for each orientation (measurement position PSa) corresponding to the Coarse grid based on the first rotation control (step S3).

A control operation of the first EIS measurement will be described in more detail with reference to FIG. 10. A flowchart of FIG. 10 also includes a flow of display control (parts in parentheses in steps S21 and S23) of the measurement progress display screen 130a (refer to FIG. 15) by the measurement situation display control unit 13a.

Figure 10:
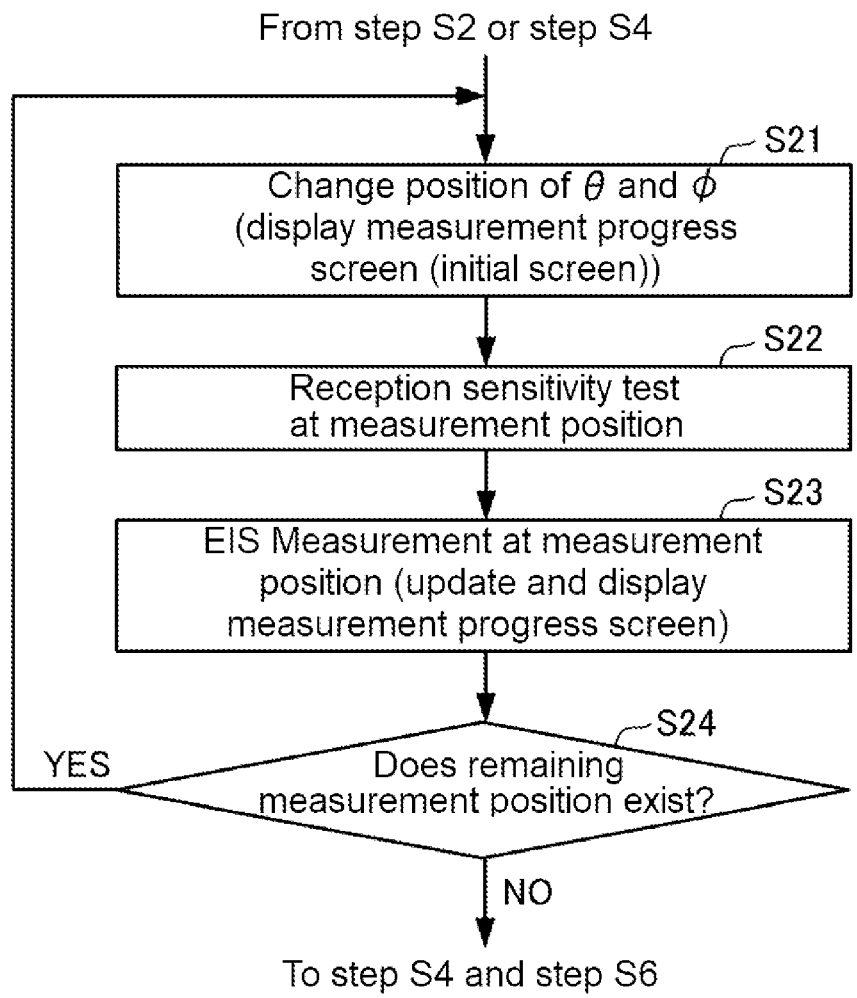
FIG. 10 is a flowchart collectively showing detailed operations of a first EIS measurement process in step S3 of FIG. 8 and a second EIS measurement process in step S5.

As shown in FIG. 10, in the first EIS measurement process in step S3 of FIG. 8, the DUT scanning control unit 16 rotationally drives the drive motors 56f and 56g to rotate (move) the positioner to an angular position of (θ, φ) corresponding to an initial measurement position PSa in the spherical coordinate system (r, θ, φ) shown in FIG. 5A based on the step angle corresponding to the Coarse grid set in step S1 of FIG. 8. (Step S21).

Subsequently, the reception sensitivity test control unit 18 drives and controls the NR system simulator 20, and performs control so that the EIS measurement is performed at the measurement position PSa (the first measurement is performed at the initial measurement position) corresponding to the angular position of the positioner in step S21 (step S23).

In the EIS measurement at the initial measurement position, the reception sensitivity test control unit 18 inputs the signal generated from the signal generation unit 21a of the NR system simulator 20 to the signal processing unit 23 so as to generate the test signal, and transmits the test signal to the DUT 100 by the test antenna 5.

Subsequently, the reception sensitivity test control unit 18 controls the throughput measurement unit 18b and the output level variable setting unit 18d so as to perform the reception sensitivity test of repeating throughput measurement a plurality of times (step S22) while causing the test antenna 5 to receive the signal under measurement transmitted by the DUT 100 which has received the test signal, further causing the throughput of the signal under measurement to be tested via the signal processing unit 23, the transmission and reception unit 21c, and the signal measurement unit 21b, and changing the output level of the test signal.

In a case where a measured value of the throughput is equal to or less than the threshold value while the reception sensitivity test is performed a plurality of times, the reception sensitivity test control unit 18 controls so that next throughput measurement is not performed. That is, in the reception sensitivity test in step S22, a throughput measurement end condition is made by a determination (negative determination) in which the result of the throughput is smaller than the threshold value for the first time while repeatedly executing a process of reducing the output level of the test signal in a step of equal intervals. The reception sensitivity test control unit 18 sets, as the reception sensitivity, immediately before (one time before) the output level of the test signal in a case where the reception sensitivity test satisfies the throughput measurement end condition (in a case where the measurement result of the throughput is a negative determination).

Figure 11:
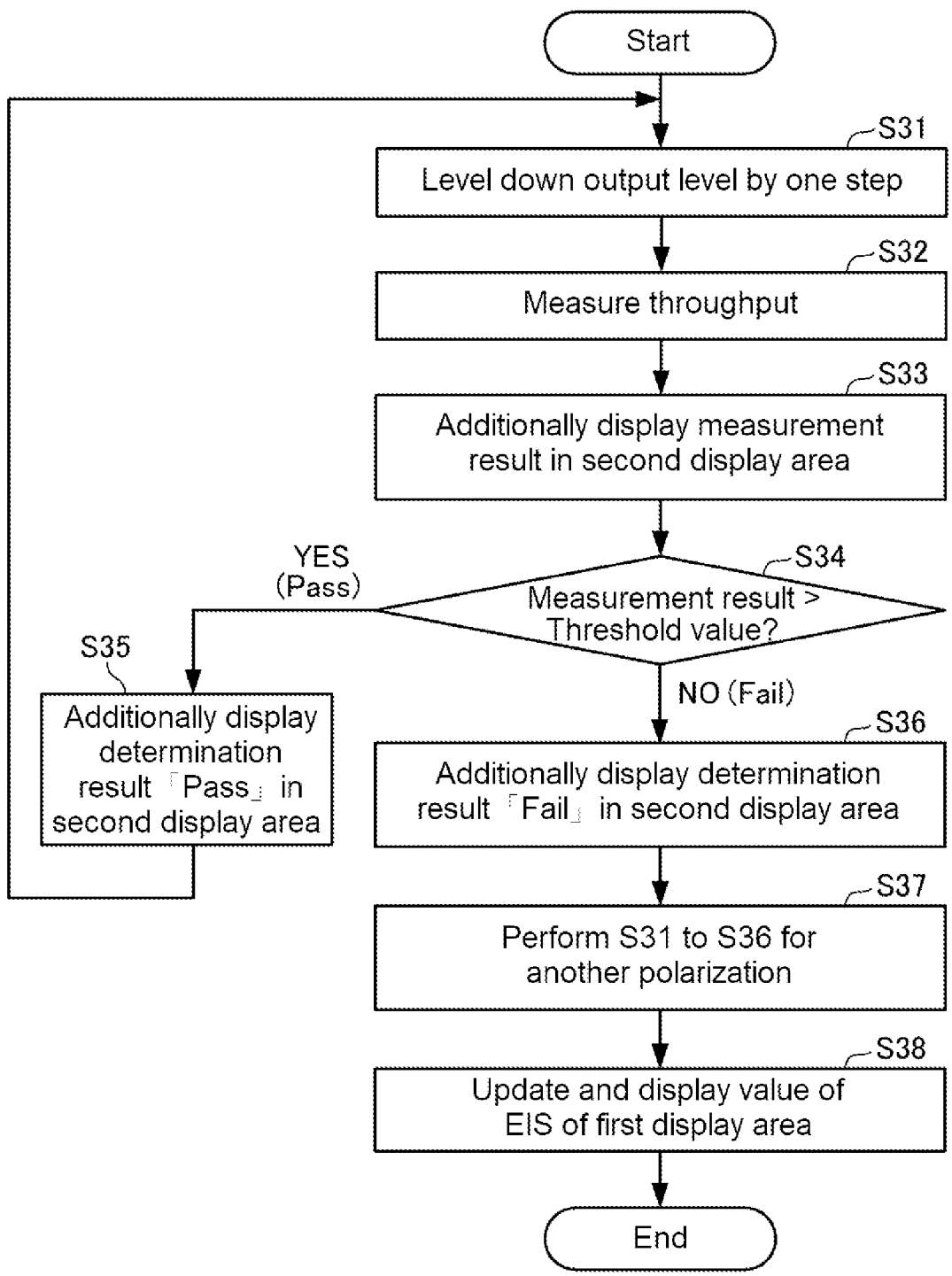
FIG. 11 is a flowchart showing a measurement situation display processing operation of EIS-CDF measurement executed in accordance with processes in steps S22 and S23 of FIG. 10.

The reception sensitivity test in step S22 is performed once for each of the test signals of a θ polarization and a φ polarization, which are linearly polarizations orthogonal to each other (refer to steps S31 to S36 and S37 in FIG. 11). In a case where a total of two reception sensitivity tests are completed, the reception sensitivity test control unit 18 performs a process of calculating an average value of both measured values as an EIS value from the measured values (the measured value corresponding to the θ polarization and the measured value corresponding to the φ polarization) of the immediately before throughput, which is equal to or less than the threshold value, that is held in a case where the reception sensitivity test is completed at each time (corresponding to the EIS measurement process in step S23).

In a case where the EIS measurement (calculation of EIS value=EIS (Total calculation)) at the initial measurement position PSa in step S23 is completed, the DUT scanning control unit 16 subsequently determines whether or not a remaining measurement position PSa exists (step S24).

In a case where it is determined that the remaining measurement position PSa exists (YES in step S24), the DUT scanning control unit 16 rotationally drives the drive motors 56f and 56g so that the positioner moves to the angular position of (θ, φ) corresponding to a next measurement position PSa in the spherical coordinate system (r, θ, φ) (step S21). Here, an angle at which the positioner is moved (an angle from the previous measurement position PSa to the next measurement position PSa) corresponds to the step angle corresponding to the Coarse grid that received the setting in step S1 of FIG. 8.

In a case where the movement of the step angle of the positioner is completed and the movement is stopped at the next measurement position PSa, the reception sensitivity test control unit 18 drives and controls the NR system simulator 20 so as to perform the reception sensitivity test and the EIS measurement at the next (second) measurement position PSa corresponding to the angular position of the positioner in step S24 (steps S22 and S23).

Thereafter, while it is determined that the remaining measurement position PSa exists in step S24 (YES in step S24), the DUT scanning control unit 16 and the signal analysis control unit 17 perform the reception sensitivity test at the remaining measurement position PSa and the EIS measurement by repeating the processes in steps S21 to S24.

In a case where it is determined that the remaining measurement position PSa does not exist in step S24 (NO in step S24) while updating the measurement position PSa and repeatedly performing control to perform the reception sensitivity test and the EIS measurement at an updated measurement position PSa, the beam peak search control proceeds to step S4 in FIG. 8.

Figure 9:
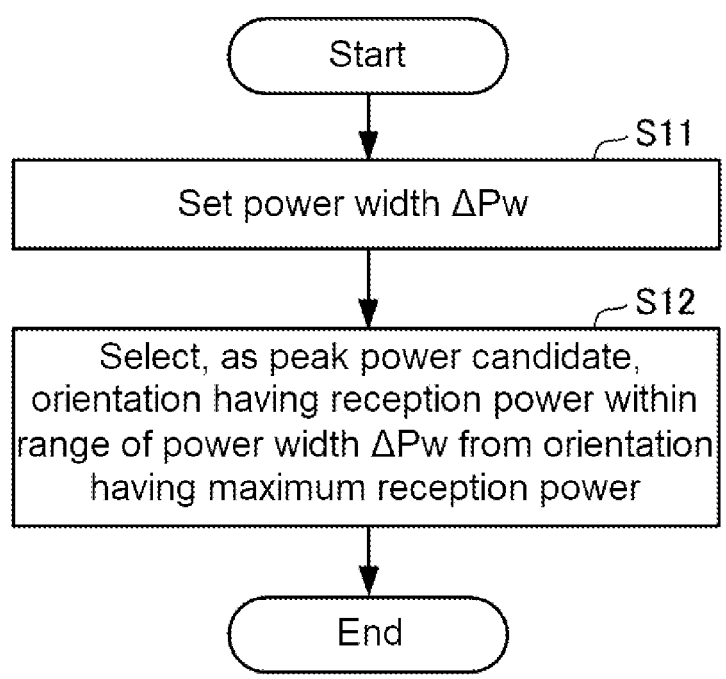
FIG. 9 is a flowchart showing a detailed operation of a peak power candidate selection process in step S4 of FIG. 8.

In step S4, the peak power measurement control unit 19 performs a process of selecting an orientation that becomes the peak power candidate for the reception power of the test signal from the DUT 100 using the test antenna 5. Here, the reception power to be selected as the peak power candidate is measured by, for example, the reception power measurement unit 19a for each orientation according to the EIS measurement (refer to step S3) in all the orientations (measurement position PSa) corresponding to the Coarse grid. In step S4, for example, as shown in FIG. 9, the peak power measurement control unit 19 first sets the predetermined power width ΔPw related to the reception power (step S11), subsequently specifies an orientation which has the maximum value of the reception power measured by the reception power measurement unit 19a, and selects, as the peak power candidate, each orientation having the reception power within the range of the power width ΔPw set in step S11 from the specified orientation (step S12).

In a case where the beam candidate selection process in step S4 (steps S11 and S12 of FIG. 9) is completed, a beam peak search process proceeds to step S5. Here, the control unit 11 causes the DUT scanning control unit 16 to perform the second rotation control, and controls the positioner, the reception sensitivity test control unit 18, and the NR system simulator 20 to perform the reception sensitivity test and the second EIS measurement for each orientation (measurement position PSb) corresponding to the Fine grid based on the second rotation control (step S5). The measurement position PSb to be measured in the reception sensitivity test and the second EIS measurement has an angle interval corresponding to the Fine grid, and is disposed within a predetermined fixed range (in an example of FIG. 13, the measurement position PSb indicated by a small black circle) around the orientation corresponding to the beam candidate selected in step S4.

Although the second EIS measurement and the reception sensitivity test in step S5 are realized using the same procedure as in the first EIS measurement and the reception sensitivity test in step S3 except that the angle interval and measurement area of the target orientation (measurement position PSb) are different (refer to steps S21 to S23 of FIG. 10).

In a case where the second EIS measurement and the reception sensitivity test are completed, the peak power measurement control unit 19 subsequently executes a peak determination process (step S6). Here, the peak power determination unit 19c determines, as a beam peak (peak power), the measurement position PSb under the second EIS measurement in step S5, that is, the maximum reception power and an orientation thereof in the reception powers measured for each orientation corresponding to the peak power candidate, and, thereafter, ends a series of beam peak search controls.

Figure 14A:
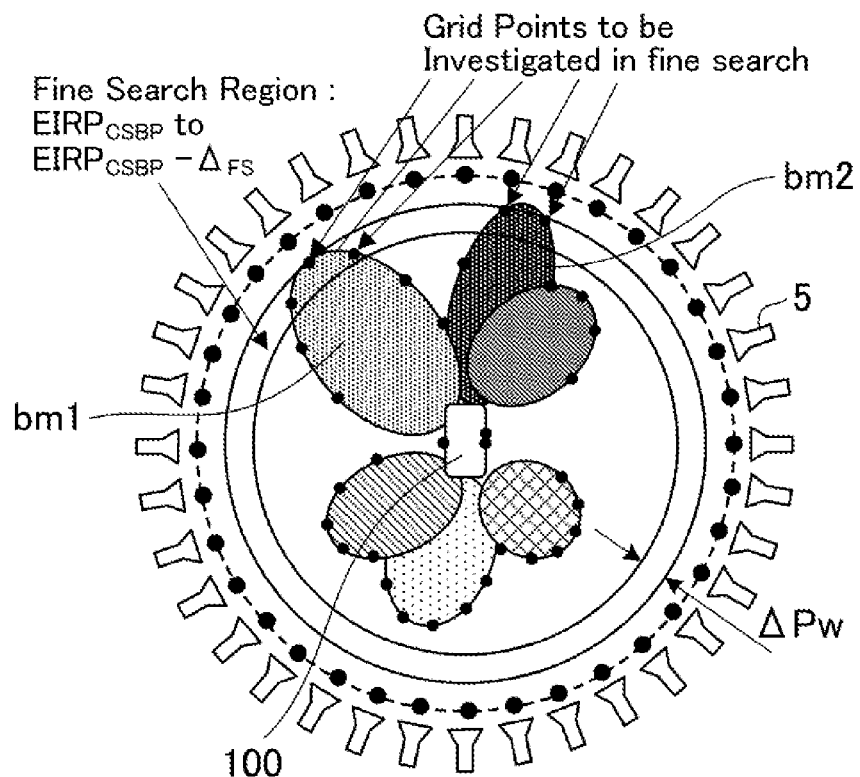
Figure 14B:
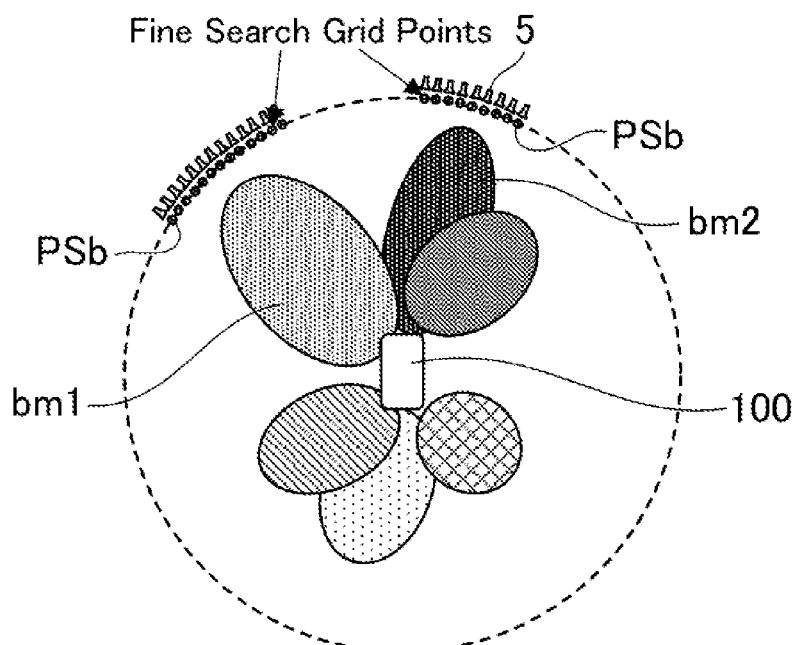
Figure 14C:
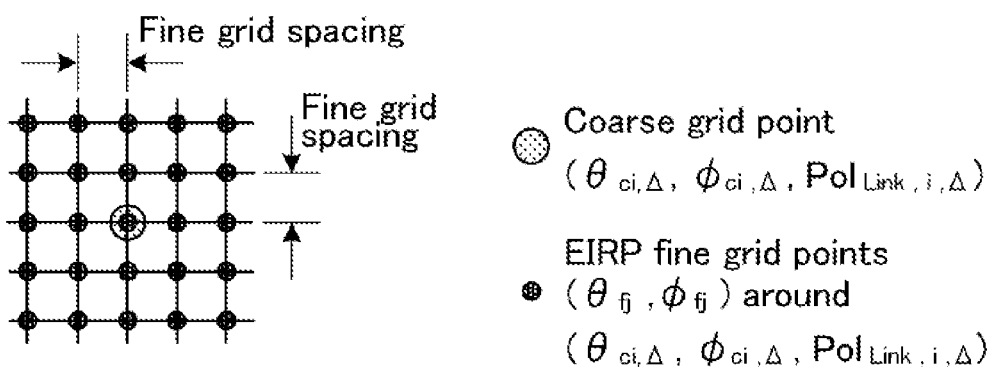

A specific example of the peak power candidate selection process in step S4 and the peak determination process in step S6 will be described with reference to FIGS. 14A to 14C. In the Coarse & fine grid measurement in the measurement device 1 according to the present embodiment shown in FIGS. 14A to 14C, in a Coarse search stage shown in FIG. 14A, the beam peak search is performed in each orientation (refer to the measurement position PSa) based on the Coarse grid, and the reception power (including bm1) within the range of the predetermined power width ΔPw from the maximum reception power bm2 is selected as the peak power candidate based on a search result thereof. Next, in a Fine search stage shown in FIG. 14B, the beam peak search is performed in each orientation (refer to measurement position PSb) based on the Fine grid for the periphery of each orientation corresponding to each of the peak power candidates, and the maximum reception power (bm1) is determined as the beam peak based on the search result thereof. In FIG. 14C, the orientation (measurement position PSa) based on the Coarse grid is indicated by a large shaded circle, and the orientation (measurement position PSb) based on the Fine grid is indicated by a small black circle.

In the measurement device 1 according to the present embodiment, in a case where the first EIS measurement and the second EIS measurement are performed during the execution of the beam peak search control (refer to FIG. 8), a display control is executed to display a measurement situation of the EIS-CDF measurement on the display unit 13 using the measurement progress display screen 130a.

More specifically, in the integrated control device 10, the measurement situation display control unit 13a performs control to display an initial screen of the measurement progress display screen 130a in accordance with the movement control of the positioner to the initial measurement position PS in step S21 of FIG. 10, and update and display a value of each item of the measurement progress display screen 130a in accordance with the progress of the EIS measurement in the same step S23 in accordance with the measurement result.

Figures 15, 16:
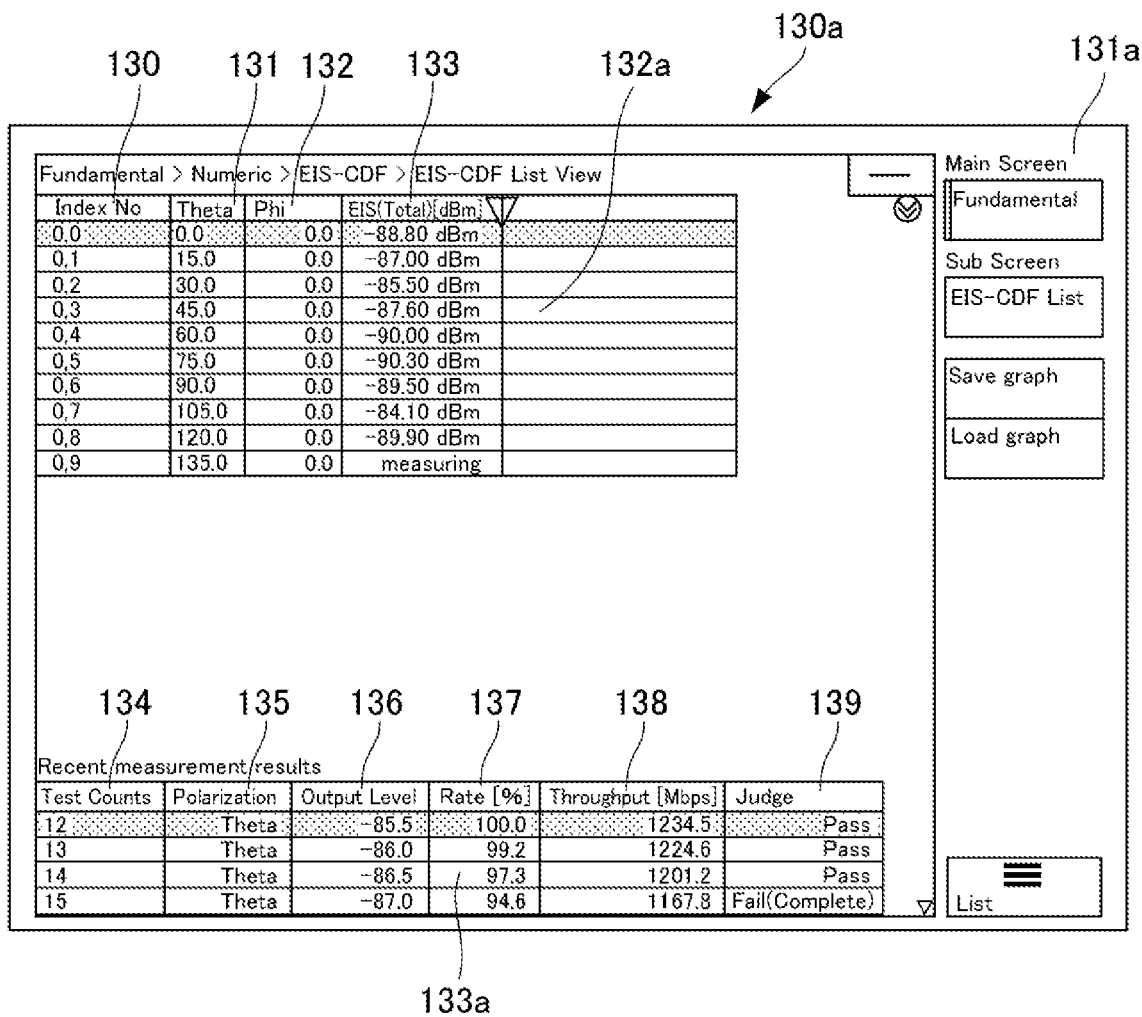
FIG. 15 is a diagram showing a display example of a measurement progress situation display screen during the EIS-CDF measurement by the integrated control device of the measurement device according to the first embodiment of the present invention.
FIG. 16 is a table for explaining an effect of shortening measurement time for the EIS-CDF measurement by Coarse & fine grid measurement of the measurement device according to the first embodiment of the present invention.

For example, as shown in FIG. 15, the measurement progress display screen 130a includes an item selection tool display area 131a, an EIS-CDF measurement situation display area 132a, and an EIS measurement situation display area 133a. The item selection tool display area 131a is an area for displaying various item selection tools used to select a display item (hereinafter, an item) to be displayed on the measurement progress display screen 130a. The EIS-CDF measurement situation display area 132a is a display area for displaying an EIS-CDF measurement result up to the measurement position PS where the above-described EIS measurement is completed. The EIS measurement situation display area 133a is a display area for displaying a progress situation of the EIS measurement at the measurement position PS where the throughput measurement is started in the EIS measurement.

The EIS-CDF measurement situation display area 132a includes, in addition to an index number item 130 indicating an order of measurement, respective items 131, 132, and 133 of a rotation angle θ around a roll axis of the positioner corresponding to the measurement position PS of an EIS measurement target, a rotation angle φ around the same azimuth axis, and the EIS measurement result (unit: dBm) at the measurement position PS. For the respective items 130, 131, 132, and 133 of the EIS-CDF measurement situation display area 132a, the measurement situation display control unit 13a performs display control to update and display the respective values (the index number, the rotation angle θ, the rotation angle φ, and the EIS measurement result) in accordance with the progress of the cumulative distribution measurement.

In the EIS measurement situation display area 133a includes, in addition to an item 134 indicating the number of tests (Test Counts) related to the cumulative distribution measurement, respective items 135, 136, 137, 138, and 139 of a polarization of the test signal (Polarization), the output level of the test signal (Output level, unit: dBm), a transmission rate of the test signal (Rate, unit: %), the measured value of the throughput (Throughput) of the signal under measurement transmitted by the DUT 100 that has received the test signal (unit: Mbps), and a determination result of whether or not the measured value of the throughput exceeds a preset threshold value (Judge: success (Pass) or failure (Fail)). The measurement situation display control unit 13a updates and displays, for the respective items 134, 135, 136, 137, 138, and 139 of the EIS measurement situation display area 133a, the respective values (a test count, the polarization of the test signal, the output level of the test signal, the transmission rate of the test signal, the throughput measurement value, the value of the determination result) in accordance with the progress of the EIS measurement.

The initial screen of the measurement progress display screen 130a (refer to step S21 of FIG. 10) has a display form in which, for example, display areas of the respective items 131, 132, and 133 corresponding to an index number (0, 1) are secured in the EIS-CDF measurement situation display area 132a and in which display areas of the respective items 135, 136, 137, 138, and 139 corresponding to a test count "12" are secured in the EIS measurement situation display area 133a.

Next, a measurement situation display processing operation during the EIS-CDF measurement by the integrated control device 10 of the measurement device 1 according to the present embodiment will be described with reference to a flowchart shown in FIG. 11. In FIG. 11, steps S31, S32, S34, and S37 are processing steps each constituting the reception sensitivity test in steps S3 and S5 of FIG. 8. The measurement situation display process is performed in accordance with the EIS measurement in steps S3 and S5 of FIG. 8 (that is, steps S21 to S23 of FIG. 10), and has a display control form of updating the values of the respective items in accordance with the progress of the EIS-CDF measurement for the respective items of the measurement progress display screen 130a (initial screen) displayed in step S21.

In a case where the measurement situation display process is performed, the reception sensitivity test control unit 18, as an initial process of the reception sensitivity test for the EIS measurement at the measurement position PS, first switches a reception sensitivity test target into the θ polarization, lowers the output level of the test signal from the initial output level by one stage level (where an initial output level is a regulated value) by the output level variable setting unit 18d, and transmits the test signal of the θ polarization from the test antenna 5 (step S31).

Subsequently, the reception sensitivity test control unit 18 performs control to cause the test antenna 5 to receive the signal under measurement which is transmitted by the DUT 100 that has received the test signal, and to cause the throughput measurement unit 18b to measure the throughput of the received signal under measurement (step S32).

Subsequently, the measurement situation display control unit 13a performs control to display a throughput value (measured value) measured in step S32 as the item 136 of the list display area corresponding to the test count "12" secured in the EIS measurement situation display area 133a (second display area) of the measurement progress display screen 130a (step S33).

Further, the throughput measurement unit 18b determines whether or not the throughput value measured in step S32 exceeds a preset threshold value (step S34). Here, in a case where it is determined that the measured throughput value exceeds the threshold value, that is, "Pass" (YES in step S34), the measurement situation display control unit 13a performs control to display a determination result "Pass" as a value of the item 139 in the display area corresponding to the test count "12" of the EIS measurement situation display area 133a (step S35).

Thereafter, the control unit 11 returns to step S31 and performs controls to continue the processes in steps S31 to S34 for second and subsequent reception sensitivity tests. During the control, for example, in a case where it is determined that the throughput value measured in step S32 during an n-th reception sensitivity test is equal to or less than the threshold value, that is, "Fail" (NO in step S34), the measurement situation display control unit 13a performs control to display a determination result "Fail" as the value of the item 139 of the display area corresponding to a test count "n" of the EIS measurement situation display area 133a (step S36).

Next, the reception sensitivity test control unit 18 switches the reception sensitivity test target from the θ polarization to the φ polarization, and controls the throughput measurement unit 18b, the output level variable setting unit 18d, and the measurement situation display control unit 13a so as to execute the processes in steps S31 to S36 for the φ polarization. (step S37).

As a result, in step S37, the output level of the test signal of the φ polarization is lowered by one step from the initial output level at the measurement position PS, the test signal is transmitted from the test antenna 5 (refer to step S31), the signal under measurement transmitted by the DUT 100 that has received the test signal is received by the test antenna 5, and the throughput measurement of the signal under measurement is performed (refer to step S32).

Here, the throughput value (measured value) is displayed as the item 136 of the list display area corresponding to the test count "12" of the EIS measurement situation display area 133a of the measurement progress display screen 130a. At this time, polarization of the item 135 is switched to a display of Phi indicating the φ polarization.

Further, it is determined whether or not the measured throughput value exceeds the threshold value (refer to step S34). Here, in a case where "Pass" is determined based on a fact that the throughput value exceeds the threshold value, the determination result "Pass" is displayed as the value of the item 139 of the display area corresponding to the test count "12" of the EIS measurement situation display area 13d (step S35).

Thereafter, the same processes as in steps S31 to S34 are performed for the second and subsequent reception sensitivity tests. During the period, for example, in a case where "Fail" is determined based on a fact that the throughput value measured in the n-th reception sensitivity test is equal to or less than the threshold value, the determination result "Fail" is displayed as the value of the item 139 of the display area corresponding to the test count "n" of the EIS measurement situation display area 133a (step S36).

In the process so far, the reception sensitivity test of the θ polarization in steps S31 to S36 is performed a plurality of times until the measured value of the throughput is determined to be "Fail", subsequently, the reception sensitivity test of the φ polarizations in step S37 is performed a plurality of times, and the measured value of the throughput is determined to be "Fail" at a certain time, so that the reception sensitivity test of the φ polarization is completed.

Subsequently, the measurement situation display control unit 13a updates and displays the value (EIS (Total)) of the item 133 corresponding to the index number of the EIS-CDF measurement situation display area 132a of the measurement progress display screen 130a at this time (step S38).

Here, the measurement situation display control unit 13a has a control function of calculating and displaying, as EIS (Total), an immediately before average value of the EIS value of the θ polarization and the EIS value of the φ polarization, in which the measured value of the throughput is determined as "Fail", for each measurement position PS.

After updating and displaying EIS (Total) in step S38, control is performed to complete a series of measurement situation display processing operation. In a case where the measurement situation display processing operation is completed, the value (EIS (Total)) of the item 133 of the EIS-CDF measurement situation display area 132a is changed and displayed from "measuring" indicating that the measurement is in progress to a value (the average value of the EIS values of the θ polarization and the φ polarization) of the output level of the test signal in a case where it is determined that the throughput value in an immediately before reception sensitivity test is "Pass".

The measurement device 1 according to the present embodiment reduces the number of reception sensitivity tests by non-linearly controlling the output level of the test signal in addition to performing the beam peak search based on the Coarse & fine grid measurement, so that effects of shortening measurement time according to the reduction in the number of reception sensitivity tests can be expected by simply adopting the existing Coarse & fine grid measurement, compared to a device according to the related art that linearly controls the output level of the test signal.

To give a detailed example, for example, as described in a column of Coarse & Fine Peak Search in a table diagram shown in FIG. 16, in the measurement device 1 according to the present embodiment, the beam peak search by the Coarse & fine grid measurement and the non-linear control of the output level of the test signal in the reception sensitivity test are used together. Therefore, in a case where linear control is performed on the output level of the test signal, a time longer than 1.5 days is required, but it is confirmed that the time is shortened to 5 hours. As another verification result, as described in a column of Default Peak Search in the table diagram shown in FIG. 16, in the device according to the related art which does not adopt Coarse & fine grid measurement, time longer than 3 days is required in a case where linear control is performed on the output level of the test signal, and the time is shortened up to 10 hours even in a case where the control is switched to the non-linear control.

Further, the above embodiment discloses a system configuration example in which the integrated control device 10 is provided outside the measurement device 1. However, the present invention may have a configuration in which the measurement device 1 is provided with a control function of the integrated control device 10. This configuration can be similarly applied to each of the embodiments which will be described below.

As described above, in the measurement device 1 according to the present embodiment including a DUT scanning mechanism 56 (positioner) that is provided in an internal space 51 of an OTA chamber 50, a DUT scanning control unit 16 that executes, with respect to the positioner, first rotation control that causes the DUT 100 to sequentially face a first orientation (PSa) regulated by a predetermined step interval of a spherical coordinate system and second rotation control that causes the DUT 100 to sequentially face a second orientation (PSb) regulated by a step interval finer than the predetermined step interval, an integrated control device 10 that measures reception power by receiving a radio signal from the DUT 100, using a test antenna 5 in the internal space 51 for each of the first orientation and the second orientation, and a peak power measurement control unit 19 that measures the maximum reception power as peak power based on the measured reception power. The integrated control device 10 includes a reception sensitivity test control unit 18 that repeatedly performs a reception sensitivity test of transmitting a test signal from the test antenna 5 and measuring a throughput based on a signal under measurement by receiving the signal under measurement, which is transmitted from the DUT 100 that has received the test signal, for each of the first orientation and the second orientation while changing an output level of the test signal non-linearly, and calculates reception sensitivity when the measured throughput satisfies a predetermined throughput measurement end condition. The peak power measurement control unit 19 includes a peak power candidate selection unit 19b that selects, as a peak power candidate, the first orientation having the reception power within a range of a predetermined power width (ΔPw) from the maximum reception power among the reception power measured for each first orientation, and a peak power determination unit 19c that measures the reception power for each second orientation by executing the second rotation control on a region within a predetermined range around the first orientation corresponding to each peak power candidate, and determines the peak power based on a measurement result.

With the configuration, in the measurement device 1 according to the present embodiment, based on coarse measurement for each predetermined step and a so-called Coarse & fine grid measurement for measuring a peak power value of the DUT 100 in two steps of fine measurement for each step finer than the predetermined step, after selecting the reception power within the range of the predetermined power width from the reception power obtained by the coarse measurement as the peak power candidate, the peak power is measured for each fine step while targeting the peak power candidate, so that the peak power missed in the coarse measurement can be reliably searched for in the fine measurement, and the measurement accuracy of the peak power can be improved. Further, in addition to an effect of shortening measurement time by the Coarse & fine grid measurement, an effect of shortening time for the reception sensitivity test performed while changing the output level of the test signal non-linearly can be expected, so that the measurement time can be shortened.

Further, the measurement device 1 according to the present embodiment further includes a DUT scanning control table 16a that holds each data of a first grid pattern that regulates the first orientation and a second grid pattern that regulates the second orientation, and the DUT scanning control unit 16 executes the first rotation control and the second rotation control, respectively, based on the first grid pattern and the second grid pattern.

With the configuration, the measurement device 1 according to the present embodiment can easily execute two-step measurement including the coarse step and the finer step, based on each data of the first grid pattern and the second grid pattern held by the DUT scanning control table 16a.

Further, in the measurement device 1 according to the present embodiment, the first grid pattern and the second grid pattern are any of a constant angular distance (constant step) type in which each of angular distances of the first orientation and the second orientation is constant, or a constant density type in which each of densities of the first orientation and the second orientation is constant.

With the configuration, the measurement device 1 according to the present embodiment can easily realize measurement in an operation mode desired by a user by selectively using the grid pattern of the Constant Step type or the Constant Density type.

Further, in the measurement device 1 according to the present embodiment, the throughput measurement end condition is obtained by determining that the measured throughput falls below a predetermined threshold value for the first time while repeatedly executing a setting for sequentially reducing a step of the output level of the test signal, and the reception sensitivity test control unit 18 detects, as the reception sensitivity, an output level immediately before the output level in a case where the determination is obtained.

With the configuration, the measurement device 1 according to the present embodiment can correctly detect the output level immediately before the output level of the test signal which satisfies the throughput measurement end condition as the reception sensitivity.

Second Embodiment

A measurement device according to a second embodiment (referred to as a measurement device 1A for convenience) is based on the beam peak search using the Coarse & fine grid measurement and is common with the measurement device 1 according to the first embodiment in a fact of having a function of selecting the peak power candidates with a margin on the beam, which is measured in the beam peak search based on the Coarse grid, to an area where the power width ΔPw is low, and having a reception sensitivity test function by the non-linear control performed on the output level of the test signal. In order to realize the measurement device, a basic configuration of the measurement device 1A according to the present embodiment is the same as in the measurement device 1 according to the first embodiment (refer to FIG. 3).

The difference between the measurement device 1A according to the present embodiment and the measurement device 1 according to the first embodiment is that a Constant Density type is adopted as the grid type which is applied to the Coarse & fine grid measurement.

Figure 17:
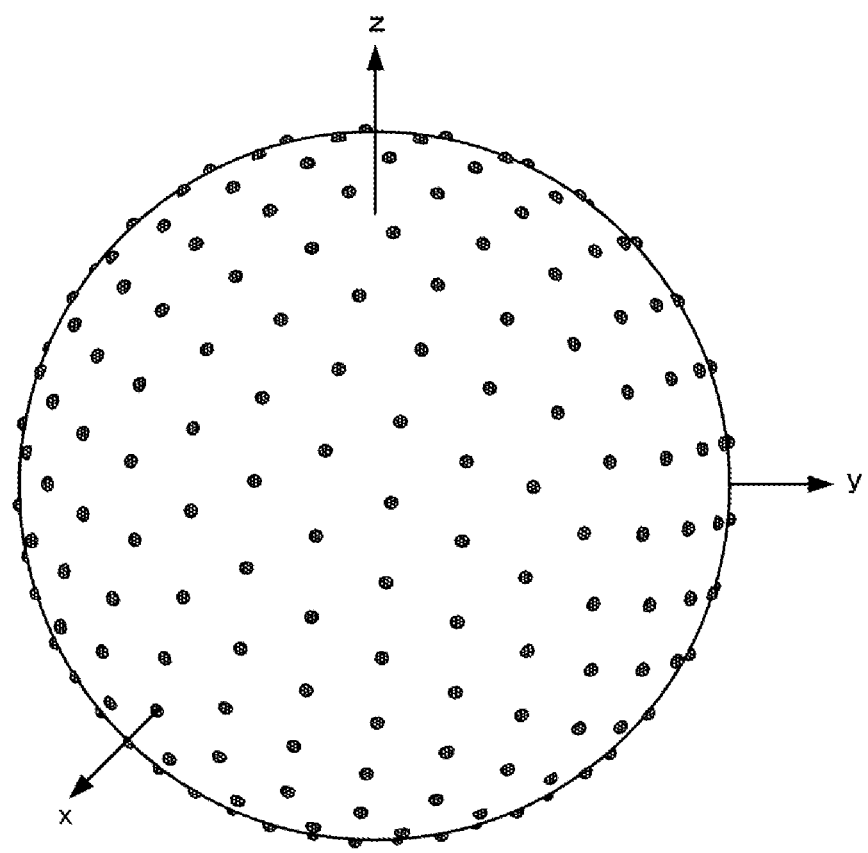
FIG. 17 is a diagram showing a disposition mode of angular sample points PS corresponding to a Constant Density type Coarse grid in a spherical coordinate system used for a total spherical scanning of a DUT in an OTA chamber of a measurement device according to a second embodiment of the present invention.
Figure 18:
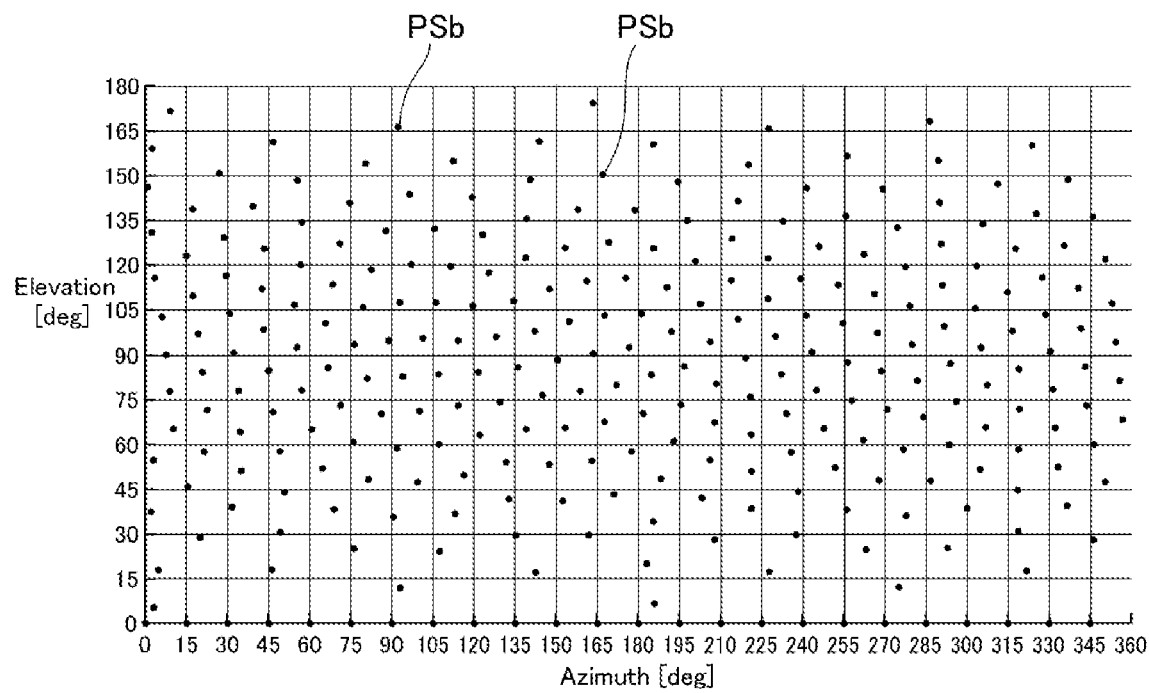
FIG. 18 is a graph showing a disposition mode of a measurement position PSa by a Constant Step type Coarse grid used in the measurement device according to the second embodiment of the present invention.

Specifically, the Coarse grid regulates the disposition of the measurement position PS according to an aspect shown in FIG. 17, on the premise of, for example, the spherical coordinate system shown in FIG. 5A. For example, as shown in the graph of FIG. 18, the DUT scanning control unit 16 uses the Coarse grid to realize rotation control (first rotation control) via the measurement position PSa having a separation interval of predetermined density in the roll direction and the azimuth direction.

Figure 19:
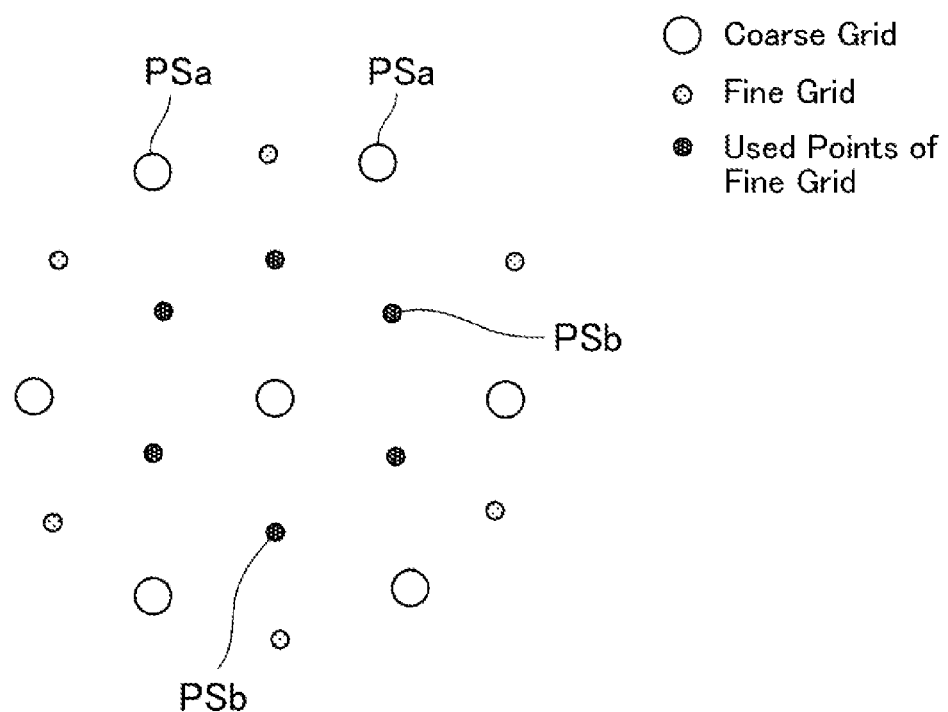
FIG. 19 is a diagram showing a disposition mode of a measurement position PSb by a Constant Step type Fine grid used in the measurement device according to the second embodiment of the present invention.

On the other hand, the Fine grid regulates, for example, the disposition of the measurement position PS disposed at a higher density as shown in FIG. 19. The DUT scanning control unit 16 uses the Fine grid to further realize rotation drive via the measurement position PSb, which is disposed in the roll direction and the azimuth direction at a finer density than the Coarse grid. In FIG. 19, a large white circle represents the measurement position PSa corresponding to the Coarse grid, and a small shaded circle represents the measurement position PSb corresponding to the Fine grid.

Similar to the measurement device 1 according to the first embodiment, the measurement device 1A according to the present embodiment can execute the beam peak search control according to the flowchart shown in FIG. 8. That is, in the measurement device 1A, first, the EIS measurement (first EIS measurement) in each orientation based on the Coarse grid is performed along the flowchart shown in FIG. 8 (refer to step S3), thereafter, the peak power candidate is selected (refer to step S4), and the EIS measurement (second EIS measurement) in each orientation within a specific range based on the Fine grid is performed (refer to step S5).

In any case of the first EIS measurement and the second EIS measurement, the reception sensitivity test of the DUT 100 is performed in advance (refer to steps S3 and S5). Each EIS value is obtained based on a test result of the reception sensitivity test.

After the first EIS measurement is performed for each orientation corresponding to the Coarse grid, some orientations, which become peak power candidates, are selected from the reception power of the radio signal, which is measured by the reception sensitivity test related to the first EIS measurement, from the DUT 100 (refer to step S4), and, from the peak power candidates, the maximum reception power measured by the reception sensitivity test related to the second EIS measurement for each orientation corresponding to the Fine grid and an orientation corresponding to the maximum reception power are detected (measured) as the beam peak (step S6).

A measurement device 1B according to the present embodiment has a different grid type (Constant Density type) from the measurement device 1A according to the first embodiment, but has the same control function of reducing the number of reception sensitivity tests by controlling the output level of the test signal non-linearly in addition to performing the beam peak search based on Coarse & fine grid measurement as in the measurement device 1A according to the first embodiment. As a result, the measurement device 1B according to the present embodiment can obtain the same action and effect as the measurement device 1A according to the first embodiment.

The effect of shortening the measurement time in the measurement device 1 according to the present embodiment will be described with reference to FIG. 20. In the measurement device 1 according to the present embodiment, as described in a column of Coarse & FinePeak Search in a table diagram shown in FIG. 20, the beam peak search by the Constant Density-type Coarse grid and the measurement using the Fine grid measurement using and the non-linear control of the output level of the test signal in the reception sensitivity test are used together, so that it is confirmed that time is shortened to 5 hours although time over one day is required in a case where the output level of the test signal is controlled linearly. Further, as described in a column of Default Peak Search in the table diagram shown in FIG. 20, in a device according to the related art which does not adopt such a kind of Coarse & fine grid measurement, it is confirmed that time over 2 days is required in a case where the output level of the test signal is controlled linearly and time is shortened to 9 hours even in a case where the control is switched to non-linear control.

Third Embodiment

Figure 21:
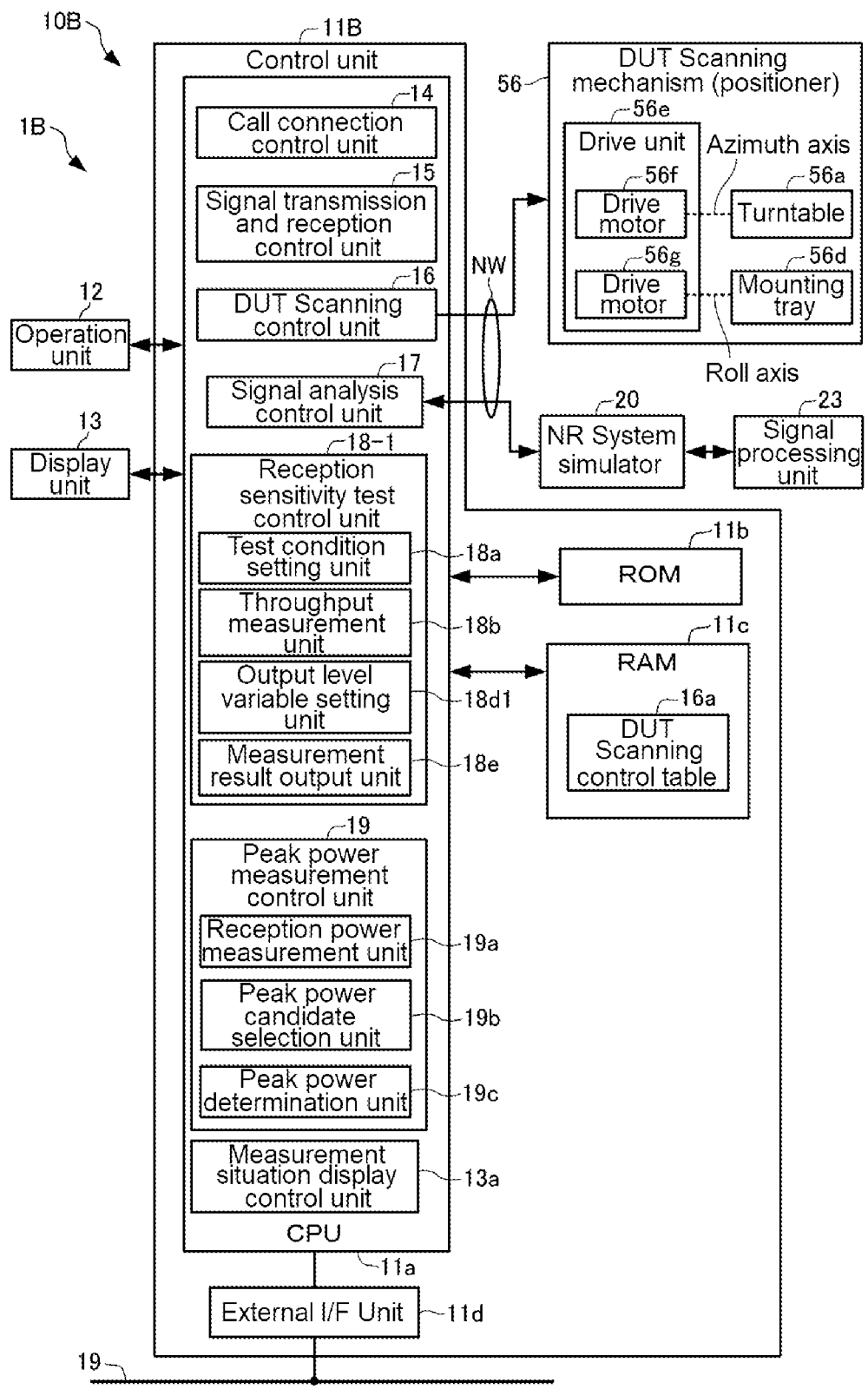
FIG. 21 is a block diagram showing functional configurations of an integrated control device and a controlled element thereof in a measurement device according to a third embodiment of the present invention.

FIG. 21 is a block diagram showing functional configurations of an integrated control device 10B and a controlled element thereof in a measurement device 1B according to a third embodiment of the present invention. In the integrated control device 10B, components having the same function as the integrated control device 10 (refer to FIG. 3) of the measurement device 1 according to the first embodiment are designated by the same reference numerals. In the integrated control device 10B, a control unit 11B is different from the control unit 11 according to the first embodiment in a point of having a reception sensitivity test control unit 18-1 instead of the reception sensitivity test control unit 18 according to the first embodiment and the second embodiment, and has the same configuration as in the control unit 11 for other parts. The reception sensitivity test control unit 18-1 constitutes reception sensitivity test execution means of the present invention.

In the measurement device 1B, the control unit 11B has a peak power measurement control unit 19 similar to the control unit 11 according to the first embodiment and the second embodiment, and has a configuration capable of executing the beam peak search control equivalent to the measurement device 1 according to the first embodiment or the measurement device 1B according to the second embodiment.

Further, the measurement device 1B according to the present embodiment has a configuration in which the reception sensitivity test control unit 18-1 is provided in the control unit 11B of the integrated control device 10B, and thus it is possible to perform the reception sensitivity test different from the measurement device 1 according to the first embodiment or the measurement device 1B according to the second embodiment. Hereinafter, a configuration and a control operation for the reception sensitivity test of the measurement device 1B according to the present embodiment will be described.

In the measurement device 1B according to the present embodiment, as shown in FIG. 21, the reception sensitivity test control unit 18-1 includes a test condition setting unit 18a, a throughput measurement unit 18b, an output level variable setting unit 18d1, and a measurement result output unit 18e. The output level variable setting unit 18d1 constitutes output level setting means of the present invention.

The test condition setting unit 18a is a functional unit for setting a test condition of the reception sensitivity test. In the present embodiment, the test condition set by the test condition setting unit 18a includes an initial step level SL0, a starting output level OL0, an error tolerance level (error tolerance of boundary level) EL, and a connection drop determination threshold value (connection drop threshold) DT, and the like. The initial step level SL0 indicates an initial value of a step variation range of an output level of the test signal which is changed stepwise in a case of the reception sensitivity test. The starting output level OL0 indicates an output level of the DUT 100 (an output level in a case of first transmission and reception) in a case of starting the reception sensitivity test. The error tolerance level EL indicates an output level of a predetermined test signal for determining whether or not to continue the reception sensitivity test on a next output level. The connection drop determination threshold value DT is a set value of a bottom value which causes drop of call connection (call drop) in a case where a value is lower than the connection drop determination threshold value. In an algorithm shown in FIG. 21, the output level is lowered by a large step. Therefore, in a case where the process proceeds any further, call drop occurs, so that a threshold value which does not lower the output level is necessary. The value can be preset by the user.

The throughput measurement unit 18b is a functional unit for measuring a throughput related to reception capacity of the DUT 100 for each reception sensitivity test. In the present embodiment, for example, a configuration may be provided in which the throughput measurement unit 18b transmits a transmission rate to the DUT 100 in accordance with the transmission of the test signal, and, thereafter, the DUT 100 measures the throughput from the received transmission rate in accordance that a reception result (received transmission rate) of the test signal is notified to the NR system simulator 20.

The output level variable setting unit 18d1 is a functional unit for, according to a comparison result between a measurement result of the throughput by the throughput measurement unit 18b and a predetermined threshold value (throughput threshold value) set in advance, performing variable setting so that the output level of the test signal in the next reception sensitivity test is in an ascending or descending direction, that is, the output levels of the test signals between the reception sensitivity tests corresponding to before and after number of times become different.

The measurement result output unit 18e is a functional unit for proceeding to the next reception sensitivity test (throughput measurement) in a case where a test result variation range between a test result (measurement result of the throughput) of a current reception sensitivity test using the test signal, which has an output level after the variable setting, and a test result of a previous reception sensitivity test exceeds a range of a variation range (EL) set by the test condition setting unit 18a, and outputs the test result in a case where the test result variation range is in the variation range (EL).

Hereinafter, a variable setting control operation of the output level of the test signal related to the reception sensitivity test of the DUT 100 by the integrated control device 10B of the measurement device 1B according to the present embodiment will be described with reference to a flowchart shown in FIG. 22.

In a case where the reception sensitivity test of the DUT 100 starts, first, the reception sensitivity test control unit 18-1 in the control unit 11B of the integrated control device 10B sets a test condition (step S41). Specifically, the test condition setting unit 18a sets, for example, each of values of the initial step level SL0, the starting output level OL0, the error tolerance level EL, and the connection drop determination threshold value DT, which are described above, by receiving an operation input in the operation unit 12.

Setting content in step S41 assumes an operation of starting first throughput measurement from a state in which the DUT 100 is operated at the starting output level OL0, measuring the throughput at the output level obtained by lowering the variation range by a width of an initial step level from the previous output level from the next output level, and ending the measurement by determining a state in which a step level SL(n) of the test signal becomes equal to or less than the error tolerance level EL in an n-th measurement while repeatedly performing a process of lowering the output level of the test signal (refer to the output level down processes (A) and (B)) in a case where the measured throughput is larger than the threshold value (throughput threshold value) and a process of raising the output level of the test signal (refer to the output level up processes (A) and (B)) in a case where the throughput is equal to or larger than the throughput threshold value.

As the starting output level OL0 and the initial step level SL0, for example, −60 dBm and 20 dB are assumed, respectively. The error tolerance level EL is assumed to be, for example, 1.0 dB. The connection drop determination threshold value DT is assumed to be, for example, −90 dBm.

After the setting of the test condition in step S41 is completed, the reception sensitivity test control unit 18-1 of the integrated control device 10B increments the number of measurements n by +1 (step S42), and performs a process of setting a parameter related to the N-th measurement and reading a value of the output level OL set in, for example, step S47 (including steps S47a, S47b, and S47c) or step S48 (including steps S48a, S48b, and S48c) therebefore (step S43). Subsequently, the reception sensitivity test control unit 18-1 performs control to perform the n-th measurement related to the throughput of the DUT 100 while transmitting the test signal based on the parameter, which is set in step S43, related to the measurement (step S44).

As a specific example of the control in steps S43 and S44 (throughput measurement control), the reception sensitivity test control unit 18-1 sets, as the parameter related to a first measurement, for example, the starting output level OL0 based on the setting of the test condition in step S41, and performs the throughput measurement while driving and controlling the DUT 100 at the starting output level OL0 (step S44).

Next, the reception sensitivity test control unit 18-1 checks whether or not a step level interval with respect to the previous throughput measurement related to the current throughput measurement, that is, the step level SL(n) is larger than the error tolerance level EL which is set in step S41 (step S46). In a case where it is determined that the step level SL(n) is larger than the error tolerance level EL (YES in step S46), the reception sensitivity test control unit 18-1 proceeds to step S47 and continues the throughput measurement and step level search control. As described above, a first throughput measurement is started from the transmission of the test signal at the starting output level OL0, and there is no variation range of SL with respect to the previous measurement, so that the process of step S46 is skipped and the process proceeds to step S47.

In step S47, the reception sensitivity test control unit 18-1 compares the throughput of the DUT 100, which is measured in step S44, with a preset throughput threshold value set, and determines whether or not the throughput is equal to or larger than the throughput threshold value. Here, setting is performed so that the throughput threshold value is 95%, the throughput which is equal to or larger than 95% is in a permissible range "PASS", and the throughput which is lower than 95% is out of the permissible range "FAIL".

Here, in a case where it is determined that the throughput is equal to or larger than the throughput threshold value ("PASS" state in step S47), the reception sensitivity test control unit 18-1 executes a process of gradually lowering the output level of the DUT 100 (step S47).

Figure 23A:
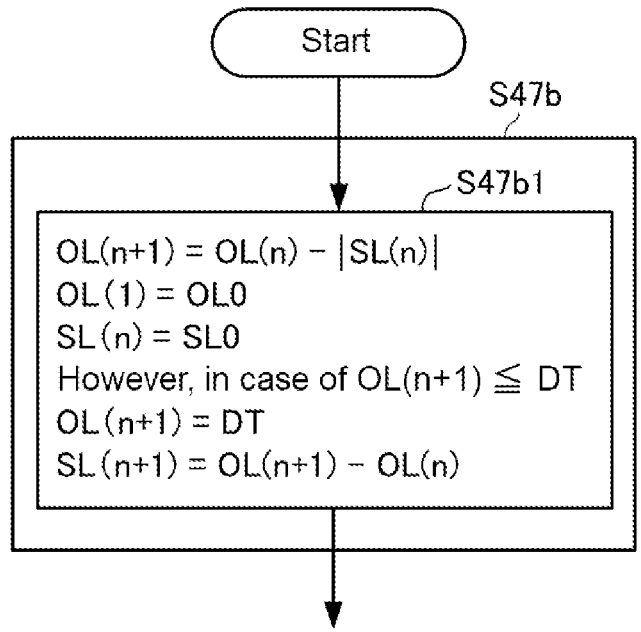
FIGS. 23A and 23B are flowcharts showing details of a level down process of a step level in step S47 of FIG. 22.

In step S47, the reception sensitivity test control unit 18-1 first determines whether or not before FAIL (step S47a). In a case where it is determined to be before FAIL (YES in step S47a), the reception sensitivity test control unit 18-1 executes an OL level (output level) down process (A) (step S47b). As shown in FIG. 23A, in the OL level down process (A), a process (step S47b1) of lowering an output level by a step of the initial step level SL0 from a previous OL(OL(n)) is executed on a next output level OL(n+1). As the first output level OL(1), setting is performed so that OL(1)=OL0.

Figure 23B:
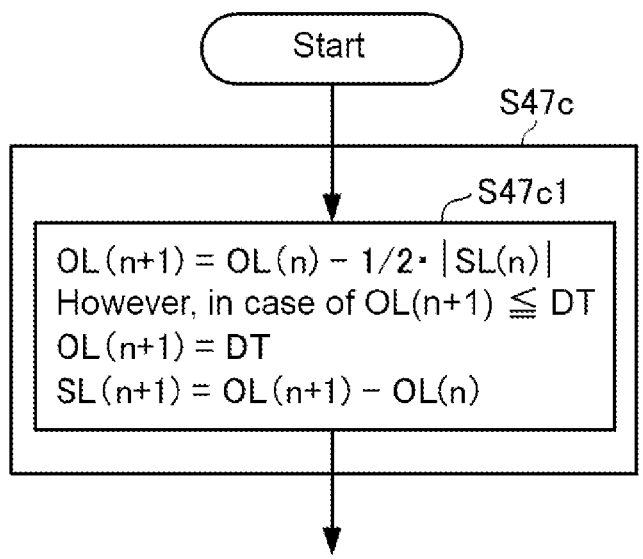

Further, in a case after it is determined to be FAIL in advance (NO in step S47a) in step S47, the reception sensitivity test control unit 18-1 executes the OL level down process (B) (step S47c). As shown in FIG. 23B, in the OL level down process (B), a process (step S47c1) of lowering the output level by a step (½·SL(n)) which is ½·(half) of the previous step level SL(n) from the previous OL(n) is executed on the output level OL(n+1) used in the next throughput measurement.

In the OL level down process (A) (step S47b) and the OL level down process (B) (step S47c), a process is executed together of determining whether or not to adopt the value in a next step according to the determination result of the connection drop determination threshold value DT.

After step S47b or step S47c, the reception sensitivity test control unit 18-1 increments the number of measurements n by +1 (step S42), and sets and reads the parameter related to the n-th measurement (step S43). As a result, after step S47b, a step level that is sequentially halved as the number of measurements n increases is set. After step S47c, the throughput measurement is performed n times in order based on the test signal having the output level set in a case where the number of measurements N increases.

On the other hand, in a case where it is determined that the throughput (measurement value) is equal to or less than the throughput threshold value (in a state of "FAIL" in step S46) in step S46, the reception sensitivity test control unit 18-1 executes a process of raising the output level of the test signal (step S48).

Figure 24A:
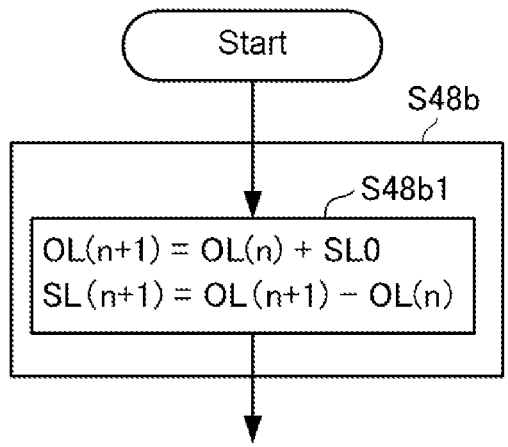
FIGS. 24A and 24B are flowcharts showing details of a level up process of a step level in step S48 of FIG. 22.

In step S48, the reception sensitivity test control unit 18-1 first determines whether or not the previous output level is also FAIL (step S48a). Here, in a case where it is determined that the previous output level is also FAIL (YES in step S48a), the reception sensitivity test control unit 18-1 executes the OL level up process (A) (step S48b). As shown in FIG. 24A, in the OL level up process (A), a process (step S48b1) of raising the output level by the step of the step level SL0 is executed on the previous OL(n). For example, in a case where the output level at the start is FAIL, the OL level up process (A) is performed until becoming PASS.

Figure 24B:
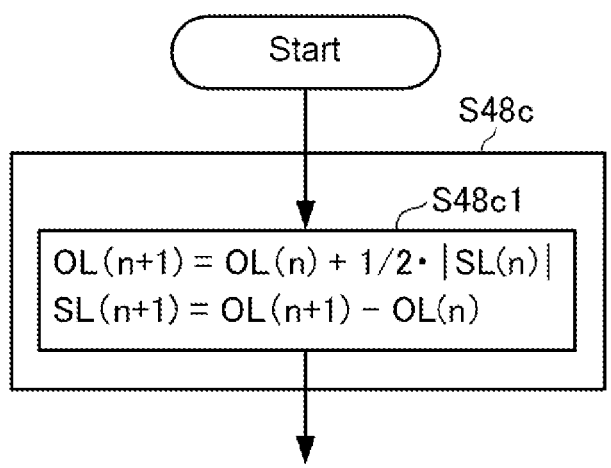

Further, in step S48, in a case where it is determined that the previous output level is not FAIL (NO in step S48a), the reception sensitivity test control unit 18-1 executes an OL level up process (B) (step S48c). As shown in FIG. 24B, in the OL level up process (B), a process of increasing a value of half the previous step level SL(n) to the previous output level OL(n) is executed (step S48c1).

After step S48b or step S48c is executed, the reception sensitivity test control unit 18-1 increments the number of measurements n by +1 (step S42), and then sets and reads the parameter related to the n-th measurement (step S43). As a result, after step S48b or step S48c, the throughput measurement is performed n times in order based on the test signal having the output level set in a case where the number of measurements n increases.

After the n-th throughput measurement is executed in step S44, it is checked whether or not the step level SL(n) related to the throughput measurement of the DUT 100 is larger than the error tolerance level EL set in step S1 (step S46). Here, in a case where it is determined that the step level SL(n) is equal to or less than the error tolerance level EL (NO in step S46), the reception sensitivity test control unit 18-1 stops the throughput measurement and a step level search (step S49), and, thereafter, ends a series of measurement operations. The number of throughput measurements is set to N times in a case where the measurement operation ends, and the lowest value of the output level values determined to be PASS from the first to N-th measurements is displayed on the display unit 13 as the measurement result of the minimum reception sensitivity. Alternatively, a last value of the output level determined to be PASS may be used as reception sensitivity.

Figure 22:
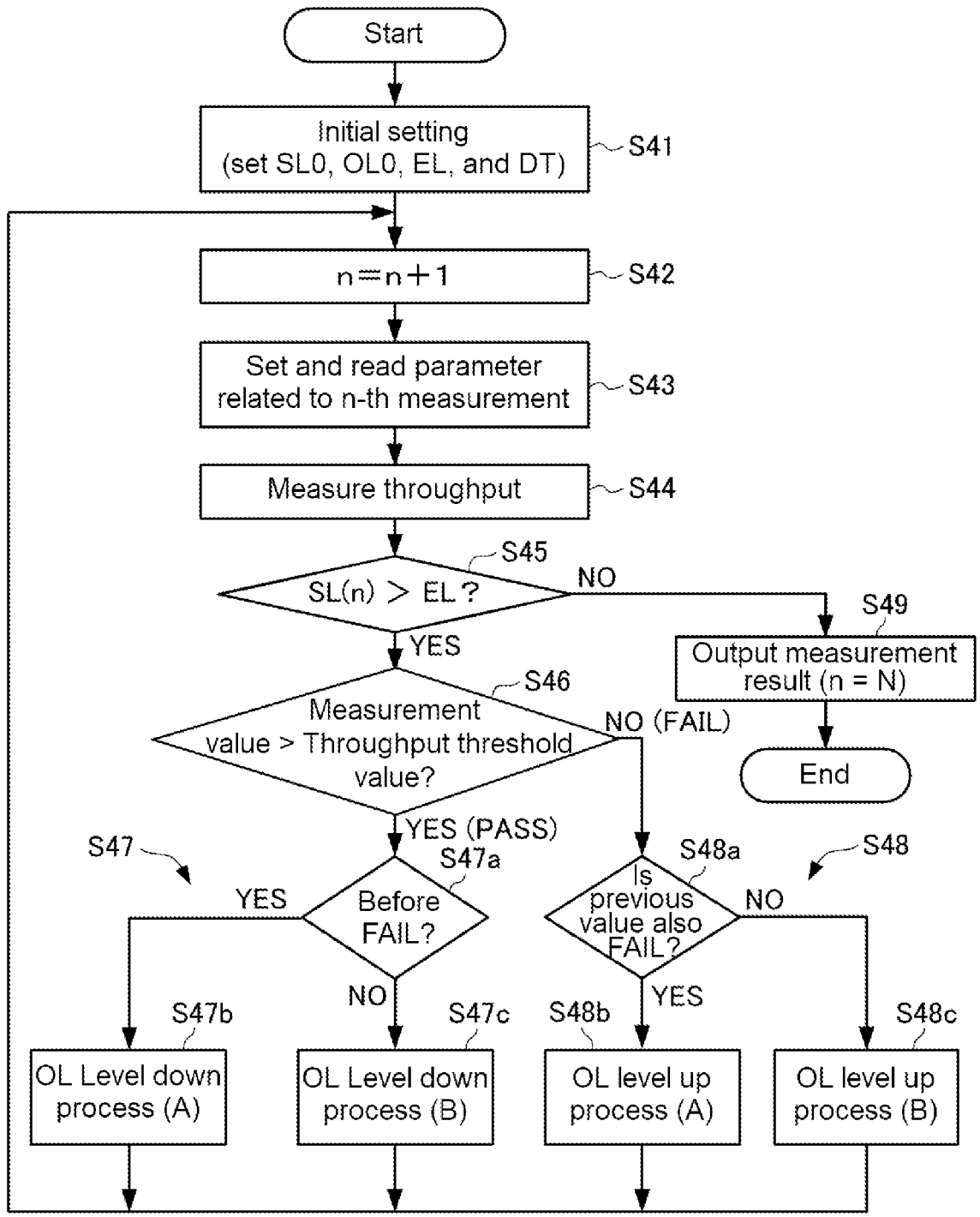
FIG. 22 is a flowchart showing a variable setting control operation of an output level of a test signal according to a reception sensitivity test of the DUT by the measurement device according to the third embodiment of the present invention.

According to a series of measurement controls shown in FIG. 22, in a case where the throughput measurement is performed N times with respect to the DUT 100, the step level SL(n) becomes small as the number of measurements increases, and the measurement ends in a case where the step level SL(n) converges to be equal to or less than the error tolerance level EL set in advance. Further, for the variation direction of the output level, the direction changes in one direction toward a lowering direction while the test result of the reception sensitivity test exceeds a predetermined threshold value (throughput threshold value), and the direction changes in both an upward and a downward directions after the test result is lower than the throughput threshold value.

FIG. 25 shows a data example of a parameter related to the output level of a variable test signal, which is set according to the number of measurements by the variable setting control of the output level based on the flowchart shown in FIG. 22 by the measurement device 1 according to the present embodiment. The example of FIG. 25 shows, for example, with respect to each of the total seven measurements, a relationship of the output level of the test signal of each time, the measured throughput, the variation range of the output level between the previous measurement and the current measurement, a type of a process of setting the next output level, and the next output level of the test signal.

Figure 26:
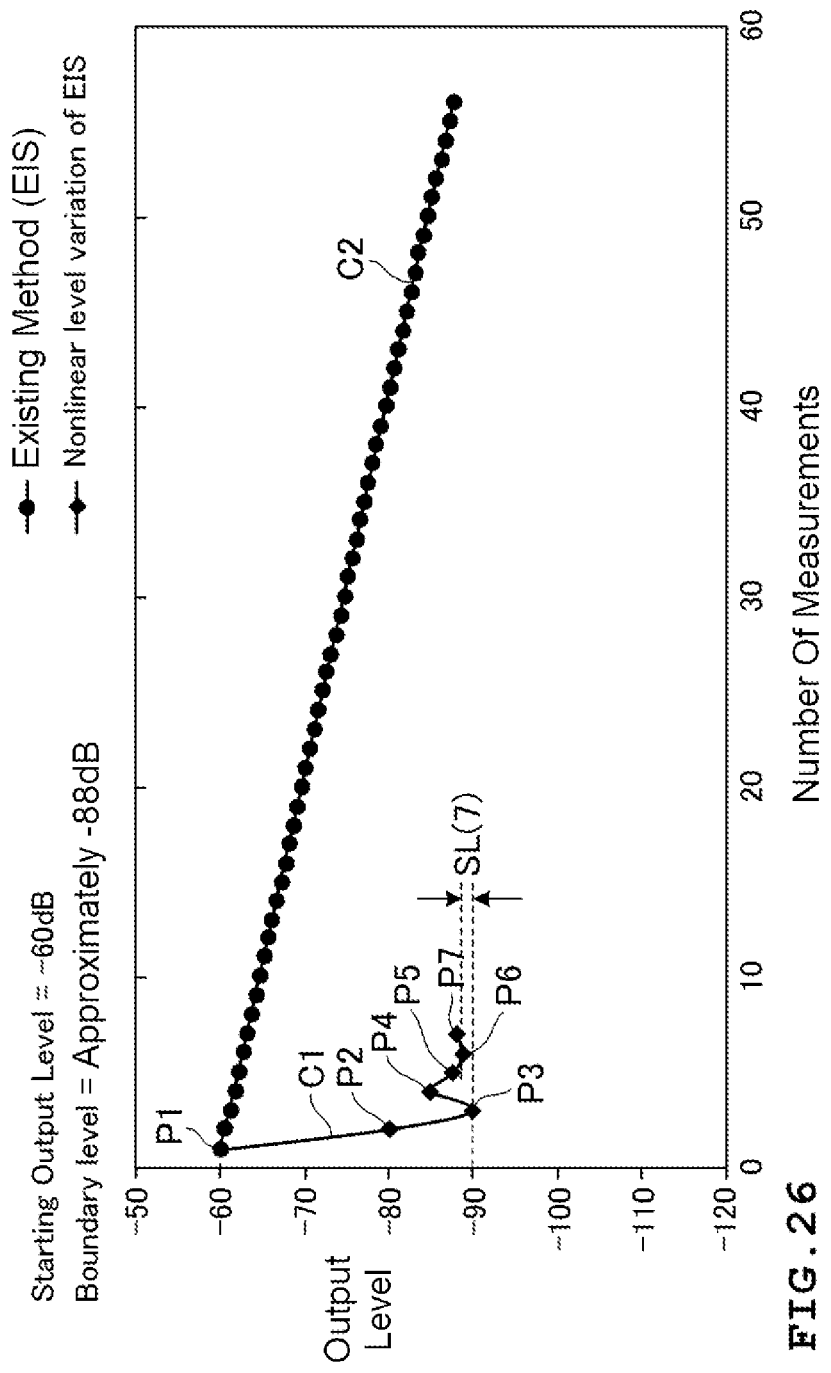
FIG. 26 is a diagram showing characteristics of the output level of the test signal with respect to the number of measurements based on the data example shown in FIG. 25 according to the reception sensitivity test of the DUT in the measurement device according to the third embodiment of the present invention.

FIG. 26 is a diagram showing a characteristic C1 of the output level of the test signal with respect to the number of measurements related to the reception sensitivity test of the DUT 100 by the measurement device 1 according to the present embodiment. The characteristic C1 is specifically based on the data example shown in FIG. 25. That is, in FIG. 26, the characteristic C1 gives an example in which the throughput measurements (output level variable setting), which are indicated by reference numerals P1 to P7, are performed a total of seven times and the reception sensitivity test ends. More specifically, in the characteristic C1, setting is performed such that the initial step level SL0=−20 dB (SL(1)=SL0), the starting output level OL0=−60 dB (OL(1)=OL0), the DT is −90 dB, and the error tolerance level EL=1.0 dB. In the first throughput measurement, the test of the DUT 100 starts with the output level OL(1)=−60 dB. Since the throughput measured at this time is higher than the throughput threshold value and is determined to be in the permissible range "PASS", a next second output level OL(2) becomes −80 dB by the level down process (A).

In a second throughput measurement, the throughput value is determined to be PASS with respect to the output level, which is −80 dB, of the DUT 100, so that the next output level is set by the level down process (A). Here, a value of −100 dB is calculated, but, in a case where a set value of the output level is equal to or less than a value of the connection drop determination threshold value DT, the value of the connection drop determination threshold value DT is set. Therefore, a next third output level OL(3) becomes −90 dB.

In a third throughput measurement, the throughput value is equal to or less than the throughput threshold value with respect to the output level, which is −90 dB, of the DUT 100, so that it is determined to be out of the permissible range "FAIL". Therefore, a next output level is set by the level up process (B). A variation range of 10 dB between the second and third output levels is set to SL(3), and −85 dB obtained by adding 5 dB, which is half the variation range, to the third output level is set as a next fourth output level OL (4).

In the fourth throughput measurement, with respect to the output level, which is −85 dB, of the DUT 100, it is determined to be PASS in which the throughput value is in the permissible range. FAIL is already determined at the third throughput measurement, so that the next output level is set by the level down process (B). A variation range of 5 dB between the third and fourth output levels is set as SL(4), and −87.5 dB obtained by subtracting a value, which is half the variation range, from the fourth output level, is set as a next fifth output level OL(5).

In the fifth throughput measurement, the throughput value is determined to be PASS with respect to the output level of the DUT 100 which is −87.5 dB. FAIL is already determined at the third throughput measurement, so that the next output level is set by the level down process (B). A variation range between the fourth and fifth output levels is set as SL(5), and −88.7 dB obtained by subtracting a value, which is half the variation range, from the fifth output level is set as a next sixth output level OL(6).

In the sixth throughput measurement, the throughput value is determined to be FAIL with respect to the output level of the DUT 100 which is −88.7 dB. Since the previous fifth throughput measurement is determined to be PASS, the next output level is set by the level up process (B). A variation range between the fifth and sixth output levels is set as SL(6), and −88.1 dB obtained by adding a value, which is half the variation range, to the fifth output level is set as a next seventh output level OL(7).

In a seventh throughput measurement, the throughput value is determined to be FAIL with respect to the output level, which is −88.1 dB, of the DUT 100. Here, the variation range from the sixth output level, which is the previous output level, is 0.6 dB, and is determined to be within a range of the error tolerance level EL (=1.0 dB), so that the measurement ends.

FIG. 26 also discloses a characteristic C2 of a test result of a reception sensitivity test, which is performed by linearly fluctuating the output level of the DUT 100 by steps at equivalent intervals, according to the related art. According to the characteristic C2, the reception sensitivity test according to the related art requires 50 steps. On the other hand, in the measurement device 1B according to the present embodiment, as shown in the characteristic C1, it is possible to end the reception sensitivity test of the DUT 100 by only seven steps, so that it is possible to significantly reduce the measurement time.

Further, the characteristic C1 shown in FIG. 26 reflects the following characteristics related to a control operation of the reception sensitivity test of the DUT 100 in the measurement device 1B according to the present embodiment. That is, FIG. 22 shows that, in a case where the output level of the test signal at the start of the reception sensitivity test of the DUT 100 (at the start of transmission and reception of the test signal) is set to OL(1), the output level of the test signal at the end of the seventh transmission and reception is set to OL(7), and a time point, at which the measurement result of the throughput is lower than the predetermined threshold value and is determined to be FAIL, is set to a third time, the throughput measurement is repeated by repeating the level up process and the level down process while reducing the variation range of the output level of the test signal after the fourth measurement which is next to the time point at which it is determined to be FAIL, and the measurement ends in a case where a variation range SL(7) of the seventh output level is lower than the predetermined threshold value.

Figure 27:
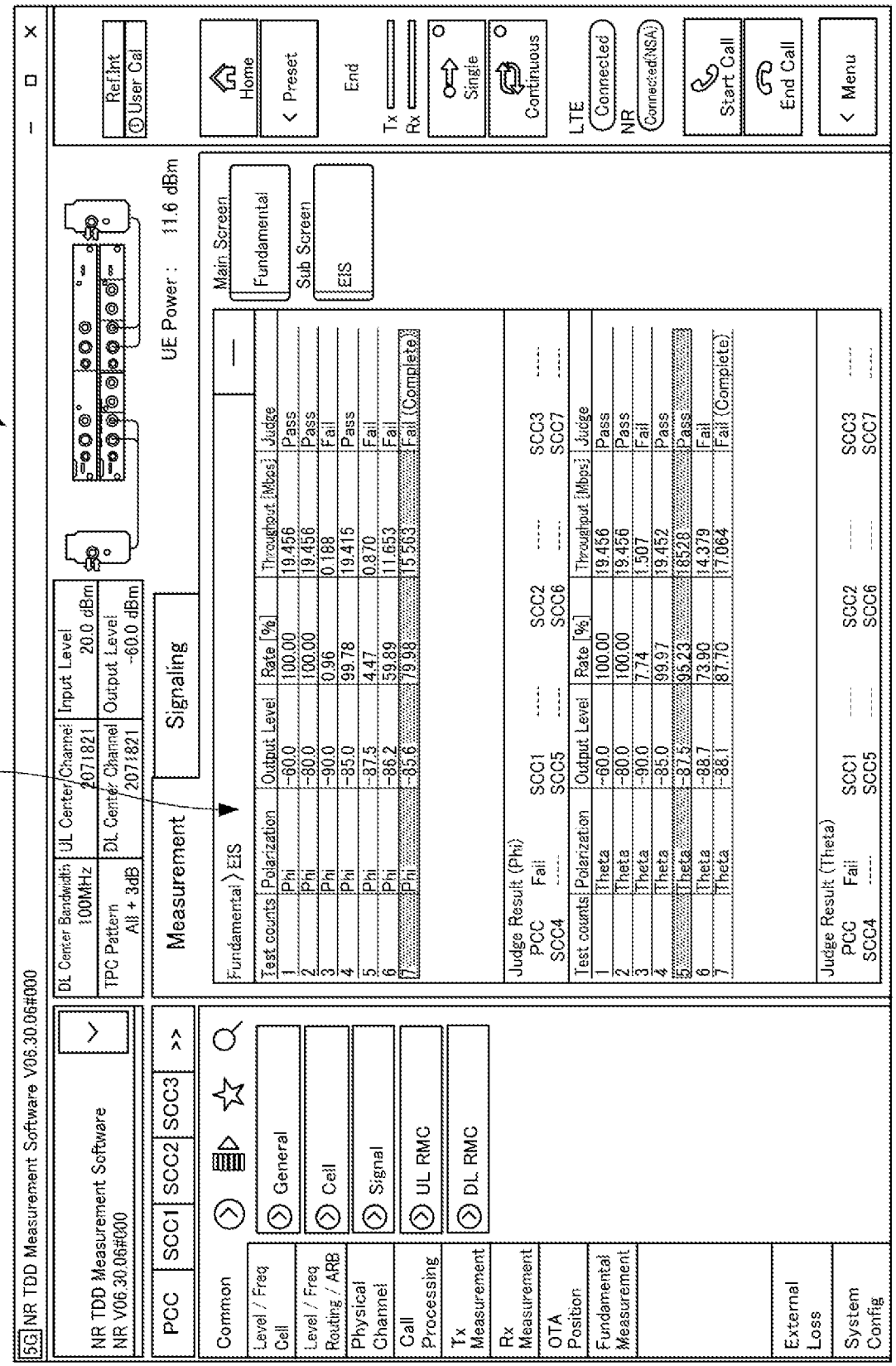
FIG. 27 is a diagram showing a display example of a reception sensitivity test result of the DUT by the integrated control device of the measurement device according to the third embodiment of the present invention.

FIG. 27 is a diagram showing a display example of the reception sensitivity test result of the DUT 100 by the measurement device 1B according to the present embodiment. While controlling the reception sensitivity test operation of the DUT 100 according to the flowchart shown in FIG. 22, the display unit 13 of the integrated control device 10B displays, for example, a main screen 130b having a screen configuration shown in FIG. 27. The main screen 130b is provided with a test result display area 131b that displays the measurement result of the throughput (reception sensitivity) of the DUT 100 according to the number of measurements. According to the measurement device 1B according to the present embodiment, in the test result display area 131b on the main screen 130b displayed on the display unit 13, for example, the measurement results of the seven times of throughput measurements shown in FIG. 26 are displayed in a mode of being arranged in chronological order according to the passage of time in a downward direction from an upper part in FIG. 26. Here, for a display mode of the reception sensitivity measurement results of the DUT 100 with respect to the test result display area 131b on the main screen 130b, the throughput measurement results (refer to FIG. 25 and FIG. 26) over seven times accompanied by variation of the step level SL of the characteristic C1 shown in FIG. 26 is displayed.

Figure 28:
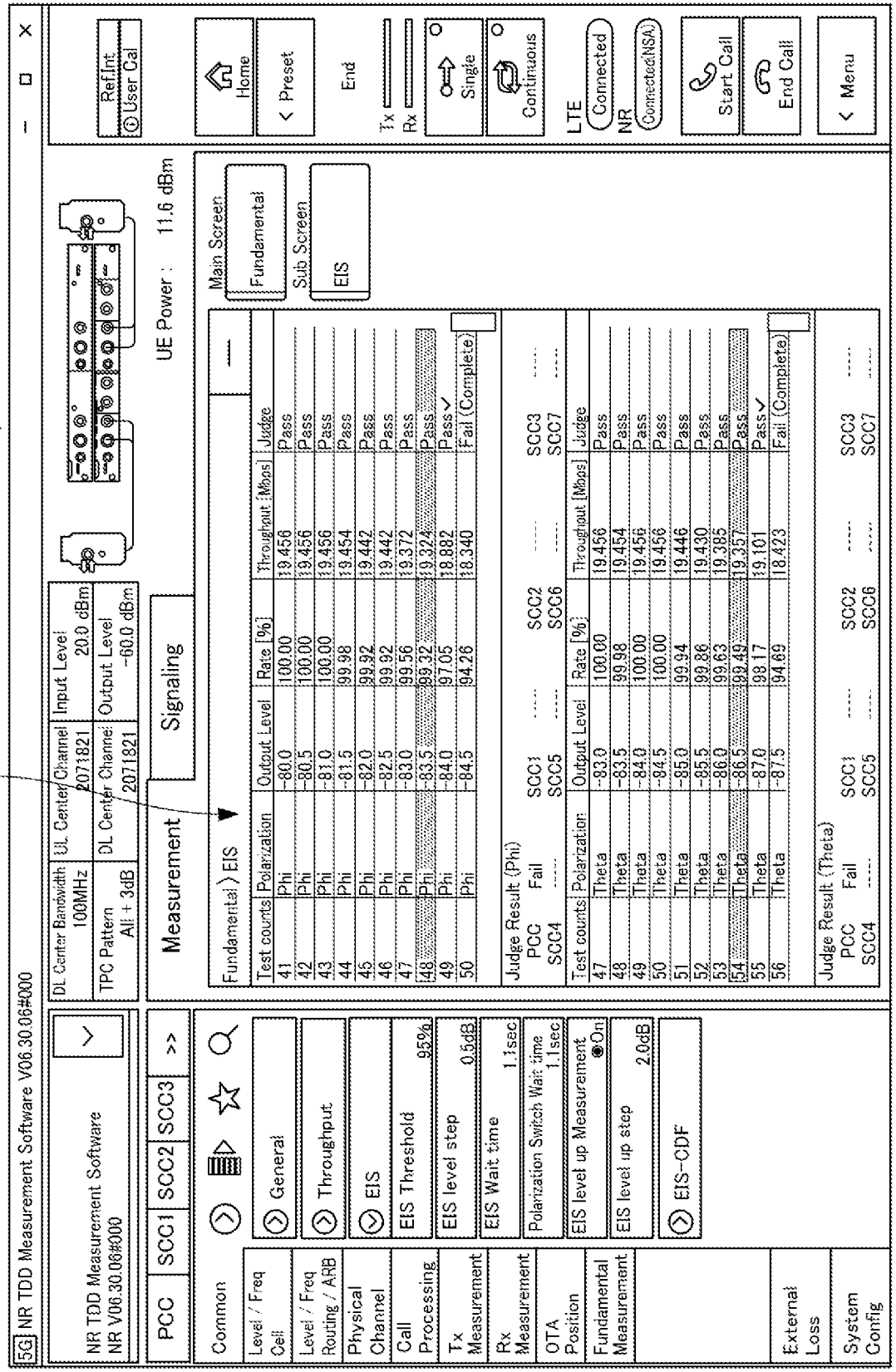
FIG. 28 is a diagram showing a display example of the reception sensitivity test result of the DUT in a device according to the related art.

FIG. 28 shows a display example of the reception sensitivity test results of the DUT 100 in a device according to the related art in order to compare with the display example of the reception sensitivity test results of the DUT 100 by the measurement device 1B according to the present embodiment. As shown in FIG. 28, in the device according to the related art, the test result display area 131b is provided on the main screen 130b displayed on the display unit while controlling the reception sensitivity test operation of the DUT 100, and the test result display area 131b is displayed with 50 times of throughput measurement results accompanied by the linear variation of the step level SL of the characteristic C2 shown in FIG. 26 and arranged in chronological order.

Comparing the display example of the reception sensitivity test results of the DUT 100 in the device according to the related art (refer to FIG. 28) with the display example of the reception sensitivity test results of the DUT 100 by the measurement device 1B according to the present embodiment (refer to FIG. 27), it can be understood that the measurement device 1B according to the present embodiment can integrally display all the small throughput measurement results by using the limited test result display area 131b.

In this way, in the measurement device 1B according to the present embodiment, the reception sensitivity test control unit 18-1 has a configuration including a test condition setting unit 18a that sets a variation width (error tolerance level EL) of an output level of a predetermined test signal in order to determine whether or not to perform the transmission and reception next time, a throughput measurement unit 18b that measures a throughput related to reception capacity of the DUT 100 for each transmission and reception, an output level variable setting unit 18d1 that sets the output level of the test signal to be different from a previous output level according to a comparison result between a measurement result of the throughput and a predetermined threshold value, and measurement result output unit 18e that continues the transmission and reception in a case where a variation width with respect to the previous output level exceeds a range of the error tolerance level EL set by the test condition setting unit 18a, and outputs a test result in a case where the variation width with respect to the previous output level is within a range of the error tolerance level EL.

With the configuration, in the measurement device 1B according to the present embodiment, the output level of the test signal is set to be different from the previous output level by causing the output level of the test signal to be down or up according to the measurement result of the throughput, so that it is possible to significantly reduce the number of executions of the transmission and reception compared to a case where the output level of the test signal is linearly changed, it is possible to set the output level of the test signal to a target level in a short time, and it is possible to efficiently execute a reception sensitivity test of the mobile terminal.

Further, in the measurement device 1B according to the present embodiment, the output level variable setting unit 18d1 sets a signal level of the test signal at the start of transmission and reception to OL(1), sets the signal level of the test signal to OL(N) at the end of the N-th transmission and reception, and performs a level up process while reducing the variation range of the output level of the test signal after a time point at which the measurement result of the throughput is lower than the predetermined threshold value and is determined to be FAIL.

With the configuration, the measurement device 1B according to the present embodiment performs a process of lowering the output level until the time point at which the measurement result of the throughput is lower than the predetermined threshold value and is determined to be FAIL, and then performs a process of raising the output level. In a case of raising the output level, control is performed so that the output level to be smaller than that of the previous output level, so that it is possible to more effectively reduce reception sensitivity test time of the DUT 100. In addition, in a case where the measurement result of the throughput is in the predetermined threshold value range and PASS is determined, a process of lowering the output level is performed, and thereafter a control is performed to reduce the variation range of the output level, so that further efficiency can be achieved.

Fourth Embodiment

Figure 29:
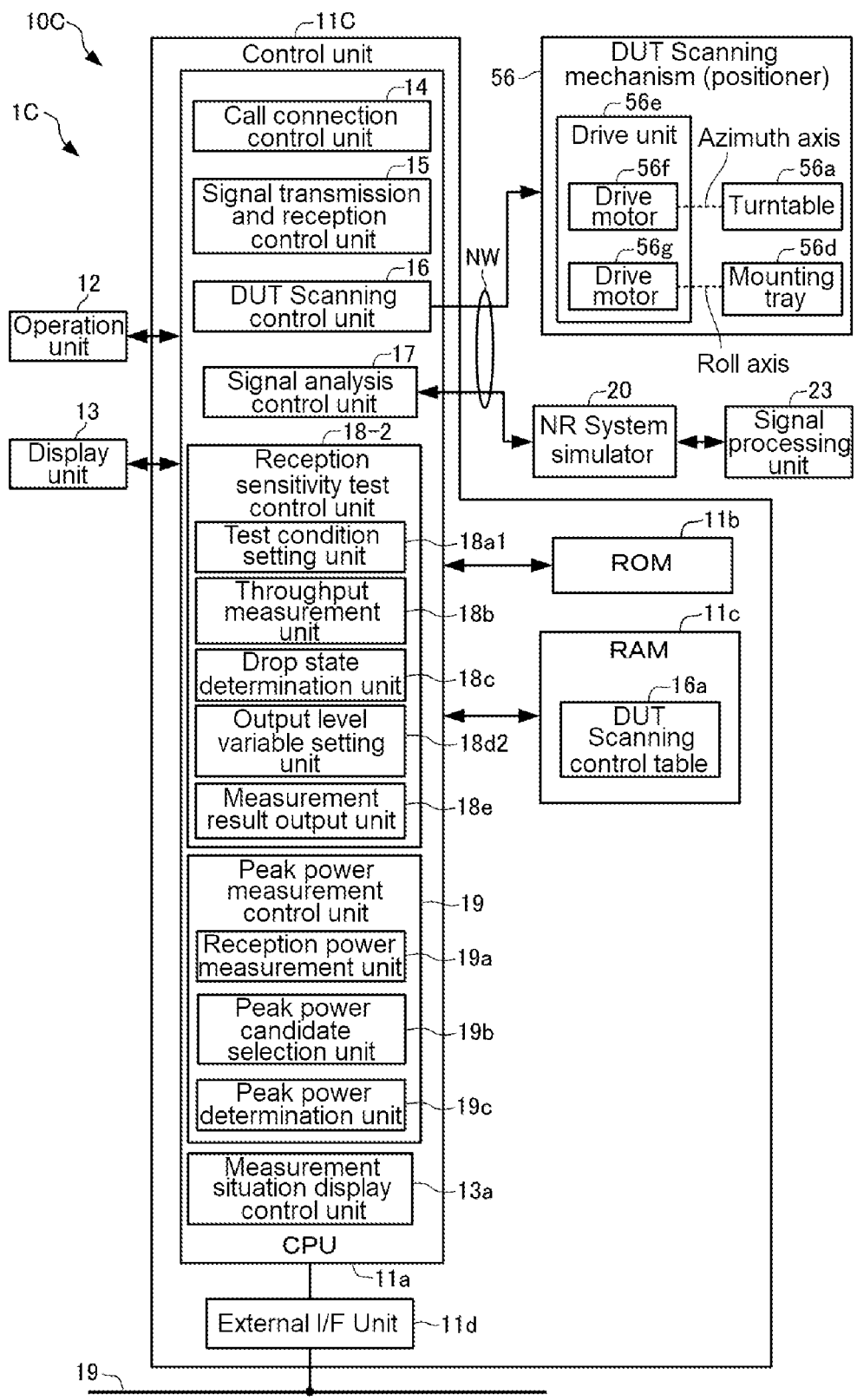
FIG. 29 is a block diagram showing functional configurations of an integrated control device and a controlled element thereof in the measurement device according to a fourth embodiment of the present invention.

FIG. 29 is a block diagram showing functional configurations of an integrated control device 10C and a controlled element thereof in a measurement device 1C according to a fourth embodiment of the present invention. In the integrated control device 10C, components having the same function as the integrated control device 10 (refer to FIG. 3) of the measurement device 1 according to the first embodiment are designated by the same reference numerals. In the integrated control device 10C, the control unit 11C different from the control unit 11 according to the first embodiment in a point of having a reception sensitivity test control unit 18-2 instead of the reception sensitivity test control unit 18 according to the first embodiment, and has the same configuration as in the control unit 11 for other parts. The reception sensitivity test control unit 18-2 constitutes reception sensitivity test execution means of the present invention.

In the measurement device 1C according to the present embodiment, the control unit 11C has the same peak power measurement control unit 19 as in each of the first to third embodiments, and has a configuration capable of executing the beam peak search control equivalent to the measurement devices 1, 1A, and 1B according to each of the first to third embodiments.

Further, the measurement device 1C according to the present embodiment has a configuration in which the reception sensitivity test control unit 18-2 is provided in the control unit 11C of the integrated control device 10C, and thus it is possible to perform the reception sensitivity test different from the measurement devices 1, 1A, and 1B according to each of the first to third embodiments. Hereinafter, a configuration and a control operation for the reception sensitivity test of the measurement device 1C according to the present embodiment will be described.

As shown in FIG. 29, in the measurement device 1C according to the present embodiment, the reception sensitivity test control unit 18-2 includes a test condition setting unit 18a1, a throughput measurement unit 18b, a drop state determination unit 18c, an output level variable setting unit 18d2, and a measurement result output unit 18e. The drop state determination unit 18c and the output level variable setting unit 18d2 constitute drop determination means and output level setting means of the present invention, respectively.

The throughput measurement unit 18b and the measurement result output unit 18e are the same as in the third embodiment, respectively.

The test condition setting unit 18a1 is a functional unit for setting a test condition of the reception sensitivity test, and has the same setting function as in the test condition setting unit 18a according to the third embodiment. In addition, as a unique setting function according to the present embodiment, the test condition setting unit 18a1 further has a function of setting a determination condition for determining whether or not the measurement result of the throughput is in a dropped state to a preset proportion in a steep drop area related to a characteristic (refer to FIG. 36), in which the measurement result of the throughput drops steeply, at the check point (CP) which will be described later.

The drop state determination unit 18c has a function of determining whether or not the measurement result of the throughput is in the dropped state to the preset proportion in the steep drop area related to the characteristic (refer to FIG. 36) in which the measurement result of the throughput by the throughput measurement unit 18b drops steeply. In order to realize the function, for example, the test condition setting unit 18a1 sets the determination condition for determining whether or not the measurement result of the throughput drops to the certain proportion in the steep drop area in advance. The drop state determination unit 18c determines whether or not the measured throughput is in the dropped state according to whether or not the measured throughput is in the steep drop area indicated by the determination condition. As the determination condition for determining whether or not the throughput measurement result is in the dropped state, for example, an example is provided in which a range which exceeds 95% and is equal to or less than 99% is set in a case where a throughput value, which is measured by the throughput measurement unit 18b through first test signal transmission and reception, is set to 100%. As a result, in a case where the measured throughput is in the set range, it is possible to determine the dropped state, and, in a case of a proportion higher than the range, it is possible to determine that the dropped state is not made. Here, the determination condition is not limited to a case where the throughput value, which is measured with the first test signal transmission and reception, is set to 100% (reference value) as described above and the range of the proportion, which exceeds 95% and is equal to or less than 99% with respect to the reference value, is set. Another range of a proportion with respect to the reference value may be set.

The output level variable setting unit 18d2 is a functional unit for variably setting the output level of the test signal, and has the same setting function as the output level variable setting unit 18d1 according to the third embodiment. Further, the output level variable setting unit 18d2 has a function of, in a case where a comparison result is obtained in which the measurement result of the throughput exceeds the threshold value, variably setting the output level of the test signal according to a determination result, obtained by the drop state determination unit 18c, of whether or not to be the dropped state to the preset proportion in the steep drop area in which the throughput steeply drops.

Hereinafter, a variable setting control operation of the output level of the test signal related to the reception sensitivity test of the DUT 100 by the integrated control device 10C of the measurement device 1C according to the present embodiment will be described with reference to a flowchart shown in FIG. 30.

In a case where the reception sensitivity test of the DUT 100 starts, first, the reception sensitivity test control unit 18-2 in the control unit 11C of the integrated control device 10C sets a test condition (step S51). Specifically, the test condition setting unit 18a1 sets, for example, each of values of the initial step level SL0, the starting output level OL0, the error tolerance level EL, and the connection drop determination threshold value DT, which are described above, by receiving an operation input in the operation unit 12.

Next, a method for shortening time for the reception sensitivity test in the measurement device 1C according to the present embodiment will be described.

(Method for Shortening Time for Reception Sensitivity Test)

In the integrated control device 10C, the reception sensitivity test control unit 18-2 controls the reception sensitivity test of the DUT 100 by transmitting and receiving the test signal a plurality of times between the NR system simulator 20, which is the signal generator, and the DUT 100. In the control, a throughput is measured according to the transmission and reception of the test signal at each time during the reception sensitivity test so as to be converged to an output level, at which an appropriate throughput value (measurement result) is obtained, while performing level down or level up on the output level of the test signal according to the comparison result between the throughput measurement value and the throughput threshold value.

As an example of a method for reducing a test time of the reception sensitivity test, a method is conceivable for performing control so that the output level is non-linearly fluctuated while repeatedly performing the level down or level up on the output level of the test signal without performing sequential change (linear change) by a constant level as the number of measurements increases from an initially set output level (refer to a test result display area 151a of FIG. 28).

Figure 34:
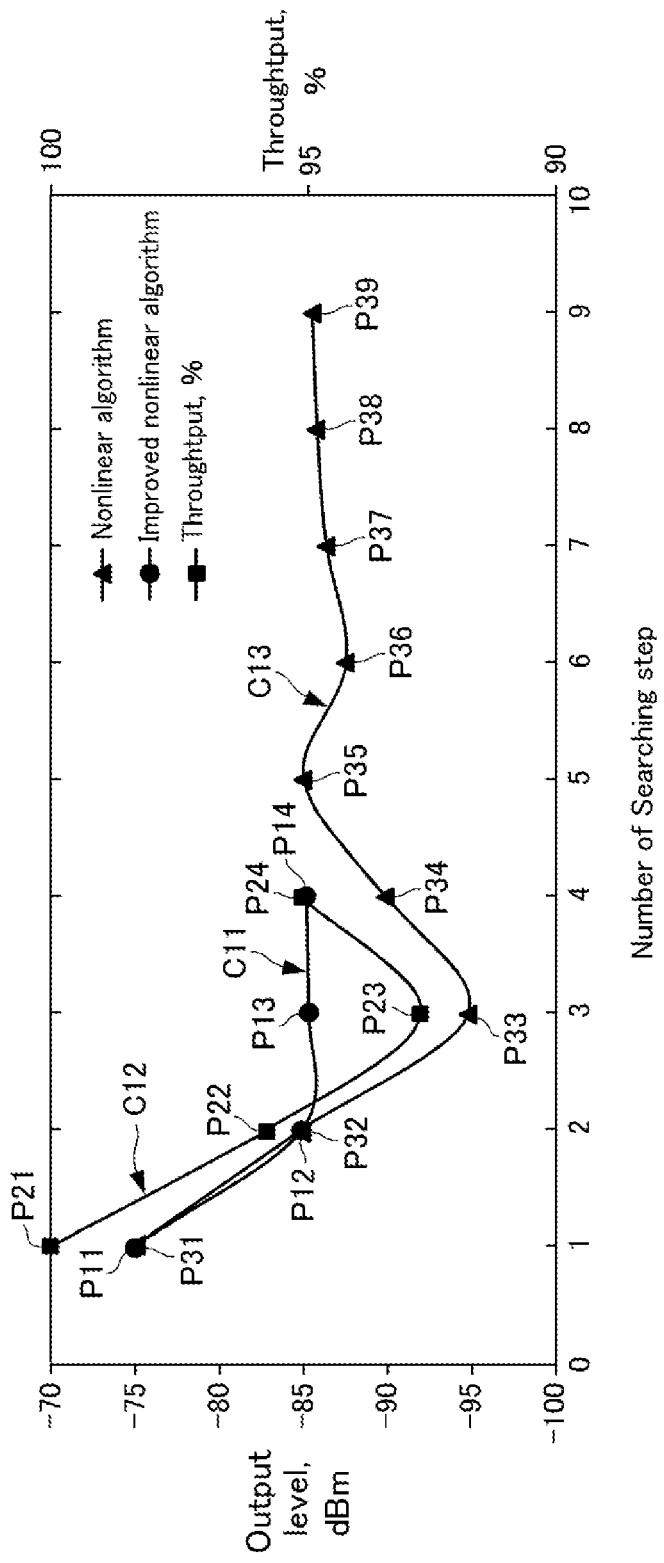
FIG. 34 is a graph showing the relationship between the number of measurements and the measurement value of each of the output level of the test signal and the throughput related to the reception sensitivity test of the DUT of the measurement device according to the fourth embodiment of the present invention.

The measurement device 1C according to the present embodiment is premised that the output level of the test signal related to the reception sensitivity test of the DUT 100 is non-linearly controlled, and a relationship between the number of measurements related to the control and each of the measurement values of the output level of the test signal and throughput is shown as a table diagram of FIG. 33 and a graph of FIG. 34.

In the table diagram shown in FIG. 33, first and third to fifth columns from the left show data examples of test signal output level control according to the present embodiment. Further, in the table diagram, the first and second columns from the left show data examples of existing test signal output level control in the sense of being compared with the present embodiment. Similarly, in the graph shown in FIG. 34, graphs corresponding to the data examples of the test signal output level control according to the present embodiment in FIG. 32 are shown using reference numeral C1 (graph showing a relationship between the number of measurements and the output level) and reference numeral C2 (graph showing a relationship between the number of measurements and throughput), and a graph corresponding to the data example of the existing test signal output level control in FIG. 32 is shown using reference numeral C3 (graph showing the relationship between the number of measurements and the output level).

Focusing on the data examples in the first and second columns from the left of the table diagram shown in FIG. 33 and a characteristic C13 of the graph shown in FIG. 34, in the existing test signal output level control, for example, the variable level control is performed in a pattern in which the output level of the test signal is sequentially lowered by 10 dB intervals for each one measurement from first to third measurements, and the output level is sequentially raised or lowered by half the previous level after fourth measurement. Further, until a test end condition (refer to step S55 in FIG. 30) in which a difference from the previous output level is less than the error tolerance level EL set in advance is satisfied, a total of nine steps, which are shown using P31 to P39 in FIG. 11, are increased as the number of tests. In a case where the measurement result of the throughput is simply compared with the throughput threshold value and the output level of the test signal is non-linearly controlled using the comparison result until the above-described test end condition is satisfied, it is clarified that there is a limit to the effect of reducing the time required to reach a desired output level.

(Parameter Newly Adopted in Reception Sensitivity Test)

Therefore, in the present embodiment, as the parameters to be adopted in the reception sensitivity test, a state where the measured throughput value drops to a certain proportion with respect to a value (100%) determined as a reference is further added in addition to the measurement result of the throughput and the comparison result with the throughput threshold value, and, thereafter, the output level variable setting is executed to reduce the number of measurements of the reception sensitivity test.

Figure 36:
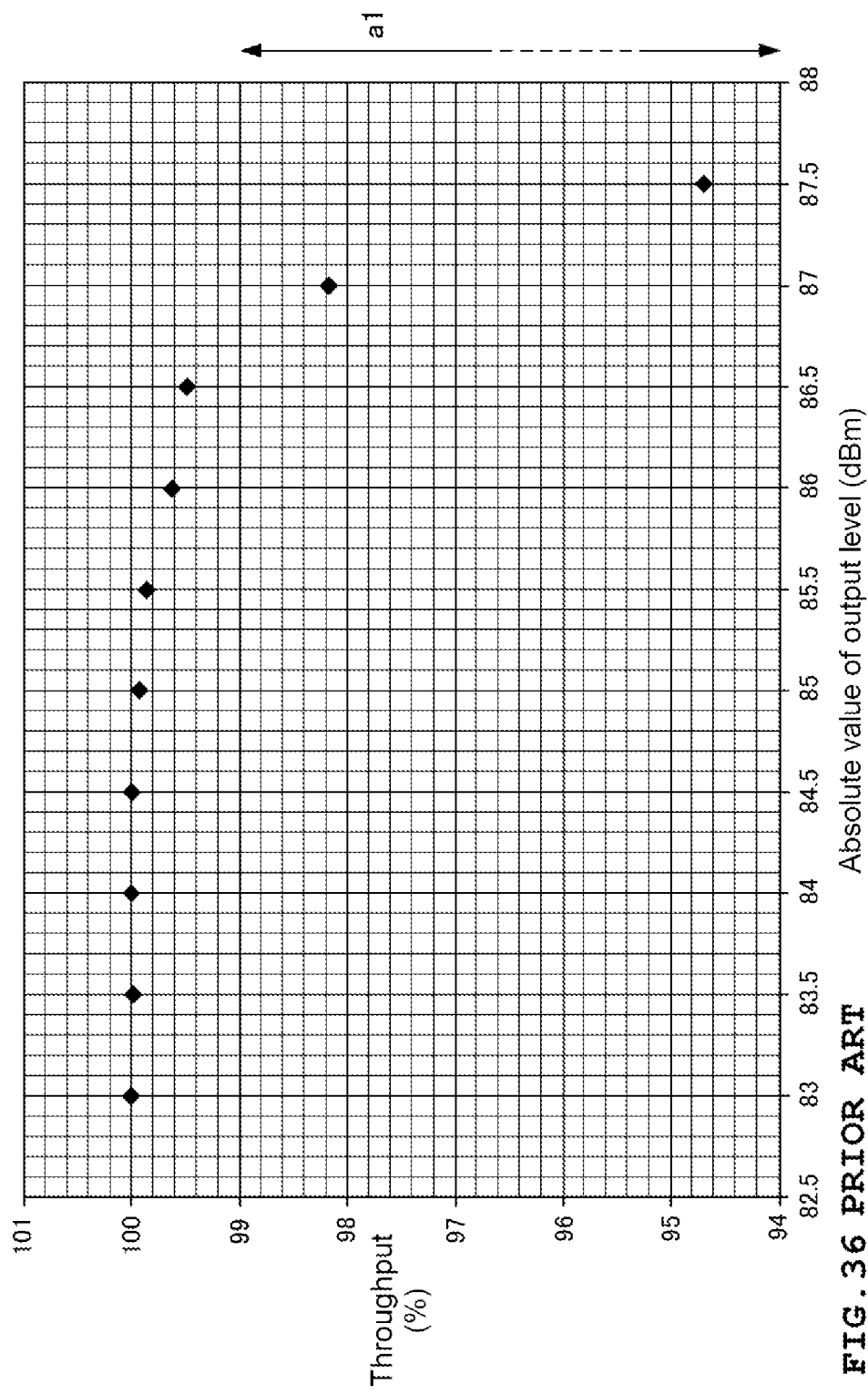
FIG. 36 is a graph showing the relationship of the output level of the test signal with respect to the throughput measurement value according to the reception sensitivity test of the DUT of the device according to the related art.

FIG. 36 shows a graph of variation characteristic of the output level of the test signal with respect to the throughput measurement value according to the reception sensitivity test of the DUT of a device according to the related art. The variation characteristic shown in the graph in FIG. 36 is a basis for adopting a drop state determination condition of the throughput measurement value in step S57 introduced as a check point (CP) in output level variable setting control shown in FIG. 30. In FIG. 36, reference numeral a1 indicates the steep drop area in which the throughput drops steeply. The graph shown in FIG. 36 is derived from the reception sensitivity test result (refer to FIG. 28) of the DUT 100 in the device according to the related art, and represents that the throughput measurement value steeply drops in the steep drop area a1. The example represents that, for example, in a case where a first throughput measurement value is set to 100% and the throughput measurement value is equal to or less than 99%, a throughput measurement value thereafter drops steeply.

In view of the throughput variation characteristics, in the present embodiment, the throughput measurement value during the reception sensitivity test of the DUT 100 is monitored, and a check point (CP) is provided to check whether or not the throughput measurement value is in a situation in which the throughput measurement value drops steeply using the determination condition set in advance. Further, in a case where the determination condition is satisfied at the CP (corresponding to step S57 in FIG. 30), that is, in a case where the throughput measurement value is a value in the steep drop area a1, a unique setting pattern, which is different from the setting pattern (also, refer to step S58a) under the situation in which the throughput measurement value drops steeply, is applied in a case where the next output level of the test signal is set (also, refer to step S58b).

Figure 30:
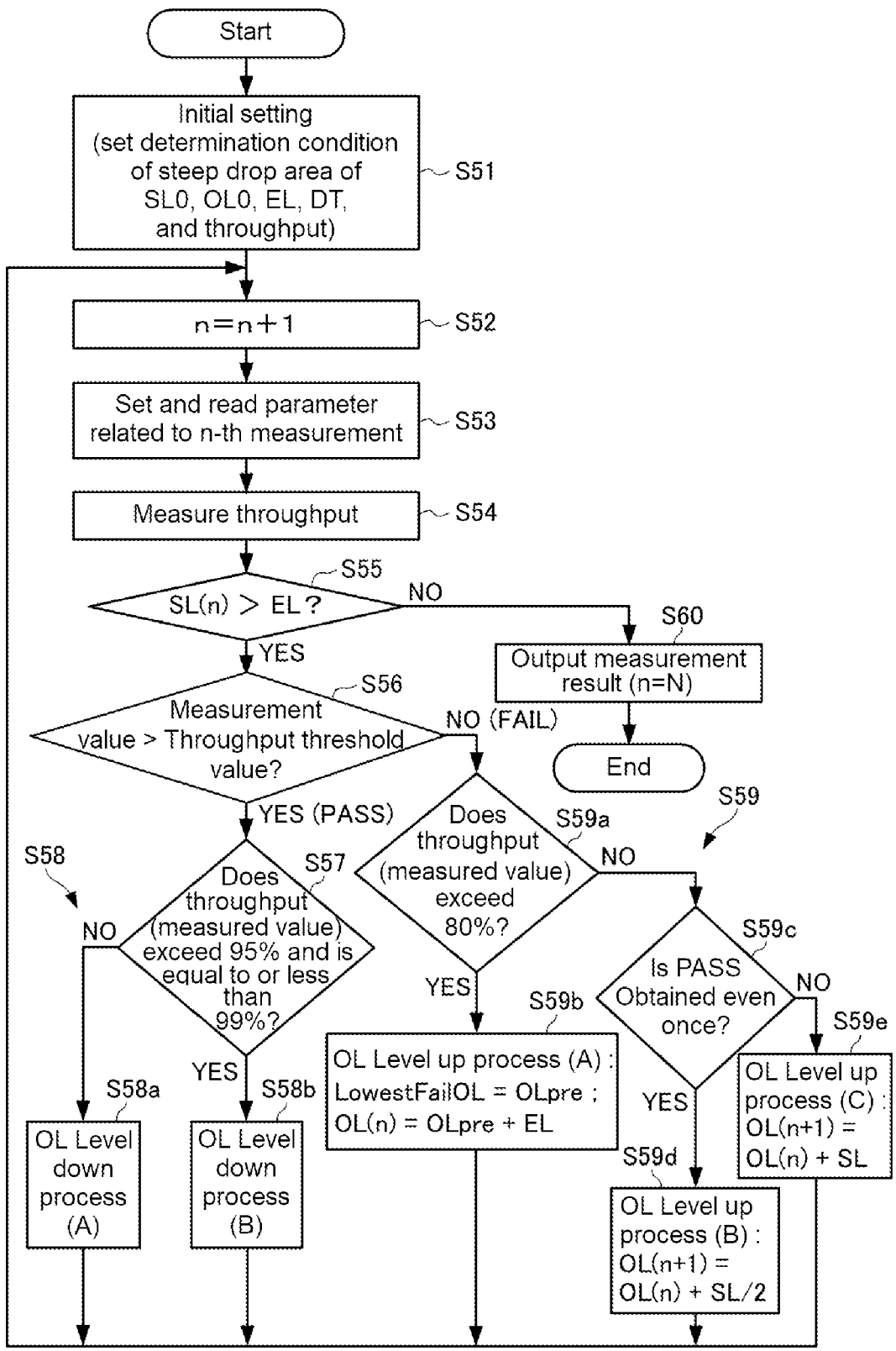
FIG. 30 is a flowchart showing a variable setting control operation of an output level of a test signal, to which CP related to the reception sensitivity test of a DUT is introduced, by a measurement device according to the fourth embodiment of the present invention.

The unique setting pattern applied in the present embodiment is conditional upon a setting pattern in which, in a state where the throughput measurement value is dropped to a value in the steep drop area a1 in the graph of FIG. 36, the number of transmissions and receptions of the test signal related to the reception sensitivity test is reduced to the utmost, and which speedily reaches to a reception sensitivity test end condition by the error tolerance level EL (refer to step S55 in FIG. 30).

In the present embodiment, as an example of the above-described unique setting pattern, a pattern (refer to step S58b in FIG. 30) is adopted in which, in a case where the determination condition is satisfied at the CP (YES in step S57 of FIG. 30), a value, which is obtained by performing level down on the output level of the test signal by a value (2EL) twice the error tolerance level EL from the previous output level OL(OLpre), is set as a next output level OL(OL(n)) of the test signal.

The output level setting based on the unique setting pattern is an example in a case where a comparison result indicating that the measurement result of the throughput exceeds the threshold value is obtained and the measurement result of the throughput (measurement value) is a value in the steep drop area a1. Regarding the output level setting based on the unique setting pattern, in the present embodiment, thereafter, in a case where the comparison result indicating that the measurement result of the throughput is less than the threshold value is obtained, a pattern is used together in which a value, which is obtained by performing level up on the output level of the test signal by the value of the error tolerance level EL from the previous output level OL(OLpre), is set as the next output level OL(OL(n)) of the test signal (refer to FIG. 31B).

Based on the above-described method for reducing the time of the reception sensitivity test of the DUT 100 and the parameters (variation characteristics of the throughput measurement value) newly added in the reception sensitivity test, a variable setting control operation of the output level of the test signal according to the reception sensitivity test of the DUT 100 by the integrated control device 10C of the measurement device 1 according to the present embodiment will be described below with reference to FIGS. 30 to 35.

Figure 31A:
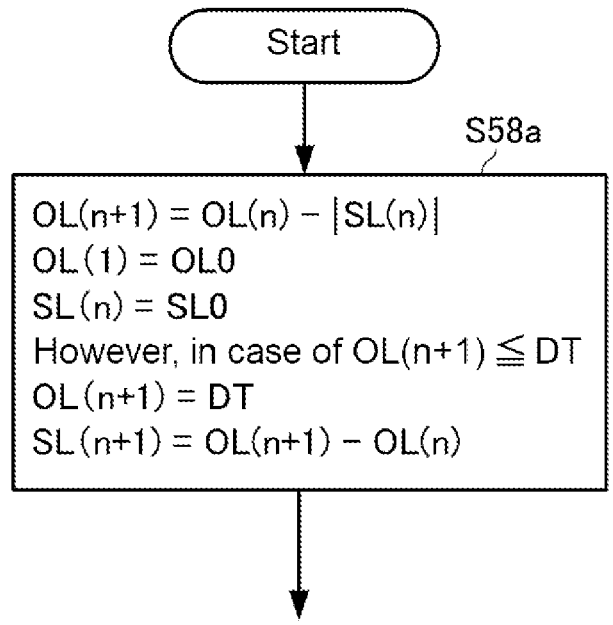
Figure 31B:
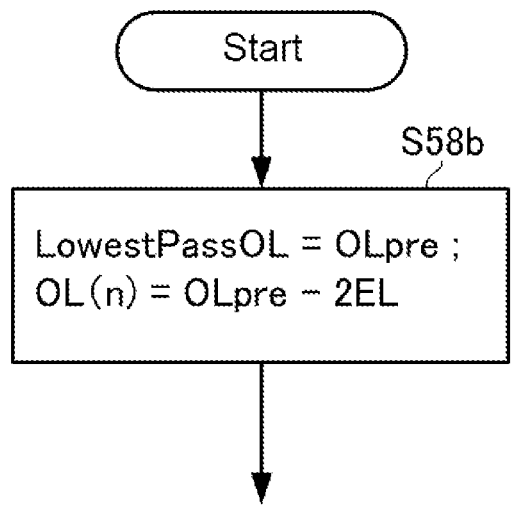

FIG. 30 is a flowchart showing a flow of the variable setting control operation of output level. In FIG. 30, a process in step S57 is performed at a timing corresponding to the above-described CP. As the determination condition for determining whether or not the throughput measured in step S54 is in the steep dropped state (refer to the steep drop area a1 in FIG. 36), for example, a condition is applied that the throughput measurement value exceeds 95% and is equal to or less than 99% with respect to the reference value (for example, the value of the measured throughput value through the first transmission and reception. In a case of the first transmission and reception, measured throughput value is stored as 100%). Further, step S58b corresponds to a next output level setting process performed by applying the above-described unique setting pattern in a case where it is determined that the determination condition is satisfied in step S57 (YES in step S57), that is, the level down process (B). Details of the level down process (B) are shown in FIG. 31B.

Further, in FIG. 30, a process in step S59a is a processing step which is executed at a check point according to the above-described CP in the level up process of the test signal (refer to step S59 of FIG. 30), and which is used to determine whether or not the throughput measured in step S54 is in the steep dropped state by using a determination condition different from the above-described level down process. In step S59a, as the determination condition for determining whether or not the throughput is in the steep dropped state, for example, a condition is applied that the throughput measurement value exceeds 80% with respect to the reference value. In a case where the determination condition is satisfied (YES in step S59a), a level up process (A) is performed, and, in a case where the determination condition is not satisfied (NO in step S9a), a level up process (B) of the output level (OL) or a level up process (C) is performed.

In a case where the reception sensitivity test of the DUT 100 starts along the flow chat shown in FIG. 30, first, the reception sensitivity test control unit 18-2 in the control unit 11C of the integrated control device 10C sets the test conditions (step S51). Specifically, the test condition setting unit 18a1 receives an operation input in the operation unit 12, and sets, for example, respective values of the initial step level SL0, the starting output level OL0, the error tolerance level EL, the connection drop determination threshold value DT, and the determination condition (refer to steps S57 and S59a) of the steep drop area of the throughput, which are described above.

Setting content of the test condition in step S51 assumes an operation of starting the first throughput measurement from a state where the DUT 100 is operated at the starting output level OL0, measuring the throughput at the output level obtained by lowering the variation range by a width of an initial step level from the previous output level from the next measurement, and ending the measurement by determining a state where a step level SL(n) of the test signal is equal to or less than the error tolerance level EL in an n-th measurement while repeatedly performing a process of lowering the output level of the test signal (refer to the output level (OL) down processes (A) and (B)) in a case where the measured throughput is larger than the threshold value (throughput threshold value) and a process of raising the output level of the test signal (refer to the OL level up processes (A), (B), and (C)) in a case where the throughput is equal to or larger than the throughput threshold value. Further, in the operation, it is assumed that the CP (refer to step S57 in FIG. 30) is provided to check whether or not the throughput measurement value is in a situation in which the throughput measurement value drops steeply using the determination condition set in advance, and, in a case where the throughput measurement value is in the situation in which the throughput measurement value drops steeply, the next output level of the test signal is set by applying the above-described unique setting pattern (also refer to step S58b).

As the starting output level OL0 and the initial step level SL0, which are set in step S51, for example, −75 dBm and 10 dB are assumed, respectively. The error tolerance level EL is assumed to be, for example, 0.2 dB. The connection drop determination threshold value DT is assumed to be, for example, −90 dBm. Further, as the determination condition of the steep drop area of the throughput, for example, a condition is assumed that the throughput measurement value is set to a range of a proportion which exceeds 95% and is equal to or less than 99% with respect to the reference value.

After the setting of the test condition in step S51 is completed, the reception sensitivity test control unit 18-2 of the integrated control device 10C increments the number of measurements n by +1 (step S52), and performs a process of setting a parameter related to the N-th measurement, and reading a value of the output level OL set in step S58

(including steps S58a and S58b) of performing, for example, the OL level down process or step S59 of performing the OL level up process before the setting (step S53). Subsequently, the reception sensitivity test control unit 18-2 performs control to perform the n-th measurement related to the throughput of the DUT 100 while transmitting the test signal based on the parameter, which is set (or read) in step S53, related to the measurement (step S54).

As a specific example of the control in steps S53 and S54 (throughput measurement control), the reception sensitivity test control unit 18-2 sets, as the parameter related to a first measurement, for example, the starting output level OL0 based on the setting of the test condition in step S51, and performs the throughput measurement while driving and controlling the DUT 100 at the starting output level OL0.

Next, the reception sensitivity test control unit 18-2 checks whether or not a step level interval with respect to the previous throughput measurement related to the current throughput measurement, that is, the step level SL(n) is larger than the error tolerance level EL which is set in step S51 (step S55). In a case where it is determined that the step level SL(n) is larger than the error tolerance level EL (YES in step S55), the reception sensitivity test control unit 18-2 proceeds to step S56 and continues the throughput measurement and step level search control. As described above, a first throughput measurement is started from the transmission of the test signal at the starting output level OL0, and there is no variation range of SL with respect to the previous measurement, so that the process of step S55 is skipped and the process proceeds to step S56.

In step S56, the reception sensitivity test control unit 18-2 compares the throughput (measurement value) of the DUT 100, which is measured in step S54, with a preset throughput threshold value, and determines whether or not the throughput is equal to or larger than the throughput threshold value. Here, setting is performed so that the throughput threshold value is 95%, the throughput which is equal to or larger than 95% is in a permissible range "PASS", and the throughput which is lower than 95% is out of the permissible range "FAIL".

Here, in a case where it is determined that the throughput measurement value is equal to or larger than the throughput threshold value (the state of "PASS" in step S56), the drop state determination unit 18c then determines whether or not the throughput measurement value satisfies the determination condition of the range of the proportion which exceeds 95% and is equal to or less than 99% with respect to the reference value (step S57). Here, in a case where it is determined that the throughput measurement value exceeds 99% with respect to the reference value and the determination condition is not satisfied (NO in step S57), the reception sensitivity test control unit 18-2 executes the OL level (output level) down process (A) of lowering the output level of the test signal (step S58a). As shown in FIG. 31A, in the OL level down process (A), a process of lowering the output level by a step of the initial step level SL0 from a previous OL(OL(n)) is executed on a next output level OL(n+1). As the first output level OL(1), setting is performed so that OL(1)=OL0.

Further, in a case where it is determined, by the drop state determination unit 18c, that the throughput measurement value is in the range of the proportion which exceeds 95% and is equal to or less than 99% with respect to the reference value (steep drop area a1) and the above determination condition is satisfied (YES in step S57), the reception sensitivity test control unit 18-2 executes the OL level down process (B) (step S58b). As shown in FIG. 31B, in the OL level down process (B), a process is executed of defining the previous output level (OLpre) as the lowest output level (Lowest Pass OL) in a case of PASS determination, and setting the next OL level (OL(n)) to a value (OLpre−2EL) obtained by lowering the level (2EL) corresponding to twice the error tolerance level EL from the previous output level (OLpre).

After a process in step S58a or step S58b is executed, the reception sensitivity test control unit 18-2 increments the number of measurements n by +1 (step S52), and sets and reads the parameter related to the n-th measurement (step S53). As a result, after the process in step S58a, the OL level that is leveled down by the initial step level SL0=10 dB from the previous OL level is set. After the process in step S58b, the OL level that is leveled down by a value corresponding to 2EL from the previous OL level is set, and the throughput measurement is performed based on the test signal each having the set OL level (step S54).

On the other hand, in a case where it is determined that the throughput (measurement value) is equal to or less than the throughput threshold value (in a state of "FAIL" in step S56) in step S56, the reception sensitivity test control unit 18-2 performs the determination process in step S59a, and further executes any of the OL level up processes (A), (B), and (C) of raising the output level of the test signal based on the determination result (step S59).

After it is determined to be "FAIL" in step S56, the reception sensitivity test control unit 18-2 first determines whether or not the determination condition that the throughput measurement value exceeds 80% with respect to the reference value is satisfied (step S59a).

Here, in a case where it is determined that the throughput measurement value exceeds 80% with respect to the reference value and the determination condition is satisfied (YES in step S59a), the reception sensitivity test control unit 18-2 executes the OL level up process (A) of lowering the output level of the test signal (step S59b).

In the OL level up process (A), a process is executed of defining the previous output level (OLpre) as the lowest output level (Lowest Fail OL) in a case of FAIL determination, and setting the next OL level (OL(n)) to a value (OLpre+EL) obtained by raising the level (EL) corresponding to the error tolerance level EL from the previous output level (OLpre).

On the other hand, in a case where it is determined that the throughput measurement value is equal to or less than 80% with respect to the reference value and the determination condition is not satisfied (NO in step S59a), the reception sensitivity test control unit 18-2 checks whether or not PASS is obtained even once so far (step S59c). In a case where it is determined that PASS is obtained even once (YES in step S59c), an OL level up process (B) is executed (step S59b). In the OL level up process (B), a process of raising the output level by a half step of the step level SL from the previous OL(n) is executed on the next output level OL(n+1).

Further, in a case where it is determined that the PASS is not obtained ever once (NO in step S59c), an OL level up process (C) is executed (step S59c). In the OL level up process (C), a process of raising the output level by a step of the step level SL0 from the previous output level OL(n) is executed on the next output level OL(n+1).

After executing the process in step S59, that is, any of the OL level up processes (A), (B), and (C), the reception sensitivity test control unit 18-2 increments the number of measurements n by +1 (step S52), and sets and reads the parameter related to the n-th measurement (step S53). As a result, after the process in step S59, the OL level that is leveled up by a value corresponding to the error tolerance level EL from the previous OL level is set, and the throughput measurement is performed based on the test signal having the set OL level (step S54).

After executing the throughput measurement in step S54, the reception sensitivity test control unit 18-2 checks whether or not the step level interval with respect to the previous throughput measurement related to the current throughput measurement, that is, the step level SL(n) is larger than the error tolerance level EL which is set in step S51 (step S55). Here, in a case where it is determined that the step level SL(n) is equal to or less than the error tolerance level EL (NO in step S55), the reception sensitivity test control unit 18-2 stops the throughput measurement and a step level search (step S60), and, thereafter, ends a series of measurement operations.

In step S60, the measurement result output unit 18*e* displays a measurement screen 130*c* (refer to FIG. 37), which includes the measurement result so far, such as information indicating transition of the first to N-th throughput measurement results while the number of throughput measurements in a case where the measurement operation is ended is set to N times, on the display unit 13.

According to a series of measurement controls shown in FIG. 30, it is determined whether or not the determination condition that the throughput measurement value at a processing timing corresponding to CP (refer to step S57) is in the range of the proportion which exceeds 95% and is equal to or less than 99% with respect to the reference value is satisfied. In a case where the throughput measurement value satisfies the determination condition, the process proceeds to step S58*b*, thereby performs the level down process (B) of performing level down on the output level of the test signal by the value corresponding to 2EL from the previous OL level using the unique setting pattern that does not depend on the setting pattern in step S58*a* in a case where the determination condition is not satisfied. The level down process (B) operates to reduce the number of transmissions and receptions of the test signal related to the reception sensitivity test, and to reach a state which satisfies the reception sensitivity test end condition (refer to step S55) by the error tolerance level EL with a smaller number of throughput measurements.

Hereinafter, the operation will be verified with reference to FIGS. 32 to 35.

FIG. 32 shows a data example of the parameter related to the output level of the test signal, which is set according to the number of measurements by the output level variable setting control (refer to FIG. 30) by the measurement device 1C according to the present embodiment. The example of FIG. 32 shows, for example, with respect to each of the total four number of measurements, a relationship of the output level of the test signal of the measurement, the measured throughput, the determination result based on the determination condition of the steep drop area of the throughput measurement value, the variation range of the output level between the previous measurement and the current measurement, a setting process type of the next output level, and the next output level of the test signal.

FIG. 34 shows the characteristic C11 related to the output level of the test signal with respect to the number of measurements according to the reception sensitivity test of the DUT 100 by the measurement device 1C according to the present embodiment, and the characteristic C12 related to the throughput (measurement value) with respect to the number of measurements. The characteristics C11 and C12 are based on the data examples shown in FIG. 33 (refer to the first and third to fifth columns from the left), respectively. That is, in FIG. 34, the characteristic C11 gives an example in which the total four number of throughput measurements (output level variable setting), which are indicated by the reference numerals P11 to P14, are performed and the reception sensitivity test is ended.

As shown in the characteristic C11 in FIG. 34 and FIGS. 32 and 33 (refer to the first to third columns from the left), in the measurement device 1C according to the present embodiment, in a first measurement, the test is started with the DUT 100 while setting the output level OL(1)=−75 dBm at the measurement point P11 of the characteristic C11. Since the throughput measured at this time is a value higher than the throughput threshold value and is determined to be in the permissible range "PASS", the process proceeds to the determination process based on the determination condition of the steep drop area of the throughput measurement value. Here, a determination result ("NO") is obtained that the throughput measurement value is outside the region of the steep drop area a1 and the determination condition is not satisfied, and the process proceeds to the OL level down process (A) (refer to step S8*a* in FIG. 10).

In the OL level down process (A), the initial step level SL0 (=−10 dB), which functions as the step level SL(1), is set to be leveled down from the output level OL(1)=−75 dBm, and (OL(1)−SL(1))=−85 dBm is set as a second output level OL(2).

Subsequently, in a second measurement, the test of the DUT 100 is continued with the output level OL(2)=−85 dBm at the measurement point P12 of the characteristic C11. Since the throughput measured at this time became a value higher than the throughput threshold value and is determined to be in the permissible range "PASS", the process proceeds to the determination process based on the determination condition of the steep drop area of the throughput measurement value. Here, a determination result ("YES") in which the throughput measurement value is a value in the region of the steep drop area a1 and satisfies the determination condition is obtained, and the process proceeds to the OL level down process (B) (refer to step S58*b* of FIG. 30 and FIG. 31B).

In the OL level down process (B), the output level OL(2)=−85 dBm is set to level down 2EL=0.4 dB, which is twice the value of the error tolerance level EL, and (OL(2)−2EL)=−85.4 dBm is set as a third output level OL(3).

Subsequently, in a third measurement, the test of the DUT 100 is continued with the output level OL(3)=−85.4 dBm at the measurement point P13 of the characteristic C11. Since the throughput measured at this time is a value less than the throughput threshold value and is determined to be out of the permissible range "FAIL", the process proceeds to the OL level up process (A) (refer to step S59*b* in FIG. 30).

In the OL level up process (A), 0.2 dB, which is the value of the error tolerance level EL, is set to level up from the output level OL(3)=−85.4 dBm, and (OL(3)+EL)=−85.2 dBm is set as a fourth output level OL(4).

Subsequently, in a fourth measurement, the test of the DUT 100 is continued with the output level OL(4)=−85.2 dBm at the measurement point P14 of the characteristic C11. Here, a difference (absolute value) between the current output level OL(4) and the output level OL(3) set at the third measurement is (85.2−85.4)=0.2 dB. Therefore, the value of the difference is equal to or less than the error tolerance level EL, and the end condition (SL(n)≥EL; NO in step S55 of FIG. 30) of the output level variable setting control (reception sensitivity test) is satisfied, so that the reception sensitivity test is ended.

As shown in the characteristic C11 and FIGS. 32 and 33 (refer to the first and third to fifth columns from the left), in the measurement device 1C according to the present embodiment, it is checked whether or not the throughput measurement value at the CP is in the steep drop area a1. In a case where the throughput measurement value is in the steep drop area a1, the level down process (refer to step S58b in FIG. 30) and the level up process (refer to step S59 in FIG. 30) which are performed in a case where the next output level is set, are performed in units of the error tolerance level EL, so that it is possible to realize the reception sensitivity test with four measurements.

On the other hand, in the existing test signal output level control, to which a technology for performing the level down or level up in units of the error tolerance level EL is not introduced in a case where the above-described CP and the throughput measurement value are in the steep drop area a1, for example, a total of nine measurements are necessary using the measurement points P31 to P39 until the end of the reception sensitivity test, as shown using the characteristic C13 in FIG. 34 (in addition, refer to the first and second columns from the left in FIG. 33). According to the test signal output level control, to which the CP according to the present embodiment, the level down process in step S58b of FIG. 30, and the level up process in step S59b are introduced, the effect of reducing the number of measurements by 2.25 (=9/4) times can be expected with respect to the existing test signal output level control.

Figure 35:
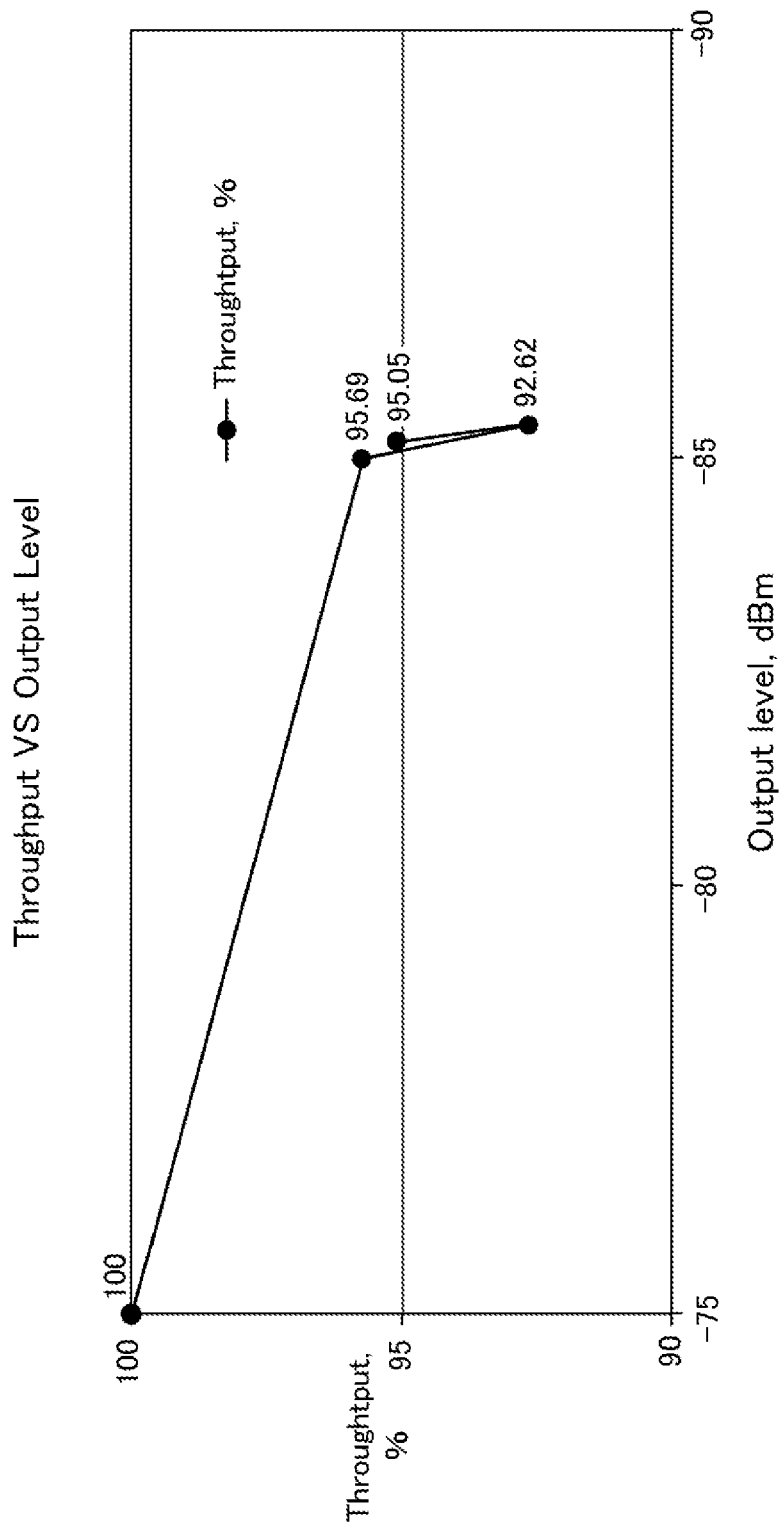
FIG. 35 is a graph showing an example of a characteristic related to the output level of the test signal and the measured throughput related to the reception sensitivity test of the DUT of the measurement device according to the fourth embodiment of the present invention.

FIG. 35 shows an example of the characteristics related to the measured throughput with respect to the output level in the variable setting control of the output level according to the present embodiment, to which the CP and the technology for performing level down or level up in units of the error tolerance level EL in a case where the throughput measurement value is in the steep drop area a1 are introduced (refer to FIG. 30). According to a graph shown in FIG. 35, since the CP and the technology for performing level down or level up in units of the error tolerance level EL in a case where the throughput measurement value is in the steep drop area a1 are introduced, it is possible to understand that a high throughput point can be omitted because the throughput measurement value at a second measurement point drops steeply.

Figure 37:
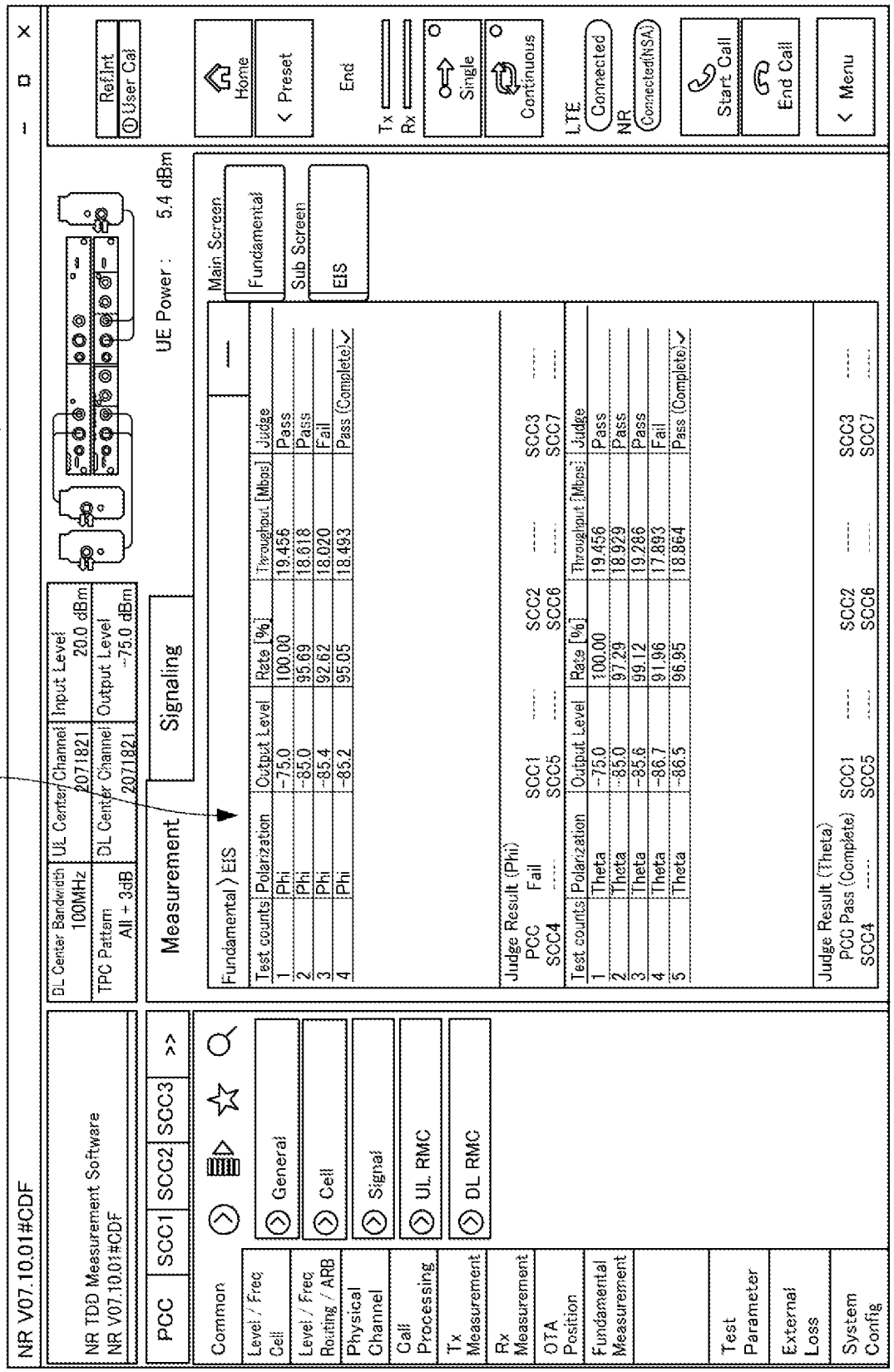
FIG. 37 is a diagram showing a display example of a reception sensitivity test result of the DUT based on variable setting control of the output level of the test signal to which the CP is introduced by the measurement device according to the fourth embodiment of the present invention.
Figure 38A:
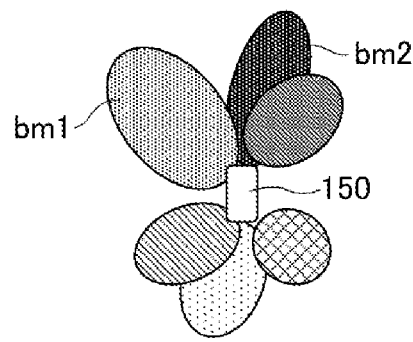
FIGS. 38A to 38C are diagrams showing operation images of a beam peak search in EIS-CDF measurement of a measurement device according to the related art.
Figure 38B:
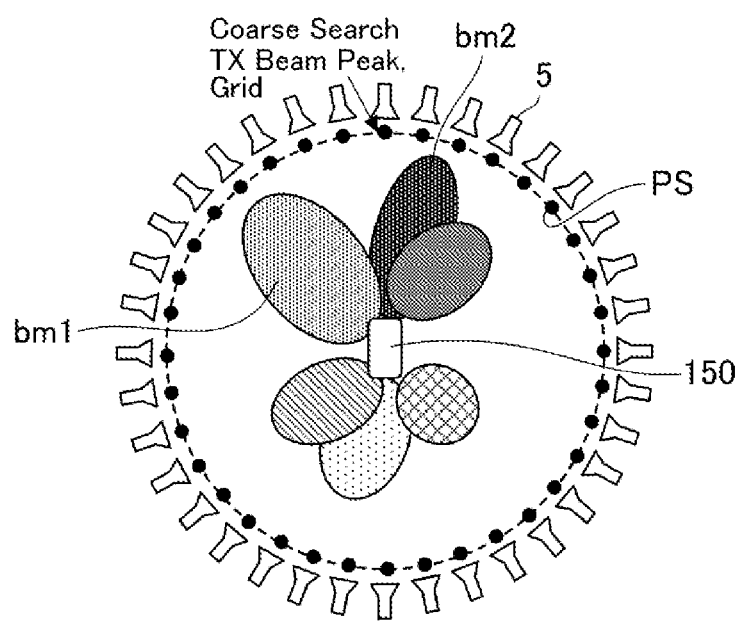
Figure 38C:
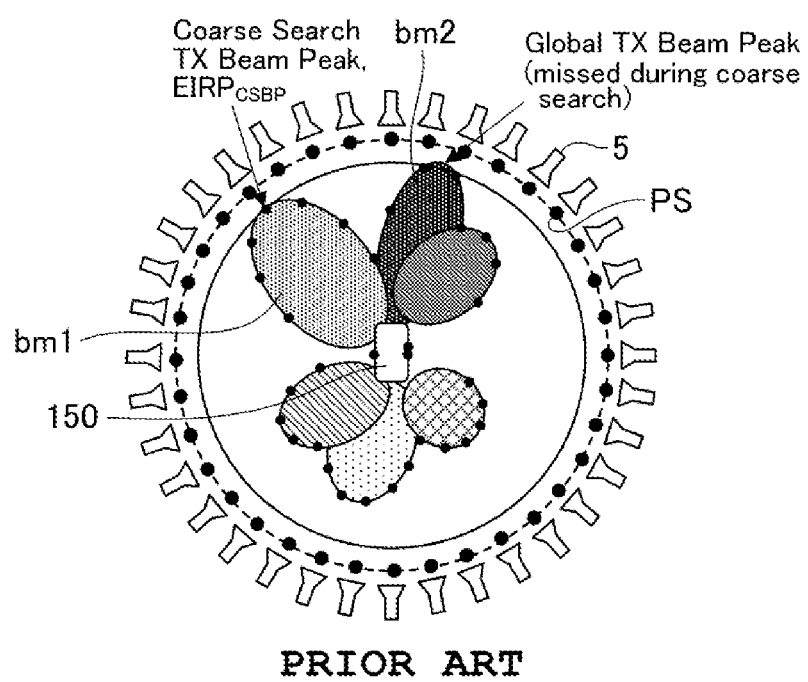

FIG. 37 is a diagram showing a display example of the reception sensitivity test result of the DUT 100 by the measurement device 1C according to the present embodiment. During the reception sensitivity test operation control of the DUT 100 according to the flowchart shown in FIG. 30, the display unit 13 of the integrated control device 10C displays, for example, the measurement screen 130c having a screen configuration shown in FIG. 37. The measurement screen 130c includes a test result display area 131b that displays the throughput measurement result (reception sensitivity) of the DUT 100 according to the number of measurements. According to the measurement device 1C according to the present embodiment, in the test result display area 131b on the measurement screen 130c, the measurement results of the four times of throughput measurements accompanied by the variation of the step level SL of the characteristic C11 shown in FIG. 34 are displayed in a mode of being arranged in chronological order according to the passage of time in a downward direction from an upper part in FIG. 34.

Focusing on a measurement screen 150 (refer to FIG. 28) in a device according to the related art in the sense of comparison with the display example of the reception sensitivity test result (refer to FIG. 37) of the DUT 100 by the measurement device 1C according to the present embodiment, in the test result display area 151a of the measurement screen 150, for example, the measurement results of 10 times of throughput measurements accompanied by the linear variation of the step level SL are displayed in a mode of being arranged in chronological order according to the passage of time in a downward direction from an upper part in FIG. 28.

As described above, in the measurement device 1C according to the present embodiment, the reception sensitivity test control unit 18-2 includes a test condition setting unit 18a1 that sets a predetermined error tolerance level EL and an initial step level SL0, a throughput measurement unit 18b that measures a throughput related to reception capacity of a DUT 100 for each transmission and reception, a drop state determination unit 18c that determines whether or not the measured throughput is in a dropped state to a preset proportion in a steep drop area in which the throughput drops steeply, an output level variable setting unit 18d2 that performs a setting process including a process of setting an output level of a test signal to be different from a previous output level according to a comparison result indicating whether or not a measurement result of the throughput exceeds a predetermined threshold value and a determination result indicating whether or not the measured throughput is in the dropped state determined by the drop state determination unit 18c and a setting process of performing level down or level up on the output level of the test signal with respect to the previous output level in units of the error tolerance level EL in a case where it is determined to be the dropped state, and a measurement result output unit 18e that continues the transmission and reception in a case where a variation width with respect to the previous output level exceeds the error tolerance level EL which is set by the test condition setting unit 18a1, and outputs a test result in a case where the variation width with respect to the previous output level is within a range of the error tolerance level EL.

With the configuration, the measurement device 1C according to the present embodiment checks the variation range of previous and current output levels while performing level down or level up on the output level of the test signal in units of the error tolerance level EL in a case where the measured throughput drops to a proportion in a steep drop area a1. As a result, compared to a case of performing level down or level up on the output level using a step variation range derived from the initial step level throughout an entire period without recognizing a state where the throughput drops to a preset proportion in the steep drop area a1, it is possible to reduce the number of transmissions and receptions, so that it is possible to significantly reduce the measurement time.

Further, in the measurement device 1C according to the present embodiment, the drop state determination unit 18c performs a process of determining whether or not the throughput is in the dropped state to the preset proportion in the steep drop area in which the throughput drops steeply in a case where the determination result indicating that the measurement result of the throughput exceeds a predetermined threshold value, and an output level variable setting unit 18d2 performs each of a process of performing level down on the output level of the test signal by a value twice the error tolerance level EL from the previous output level according to the determination result indicating whether or not throughput is in the dropped state to the preset proportion in the steep drop area in which the throughput drops steeply and a process of performing level down on the output level of the test signal by a value corresponding to the initial step level SL0 from the previous output level in a case where the comparison result indicating that the measurement result of the throughput exceeds the threshold value is obtained, and performs a process of performing level up on the output level of the test signal by the value of the error tolerance level EL from the previous output level in a case where the comparison result indicating that the measurement result of the throughput does not exceed the threshold value is obtained.

With the configuration, the measurement device 1 according to the present embodiment continuously performs the transmission and reception at the output level obtained by performing level down on the output level of the test signal by the value twice the error tolerance level EL from the previous output level and the transmission and reception at the output level obtained by performing level up on the output level of the test signal by the value of the error tolerance level EL from the previous output level in the state where the measured throughput drops to the preset proportion in the steep drop area, so that a step variation range therebetween is equal to or less than the set error tolerance level EL and the measurement is immediately ended. As a result, it is possible to obtain the test result of the reception sensitivity test in an extremely short time.

Further, in the measurement device 1C according to the present embodiment, the test condition setting unit 18a1 sets a throughput value, which is measured by the throughput measurement unit 18b in first transmission and reception, as a reference value (100%), and sets a range of a proportion, which exceeds 95% and is equal to or less than 99%, as a determination condition for determining whether or not the measured throughput is in the dropped state. The drop state determination unit 18c determines whether or not the measured throughput is in the dropped state according to whether or not the measured throughput is in the range of the proportion.

According to the configuration, in a case where the measured throughput is a value which indicates that the measured throughput drops steeply in the range of the proportion which exceeds 95% and is equal to or less than 99%, the measurement device 1C according to the present embodiment can reduce the number of transmissions and receptions by stopping to perform level down or level up on the output level by the step variation range derived from the initial step level, so that it is possible to significantly reduce the measurement time.

INDUSTRIAL APPLICABILITY

As described above, the mobile terminal testing device and the mobile terminal testing method according to the present invention have an effect that the measurement time including the reception sensitivity test can be shortened while improving the measurement accuracy of the peak power in the EIS measurement, and are useful for the mobile terminal testing device and the mobile terminal testing method for searching for the peak of the reception power from the mobile terminal in accordance with millimeter wave band measurement for a mobile terminal such as a 5G wireless terminal.

DESCRIPTION OF REFERENCE NUMERALS AND SIGNS 1, 1B, 1C: Measurement device (Mobile terminal testing device)
5: Test antenna
10: Integrated control device (Measurement control means)
13: Display unit
16: DUT scanning control unit (Rotation control means)
16a: DUT scanning control table (Holding means)
18, 18-1, 18-2: Reception sensitivity test control unit (Reception sensitivity test execution means)
18c: Drop state determination unit (Drop determination means)
18d, 18d1, 18d2: Output level variable setting unit (Output level setting means)
18e: Measurement result output unit (Measurement result output means)
19: Peak power measurement control unit (Peak power measurement means)
19b: Peak power candidate selection unit (Candidate selection means)
19c: Peak power determination unit (Determination means)
20: NR system simulator (Measurement control means)
50: OTA chamber (Radio anechoic box)
51: Internal space
56: DUT scanning mechanism (Positioner)
100: DUT (Device Under Test, Mobile terminal)
PSa: Measurement position (First orientation)
PSb: Measurement position (Second orientation)

What is claimed is:

1. A mobile terminal testing device comprising:
a positioner that is provided in an internal space of a radio anechoic box; and
measurement control means for measuring reception power by receiving a radio signal from a mobile terminal, which is a device under test, using a test antenna in the internal space, wherein
the measurement control means includes
rotation control means for executing, with respect to the positioner, first rotation control that causes the mobile terminal to sequentially face each of orientations regulated by a predetermined step interval of a spherical coordinate system, and second rotation control that causes the mobile terminal to sequentially face each of second orientations regulated by a step interval finer than the predetermined step interval,
reception sensitivity test execution means for transmitting a test signal from the test antenna, repeatedly performing a reception sensitivity test of receiving a signal under measurement transmitted from the mobile terminal which has received the test signal using the test antenna and measuring a throughput based on the signal under measurement for each of the first orientations and the second orientations while changing an output level of the test signal non-linearly, and calculating reception sensitivity when the measured throughput satisfies a predetermined throughput measurement end condition, and
peak power measurement means,
reception power is measured for each of the first orientations and the second orientations by executing the reception sensitivity test for each of the first orientations and the second orientations,
the peak power measurement means measures maximum reception power as peak power based on the measured reception power, and
the peak power measurement means includes candidate selection means for selecting, as peak power candidates, the first orientations having the reception power within a range of a predetermined power width from the maximum reception power among the reception powers measured for each first orientation, and determination means for measuring the peak power for each second orientation by executing the second rotation control on a region within a predetermined range around the each of first orientations corresponding to each of the peak power candidates, and determining the peak power based on a measurement result.

2. The mobile terminal testing device according to claim 1, further comprising:

holding means for holding each data of a first grid pattern that regulates the first orientation and a second grid pattern that regulates the second orientation, wherein the rotation control means executes the first rotation control and the second rotation control, respectively, based on the first grid pattern and the second grid pattern.

3. The mobile terminal testing device according to claim 2, wherein the first grid pattern and the second grid pattern are any of a constant angular distance type in which each of angular distances of the first orientation and the second orientation is constant, or a constant density type in which each of densities of the first orientation and the second orientation is constant.

4. The mobile terminal testing device according to claim 3, wherein the throughput measurement end condition is obtained by determining that the measured throughput falls below a predetermined threshold value for the first time while repeatedly executing a setting for sequentially reducing a step of the output level of the test signal, and the reception sensitivity test execution means detects, as the reception sensitivity, an output level immediately before the output level in a case where the determination is obtained.

5. The mobile terminal testing device according to claim 3, wherein the reception sensitivity test execution means includes
output level setting means for setting the output level of the test signal to be different from a previous output level according to a comparison result between a measurement result of the throughput and a predetermined threshold value, and measurement result output means for continuing transmission and reception of the test signal and the signal under measurement in a case where a variation width of the output level with respect to the previous output level exceeds a predetermined variation width set in advance, and outputting a test result assuming that the throughput measurement end condition is satisfied in a case where the variation width of the output level with respect to the previous output level is within a range of the predetermined variation width.

6. The mobile terminal testing device according to claim 3, wherein the reception sensitivity test execution means includes
drop determination means for determining whether or not the measured throughput is in a dropped state to a preset proportion in a steep drop area in which the throughput drops steeply, and output level setting means for performing a setting process of setting the output level of the test signal to be different from a previous output level according to a comparison result indicating whether or not a measurement result of the throughput exceeds a predetermined threshold value and a determination result indicating whether or not the measured throughput is in the dropped state determined by the drop determination means, the setting process including a process of performing level down or level up on the output level of the test signal with respect to the previous output level in units of the variation width in a case where it is determined to be the dropped state, and transmission and reception of the test signal and the signal under measurement are continued in a case where a variation width of the output level with respect to the previous output level exceeds a predetermined variation width, and a test result is output assuming that the throughput measurement end condition is satisfied in a case where the variation width of the output level with respect to the previous output level is within a range of the predetermined variation width.

7. The mobile terminal testing device according to claim 2, wherein the throughput measurement end condition is obtained by determining that the measured throughput falls below a predetermined threshold value for the first time while repeatedly executing a setting for sequentially reducing a step of the output level of the test signal, and the reception sensitivity test execution means detects, as the reception sensitivity, an output level immediately before the output level in a case where the determination is obtained.

8. The mobile terminal testing device according to claim 2, wherein the reception sensitivity test execution means includes
output level setting means for setting the output level of the test signal to be different from a previous output level according to a comparison result between a measurement result of the throughput and a predetermined threshold value, and measurement result output means for continuing transmission and reception of the test signal and the signal under measurement in a case where a variation width of the output level with respect to the previous output level exceeds a predetermined variation width set in advance, and outputting a test result assuming that the throughput measurement end condition is satisfied in a case where the variation width of the output level with respect to the previous output level is within a range of the predetermined variation width.

9. The mobile terminal testing device according to claim 2, wherein the reception sensitivity test execution means includes
drop determination means for determining whether or not the measured throughput is in a dropped state to a preset proportion in a steep drop area in which the throughput drops steeply, and output level setting means for performing a setting process of setting the output level of the test signal to be different from a previous output level according to a comparison result indicating whether or not a measurement result of the throughput exceeds a predetermined threshold value and a determination result indicating whether or not the measured throughput is in the dropped state determined by the drop determination means, the setting process including a process of performing level down or level up on the output level of the test signal with respect to the previous output level in units of the variation width in a case where it is determined to be the dropped state, and transmission and reception of the test signal and the signal under measurement are continued in a case where a variation width of the output level with respect to the previous output level exceeds a predetermined variation width, and a test result is output assuming that the throughput measurement end condition is satisfied in a case where the variation width of the output level with respect to the previous output level is within a range of the predetermined variation width.

10. The mobile terminal testing device according to claim 1, wherein the throughput measurement end condition is obtained by determining that the measured throughput falls below a predetermined threshold value for the first time while repeatedly executing a setting for sequentially reducing a step of the output level of the test signal, and the reception sensitivity test execution means detects, as the reception sensitivity, an output level immediately before the output level in a case where the determination is obtained.

11. The mobile terminal testing device according to claim 1, wherein the reception sensitivity test execution means includes output level setting means for setting the output level of the test signal to be different from a previous output level according to a comparison result between a measurement result of the throughput and a predetermined threshold value, and measurement result output means for continuing transmission and reception of the test signal and the signal under measurement in a case where a variation width of the output level with respect to the previous output level exceeds a predetermined variation width set in advance, and outputting a test result assuming that the throughput measurement end condition is satisfied in a case where the variation width of the output level with respect to the previous output level is within a range of the predetermined variation width.

12. The mobile terminal testing device according to claim 1, wherein the reception sensitivity test execution means includes drop determination means for determining whether or not the measured throughput is in a dropped state to a preset proportion in a steep drop area in which the throughput drops steeply, and output level setting means for performing a setting process of setting the output level of the test signal to be different from a previous output level according to a comparison result indicating whether or not a measurement result of the throughput exceeds a predetermined threshold value and a determination result indicating whether or not the measured throughput is in the dropped state determined by the drop determination means, the setting process including a process of performing level down or level up on the output level of the test signal with respect to the previous output level in units of the variation width in a case where it is determined to be the dropped state, and transmission and reception of the test signal and the signal under measurement are continued in a case where a variation width of the output level with respect to the previous output level exceeds a predetermined variation width, and a test result is output assuming that the throughput measurement end condition is satisfied in a case where the variation width of the output level with respect to the previous output level is within a range of the predetermined variation width.

13. A mobile terminal testing method for performing a test of a mobile terminal using a mobile terminal testing device including a positioner that is provided in an internal space of a radio anechoic box, rotation control means for executing, with respect to the positioner, first rotation control that causes the mobile terminal, which is a device under test, to sequentially face each of first orientations regulated by a predetermined step interval of a spherical coordinate system, and second rotation control that causes the mobile terminal to sequentially face each of second orientations regulated by a step interval finer than the predetermined step interval, reception sensitivity test execution means for transmitting a test signal from the test antenna, and repeatedly performing a reception sensitivity test of receiving a signal under measurement transmitted from the mobile terminal which has received the test signal using the test antenna and measuring a throughput based on the signal under measurement for each of the first orientations and the second orientations while changing an output level of the test signal non-linearly, and calculating reception sensitivity when the measured throughput satisfies a predetermined throughput measurement end condition, measurement control means for executing a processing step of measuring reception power by receiving a radio signal from the mobile terminal using the test antenna in the internal space by executing the reception sensitivity test for each of the first orientations and the second orientations, and peak power measurement means for executing a processing step of measuring maximum reception power as peak power based on the measured reception power, the mobile terminal testing method comprising:

as the processing step of measuring the maximum reception power as the peak power, a candidate selection step of selecting, as peak power candidates, the first orientation having reception power within a range of a predetermined power width from the maximum reception powers among the reception power measured for each first orientation; and a determination step of measuring the reception power for each second orientation by executing the second rotation control on a region within a predetermined range around the each of first orientations corresponding to each of the peak power candidates, and determining the peak power based on a measurement result.

* * * * *